US011915748B2

(12) United States Patent
Shibata et al.

(10) Patent No.: US 11,915,748 B2
(45) Date of Patent: Feb. 27, 2024

(54) SEMICONDUCTOR MEMORY DEVICE, MEMORY SYSTEM, AND WRITE METHOD

(71) Applicant: Kioxia Corporation, Tokyo (JP)

(72) Inventors: Noboru Shibata, Kawasaki Kanagawa (JP); Yasuyuki Matsuda, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/112,507

(22) Filed: Feb. 22, 2023

(65) Prior Publication Data

US 2023/0206998 A1    Jun. 29, 2023

Related U.S. Application Data

(60) Continuation of application No. 17/874,968, filed on Jul. 27, 2022, now Pat. No. 11,621,039, which is a continuation of application No. 17/158,567, filed on Jan. 26, 2021, now Pat. No. 11,437,095, which is a division of application No. 16/529,644, filed on Aug. 1, 2019, now Pat. No. 10,943,651, which is a continuation-in-part of application No. 16/275,776, filed on Feb. 14, 2019, now abandoned.

(30) Foreign Application Priority Data

Aug. 3, 2018    (JP) .................................. 2018-146833

(51) Int. Cl.
G11C 16/10    (2006.01)
G11C 11/56    (2006.01)
G11C 11/408    (2006.01)
G11C 16/08    (2006.01)

(52) U.S. Cl.
CPC ...... *G11C 11/5628* (2013.01); *G11C 11/4085* (2013.01); *G11C 11/565* (2013.01); *G11C 16/08* (2013.01); *G11C 16/10* (2013.01)

(58) Field of Classification Search
CPC ...................................................... G11C 16/10
USPC ................................................... 365/185.28
See application file for complete search history.

(56) References Cited

U.S. PATENT DOCUMENTS 8,482,976 B2    7/2013    Shibata
8,837,213 B2    9/2014    Shibata
(Continued)

FOREIGN PATENT DOCUMENTS

JP    2012069199 A    4/2012
JP    4928752 B2    5/2012
(Continued)

*Primary Examiner* — Jason Lappas
(74) *Attorney, Agent, or Firm* — Holtz, Holtz & Volek PC

(57) ABSTRACT

According to one embodiment, a memory system includes a semiconductor memory device including a memory cell capable of holding at least 4-bit data and a controller configured to control a first write operation and a second write operation based on the 4-bit data. The controller includes a conversion circuit configured to convert 4-bit data into 2-bit data. The semiconductor memory device includes a recovery controller configured to recover the 4-bit data based on the converted 2-bit data and data written in the memory cell by the first write operation. The first write operation is executed based on the 4-bit data received from the controller, and the second write operation is executed based on the 4-bit data recovered by the recovery controller.

16 Claims, 68 Drawing Sheets

(56) References Cited

U.S. PATENT DOCUMENTS

| | | |
|---|---|---|
| 9,190,161 B2 | 11/2015 | Shibata |
| 9,224,476 B2 | 12/2015 | Shibata |
| 9,460,780 B2 | 10/2016 | Lee et al. |
| 9,558,828 B2 | 1/2017 | Shibata |
| 9,767,910 B1 | 9/2017 | Bushnaq et al. |
| 9,799,406 B2 | 10/2017 | Sato et al. |
| 9,830,983 B1 | 11/2017 | Hara et al. |
| 10,049,749 B2 | 8/2018 | Shibata |
| 10,566,051 B2 | 2/2020 | Shibata et al. |
| 10,714,170 B2 | 7/2020 | Shibata et al. |
| 10,916,300 B2 | 2/2021 | Shibata |
| 11,238,925 B2 | 2/2022 | Shibata et al. |
| 2007/0014152 A1 | 1/2007 | Shibata et al. |
| 2012/0069681 A1 | 3/2012 | Oikawa |
| 2015/0302920 A1 | 10/2015 | Shibata |
| 2016/0011818 A1* | 1/2016 | Hashimoto ........... G06F 3/0647 711/103 |
| 2018/0074896 A1 | 3/2018 | Takada et al. |
| 2018/0075902 A1 | 3/2018 | Shirakawa et al. |
| 2020/0211655 A1 | 7/2020 | Shibata et al. |

FOREIGN PATENT DOCUMENTS

| | | | |
|---|---|---|---|
| JP | 2015204126 A | 11/2015 | |
| JP | 2017168158 A | 9/2017 | |
| JP | 2018005959 A | 1/2018 | |
| JP | 6293964 B1 | 3/2018 | |

\* cited by examiner

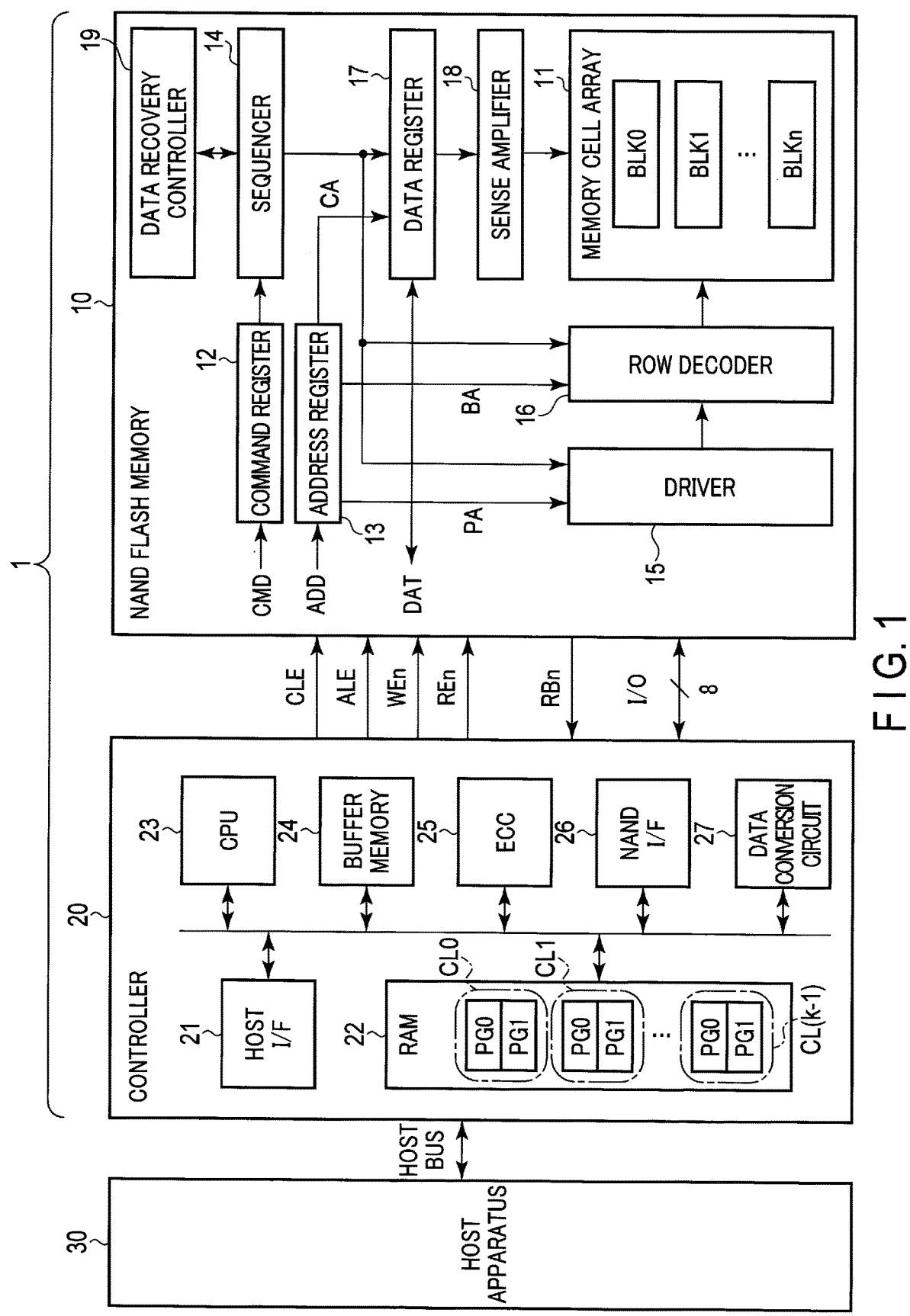
F I G. 1

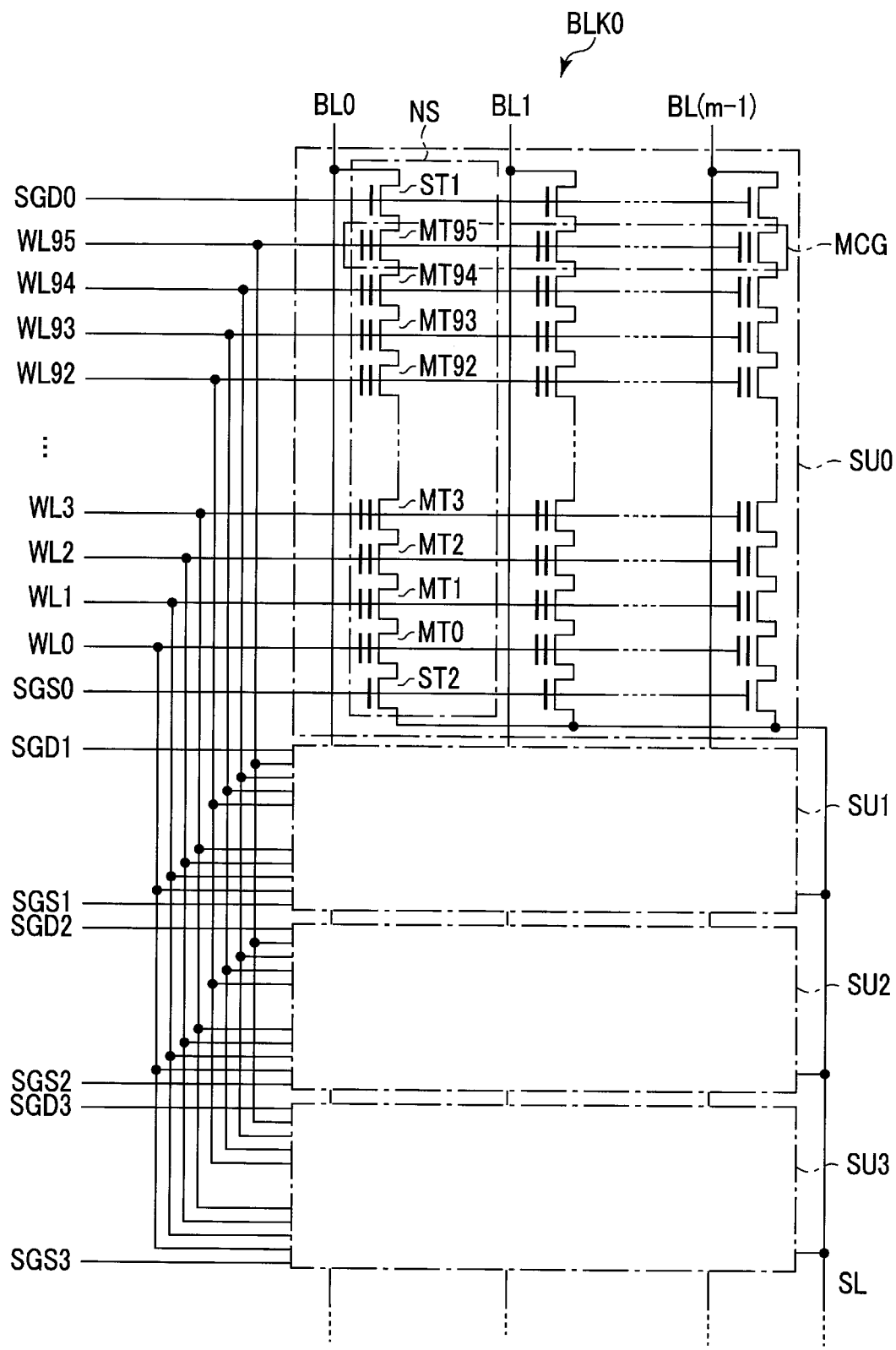
F I G. 2

| PAGE | "0" | "1" | "2" | "3" | "4" | "5" | "6" | "7" | "8" | "9" | "A" | "B" | "C" | "D" | "E" | "F" |
|---|---|---|---|---|---|---|---|---|---|---|---|---|---|---|---|---|
| Top    | 1 | 1 | 1 | 1 | 1 | 0 | 0 | 0 | 0 | 0 | 1 | 1 | 0 | 0 | 0 | 1 |
| Upper  | 1 | 1 | 0 | 0 | 0 | 0 | 0 | 0 | 1 | 1 | 1 | 1 | 1 | 1 | 0 | 0 |
| Middle | 1 | 1 | 1 | 0 | 0 | 0 | 0 | 1 | 1 | 0 | 0 | 0 | 0 | 1 | 1 | 1 |
| Lower  | 1 | 0 | 0 | 0 | 1 | 1 | 0 | 0 | 0 | 0 | 0 | 1 | 1 | 1 | 1 | 1 |

DATA CONVERSION ⇒

| PAGE | "0" | "1" | "2" | "3" | "4" | "5" | "6" | "7" | "8" | "9" | "A" | "B" | "C" | "D" | "E" | "F" |
|---|---|---|---|---|---|---|---|---|---|---|---|---|---|---|---|---|
| X1 | 1 | 0 | 0 | 1 | 1 | 0 | 0 | 1 | 1 | 0 | 0 | 1 | 1 | 0 | 0 | 1 |
| X2 | 1 | 1 | 0 | 0 | 1 | 1 | 0 | 0 | 1 | 1 | 0 | 0 | 1 | 1 | 0 | 0 |

F I G. 6

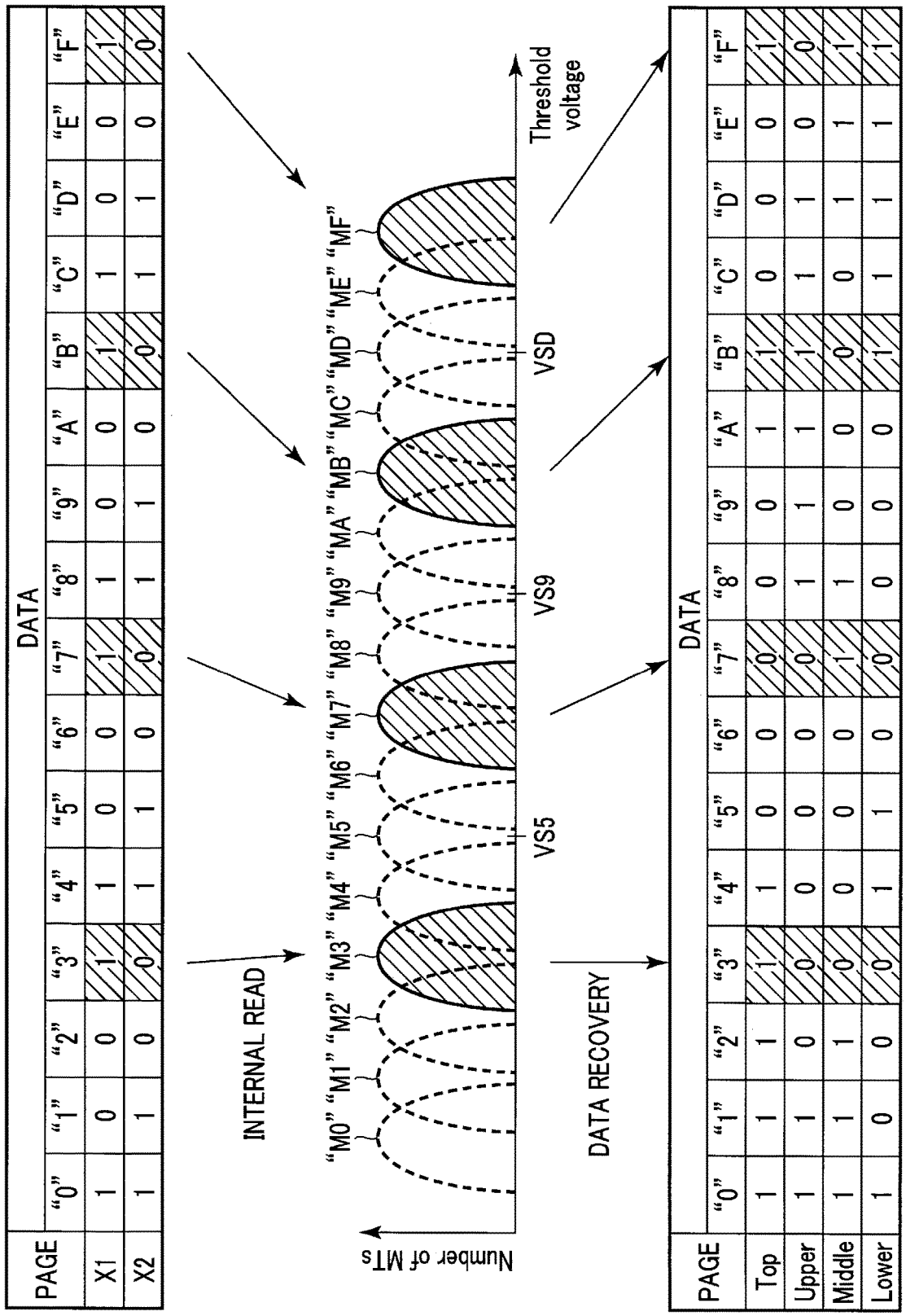
F I G. 10

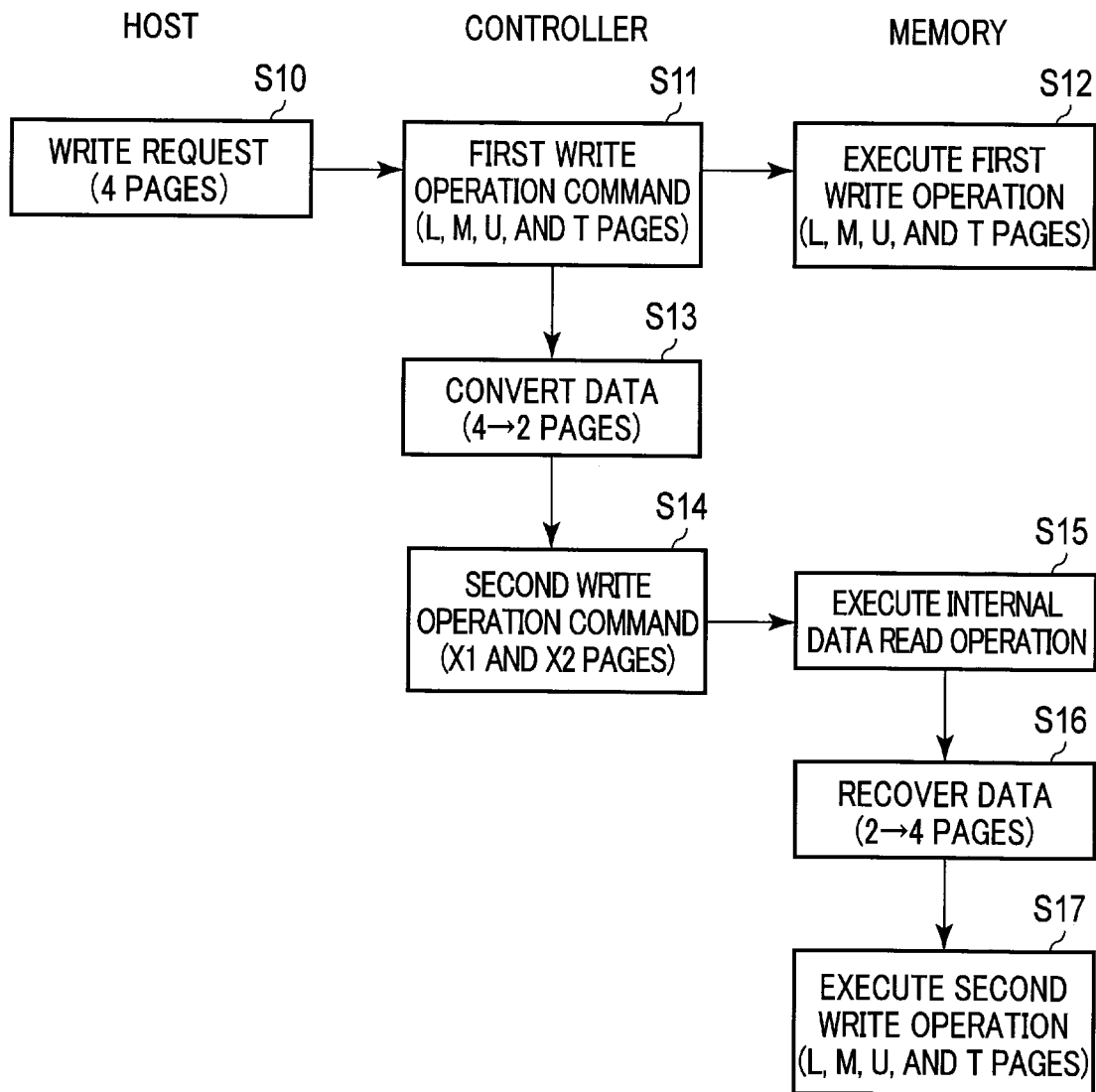
F I G. 11

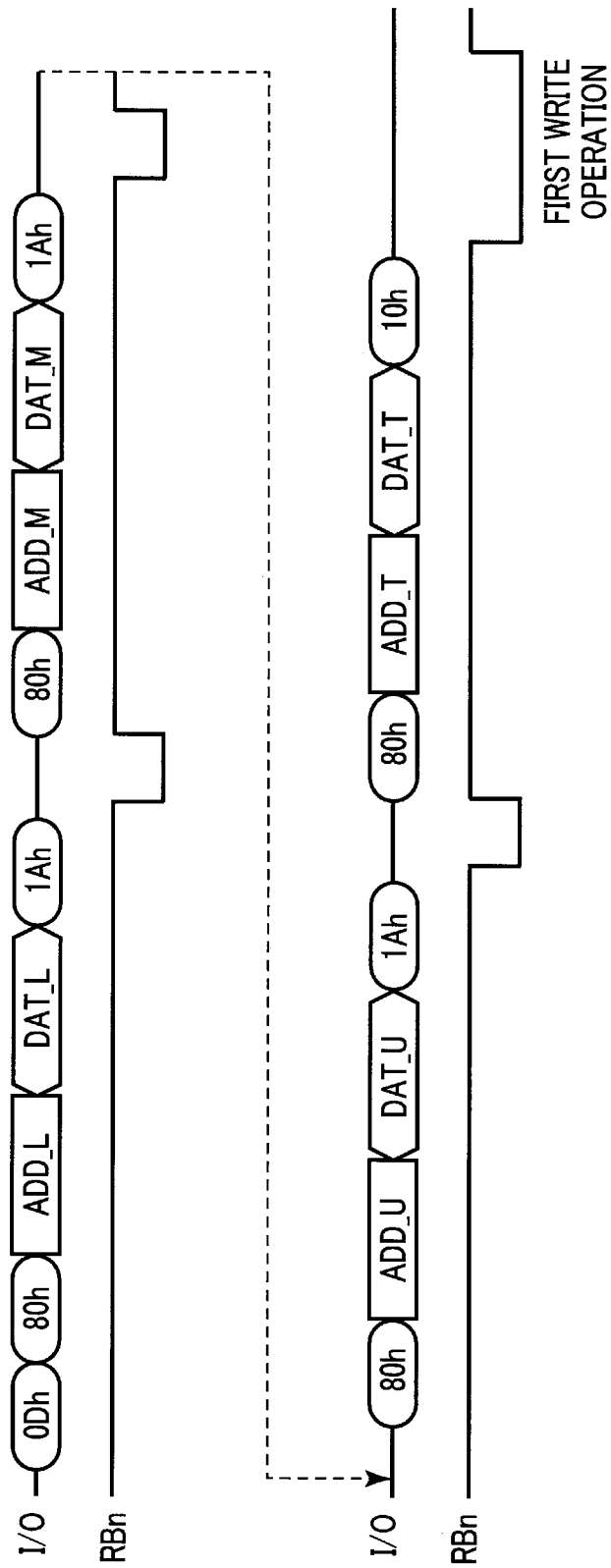
F I G. 12

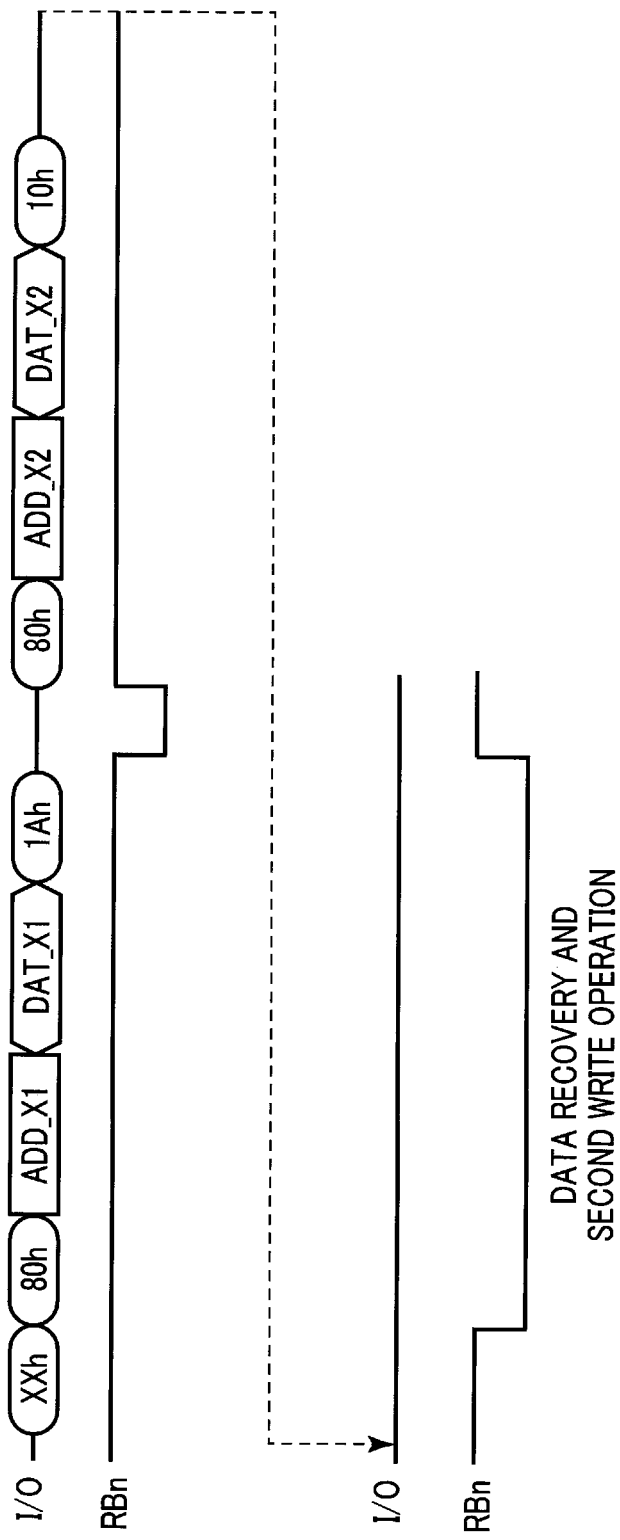
F I G. 13

|  |  | SU0 | SU1 | SU2 | SU3 |
|---|---|---|---|---|---|
| WL95 | WRT2 | 764 | 765 | 766 | 767 |
|  | WRT1 | 756 | 757 | 758 | 759 |
| WL94 | WRT2 | 760 | 761 | 762 | 763 |
|  | WRT1 | 748 | 749 | 750 | 751 |
| ... |  |  |  |  |  |
| WL2 | WRT2 | 24 | 25 | 26 | 27 |
|  | WRT1 | 12 | 13 | 14 | 15 |
| WL1 | WRT2 | 16 | 17 | 18 | 19 |
|  | WRT1 | 4 | 5 | 6 | 7 |
| WL0 | WRT2 | 8 | 9 | 10 | 11 |
|  | WRT1 | 0 | 1 | 2 | 3 |

FIG. 15

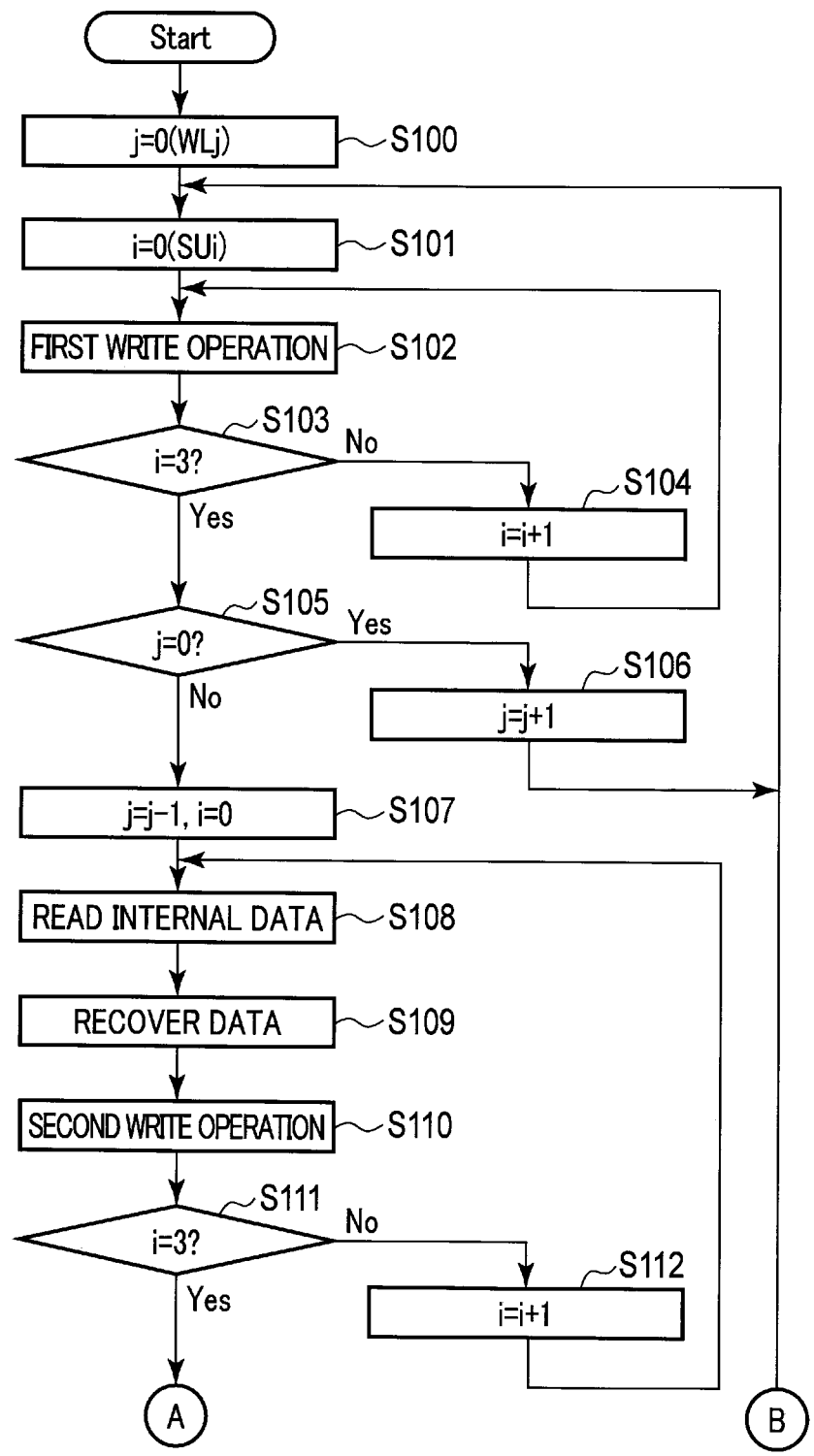
F I G. 16

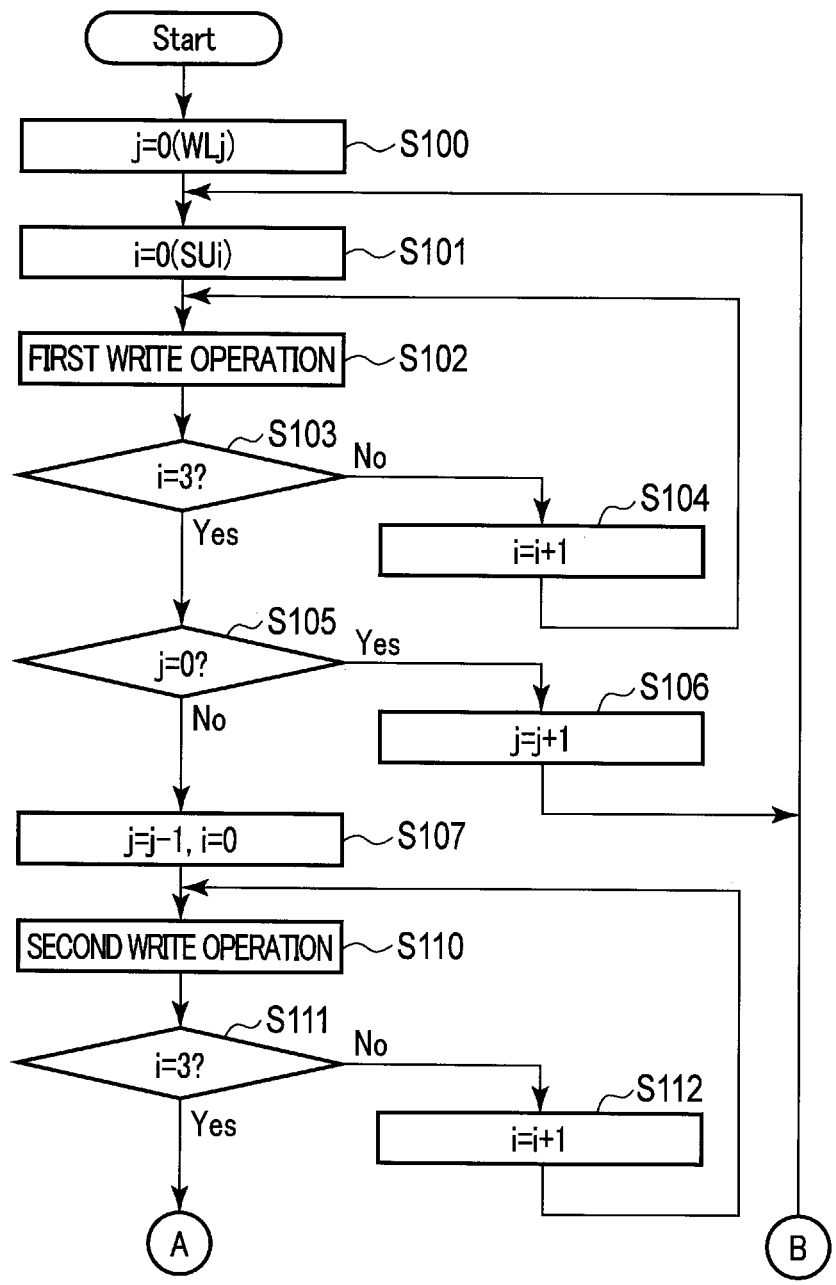
F I G. 21

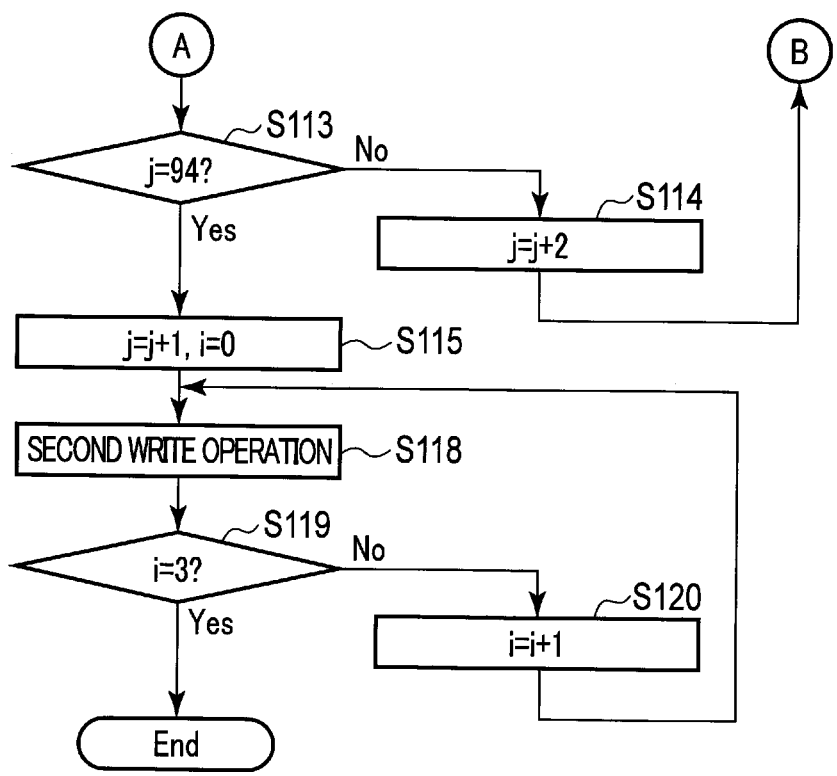
F I G. 22

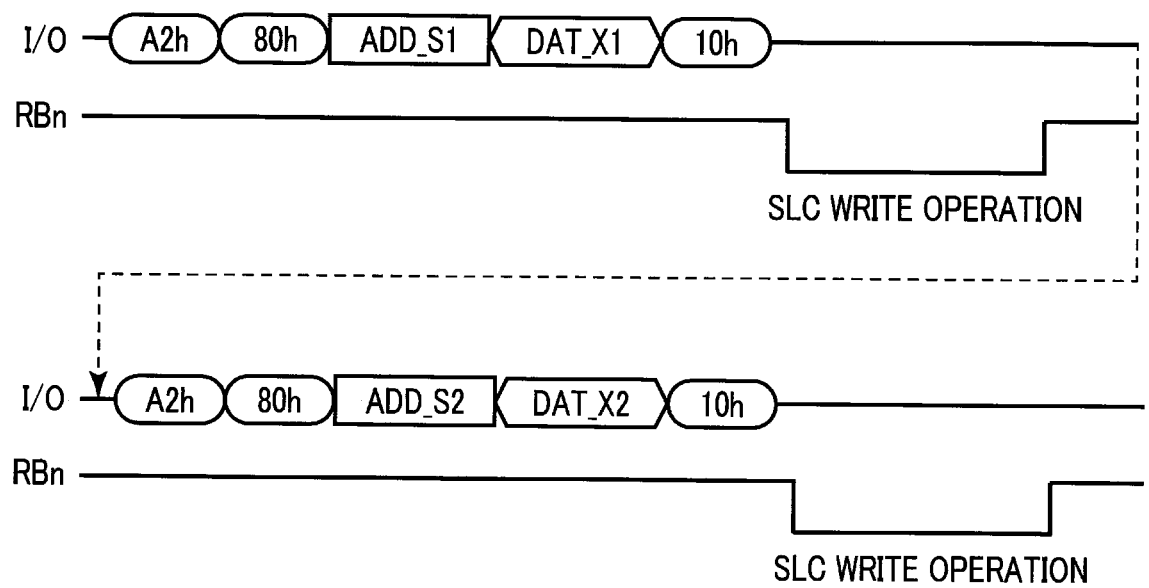
F I G. 24

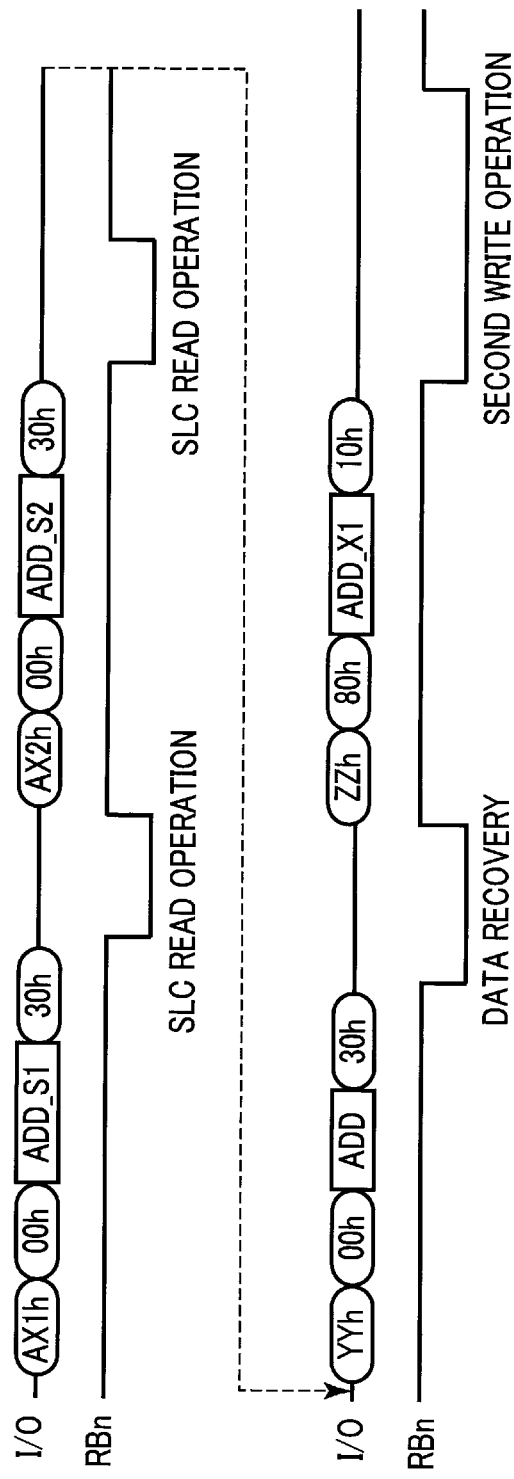
F I G. 29

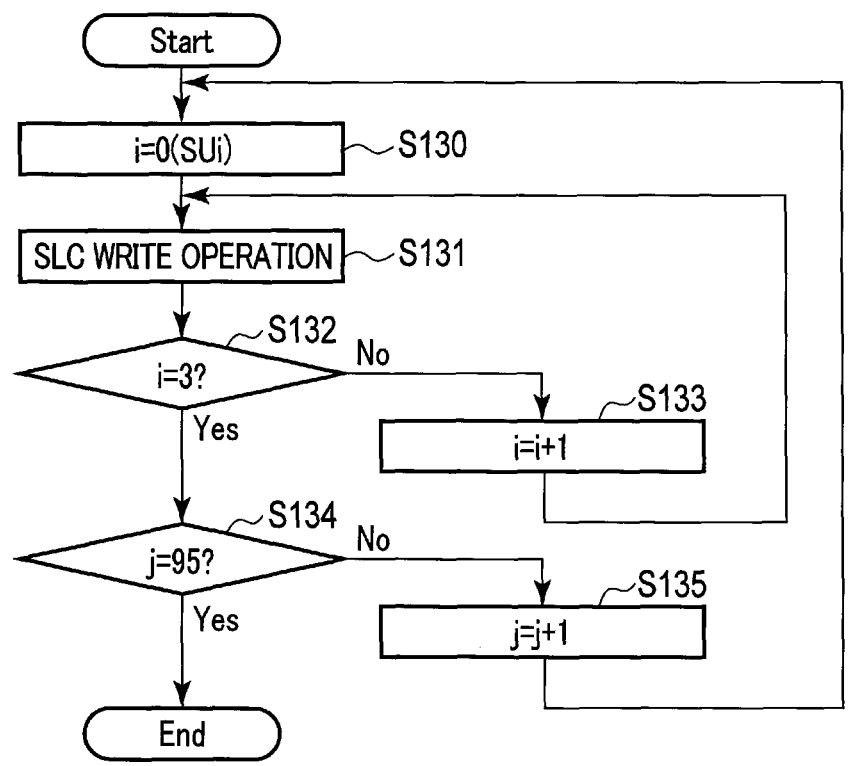
F I G. 31

|  |  | SU0 | SU1 | SU2 | SU3 |
|---|---|---|---|---|---|
| WL95 | WRT2 | 764 | 765 | 766 | 767 |
|  | WRT1 | 756 | 758 | 760 | 762 |
| WL94 | WRT2 | 757 | 759 | 761 | 763 |
|  | WRT1 | 748 | 750 | 752 | 754 |
| ... |  |  |  |  |  |
|  |  |  |  |  |  |
| WL2 | WRT2 | 21 | 23 | 25 | 27 |
|  | WRT1 | 12 | 14 | 16 | 18 |
| WL1 | WRT2 | 13 | 15 | 17 | 19 |
|  | WRT1 | 4 | 6 | 8 | 10 |
| WL0 | WRT2 | 5 | 7 | 9 | 11 |
|  | WRT1 | 0 | 1 | 2 | 3 |

F I G. 32

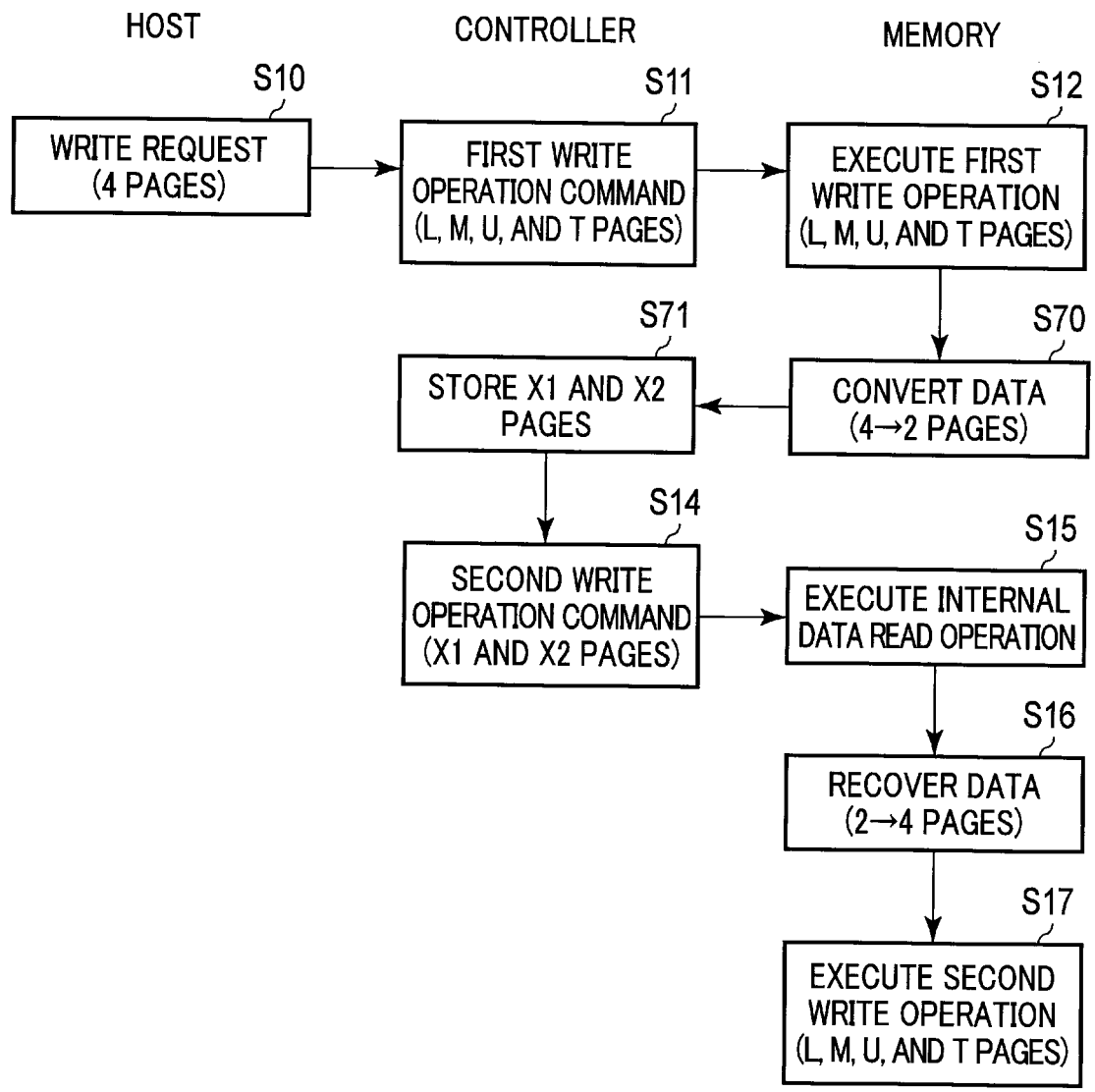
F I G. 34

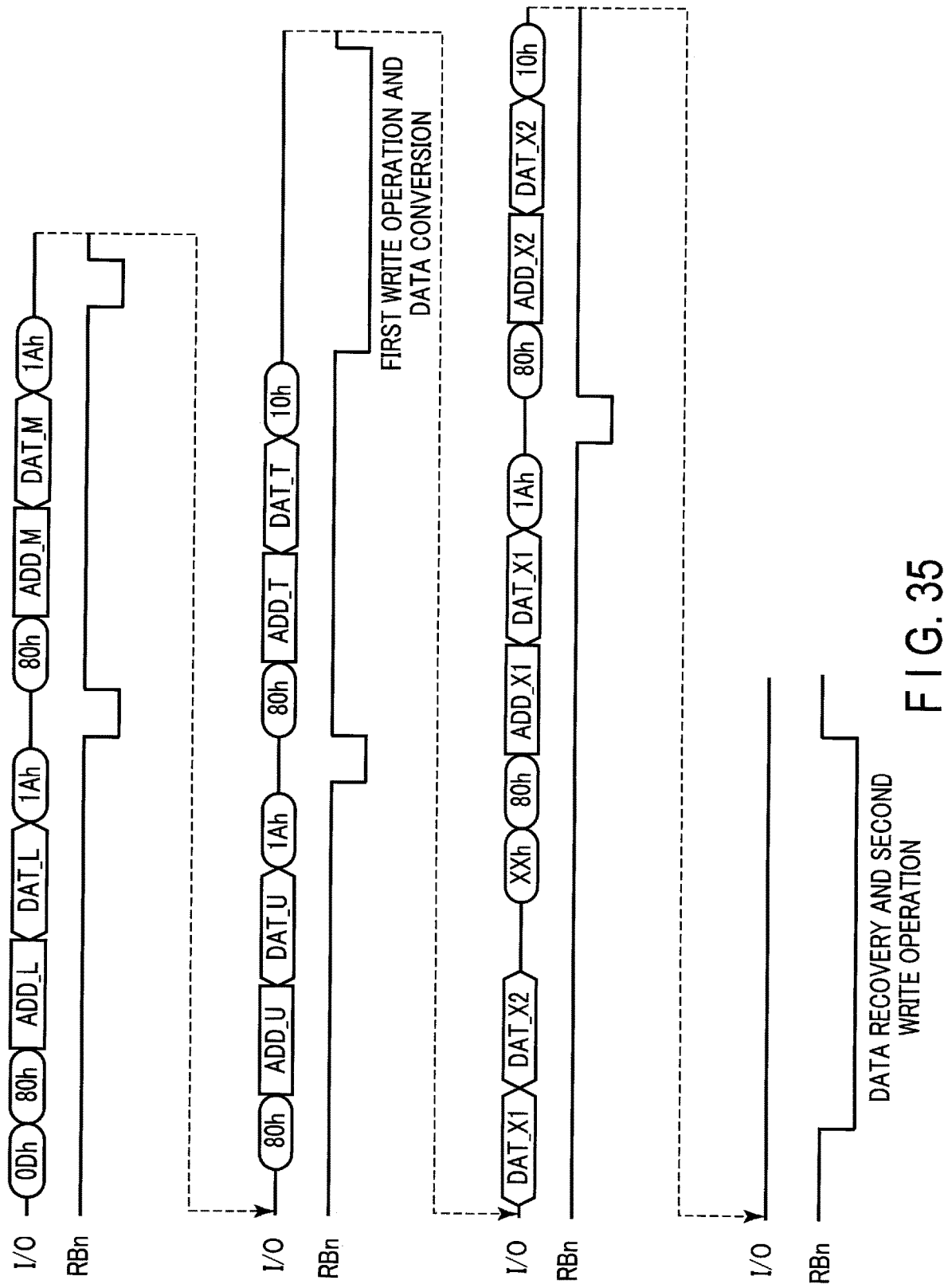
F I G. 35

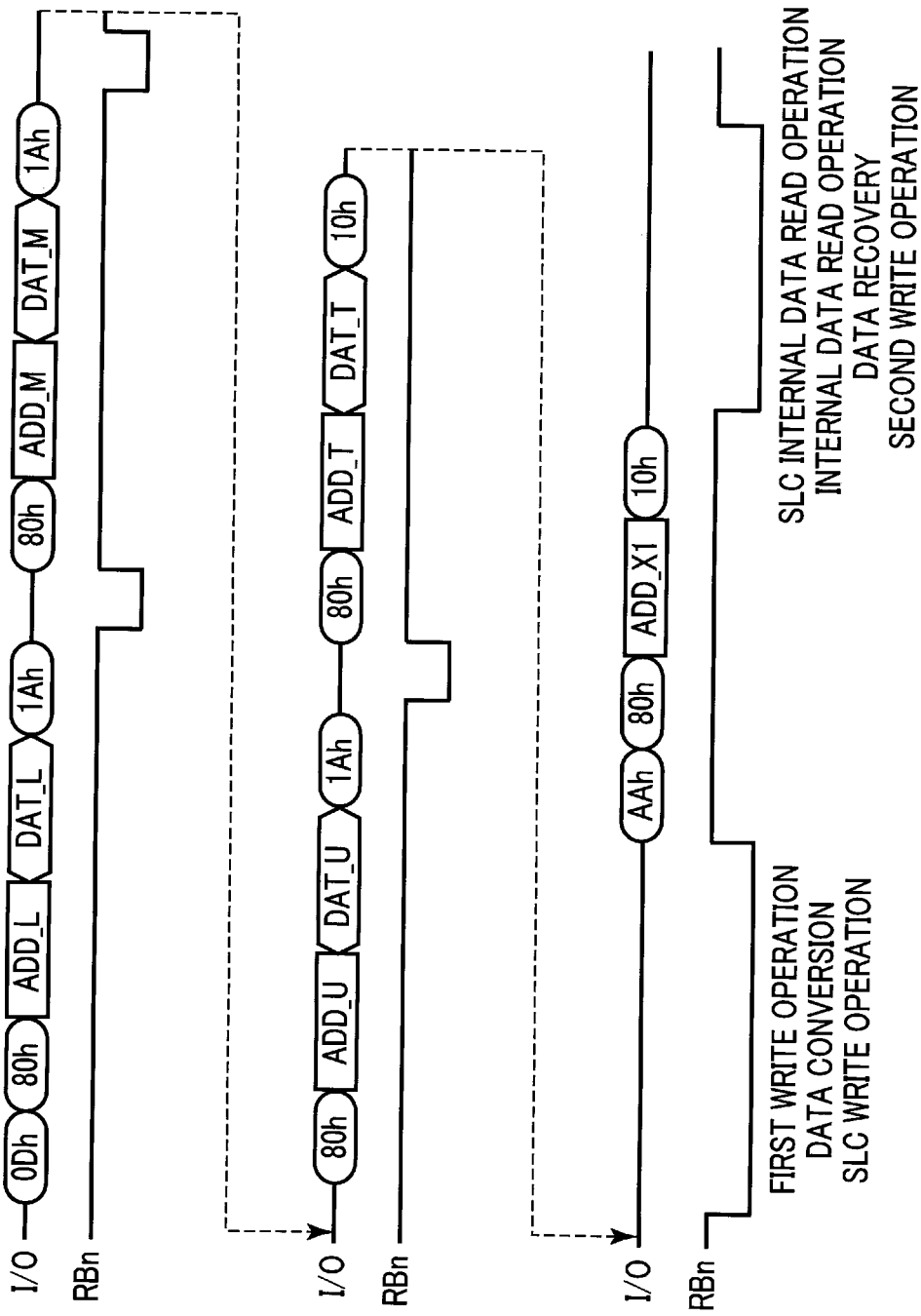
F I G. 38

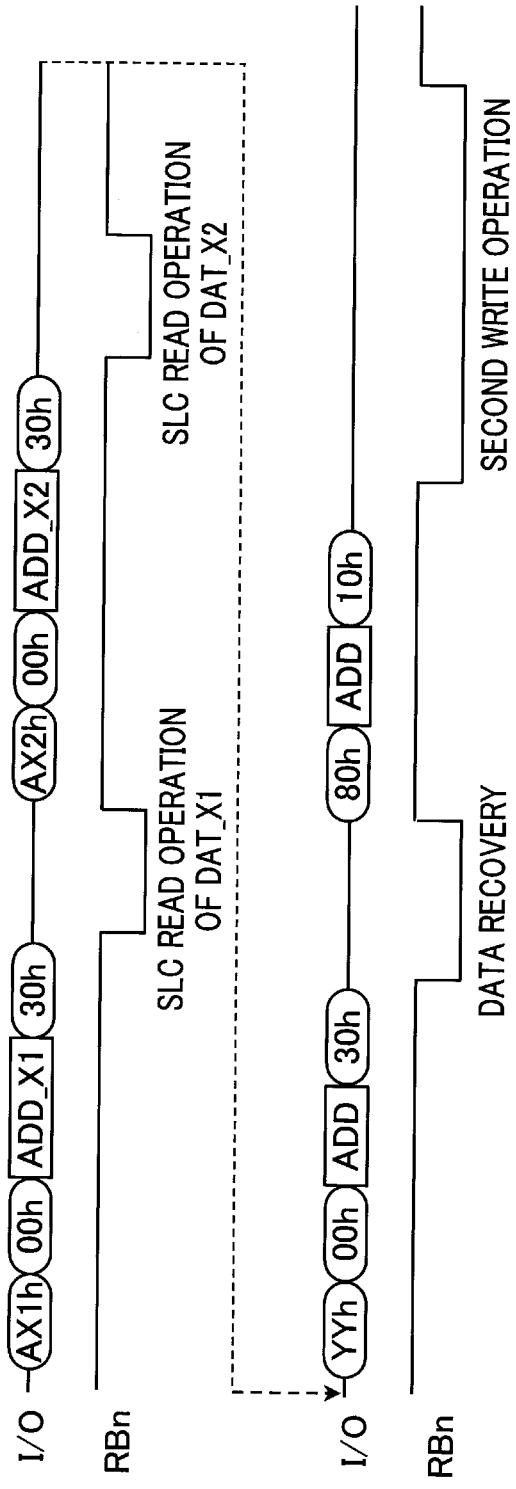
F I G. 40

|  |  | SU0 | SU1 | SU2 | SU3 |
|---|---|---|---|---|---|
| WL95 | SECOND TIME WRITE | 764 | 765 | 766 | 767 |
|  | FIRST TIME WRITE | 760 | 761 | 762 | 763 |
| WL94 | SECOND TIME WRITE | 756 | 757 | 758 | 759 |
|  | FIRST TIME WRITE | 752 | 753 | 754 | 755 |
| ... |  |  |  |  |  |
| WL2 | SECOND TIME WRITE | 20 | 21 | 22 | 23 |
|  | FIRST TIME WRITE | 16 | 17 | 18 | 19 |
| WL1 | SECOND TIME WRITE | 12 | 13 | 14 | 15 |
|  | FIRST TIME WRITE | 8 | 9 | 10 | 11 |
| WL0 | SECOND TIME WRITE | 4 | 5 | 6 | 7 |
|  | FIRST TIME WRITE | 0 | 1 | 2 | 3 |

FIG. 43

|  |  | SU0 | SU1 | SU2 | SU3 |
|---|---|---|---|---|---|
| WL95 | SECOND TIME WRITE | 764 | 765 | 766 | 767 |
|  | FIRST TIME WRITE | 380 | 381 | 382 | 383 |
| WL94 | SECOND TIME WRITE | 760 | 761 | 762 | 763 |
|  | FIRST TIME WRITE | 376 | 377 | 378 | 379 |
| ... |  |  |  |  |  |
| WL2 | SECOND TIME WRITE | 392 | 393 | 394 | 395 |
|  | FIRST TIME WRITE | 8 | 9 | 10 | 11 |
| WL1 | SECOND TIME WRITE | 388 | 389 | 390 | 391 |
|  | FIRST TIME WRITE | 4 | 5 | 6 | 7 |
| WL0 | SECOND TIME WRITE | 384 | 385 | 386 | 387 |
|  | FIRST TIME WRITE | 0 | 1 | 2 | 3 |

FIG. 44

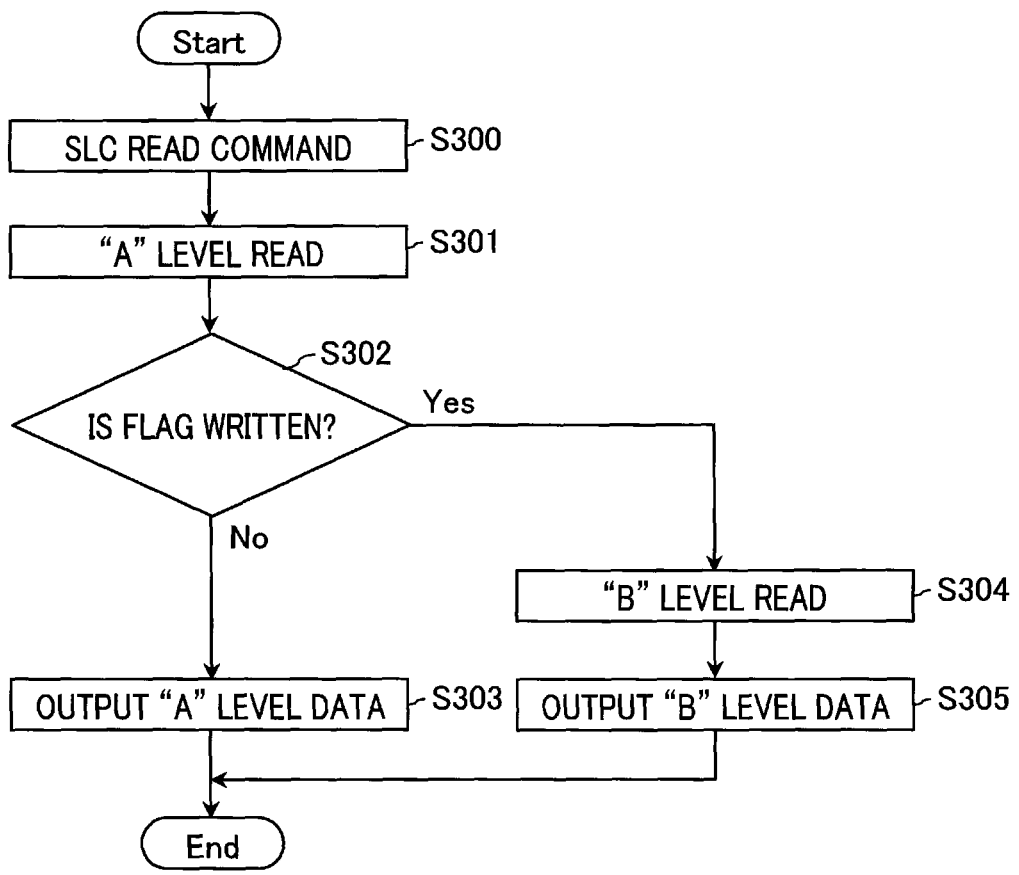
F I G. 45

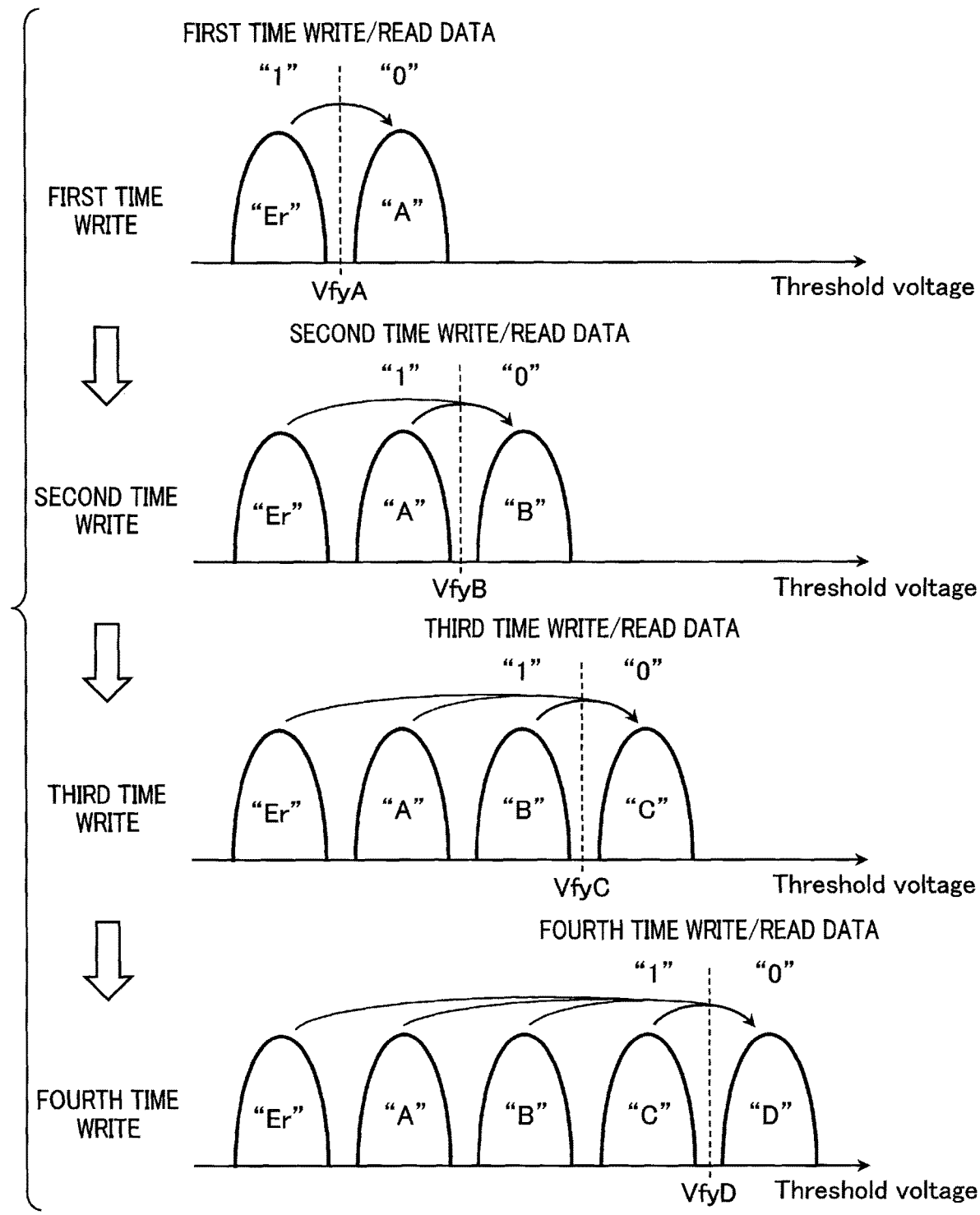
F I G. 46

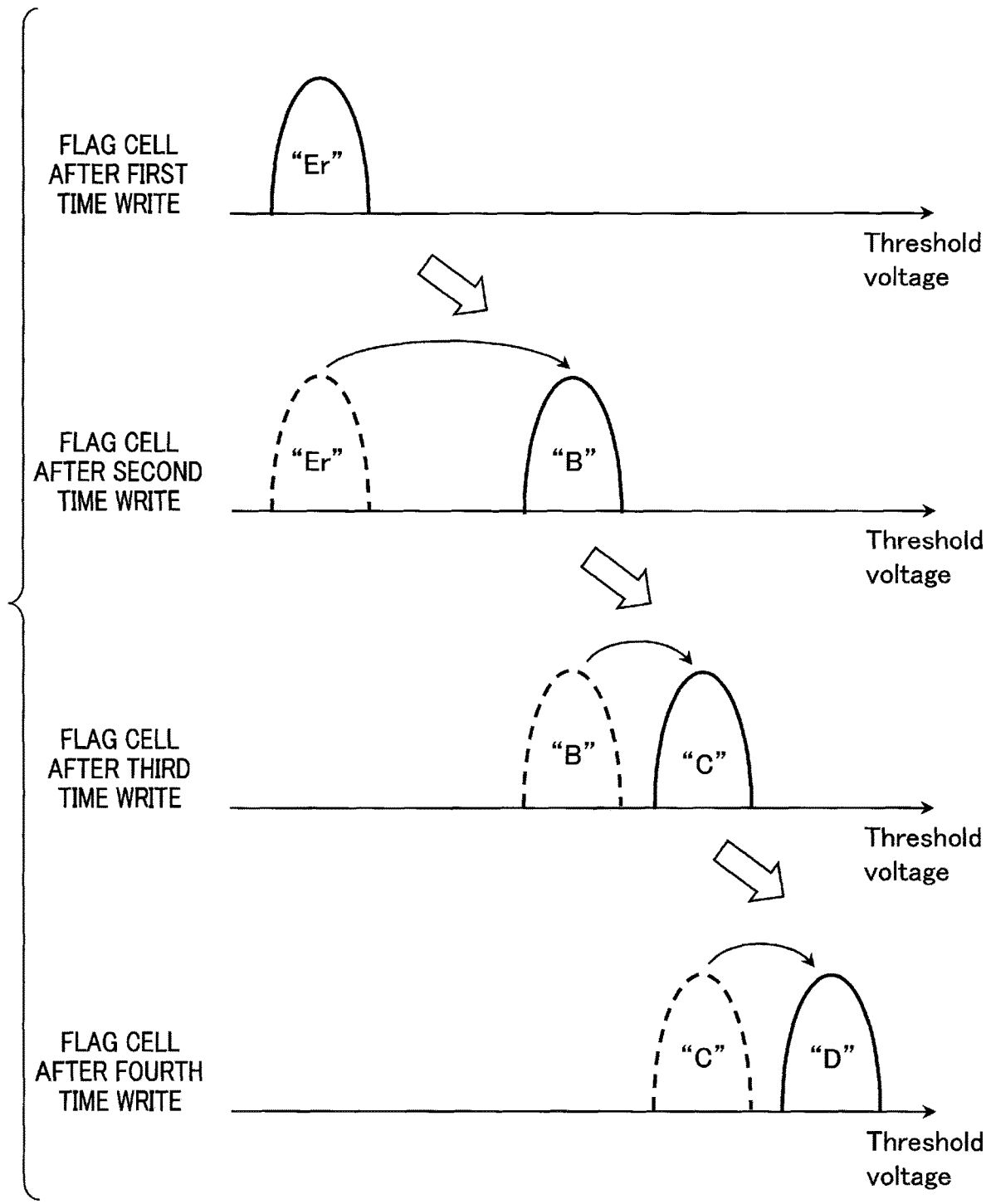
F I G. 49

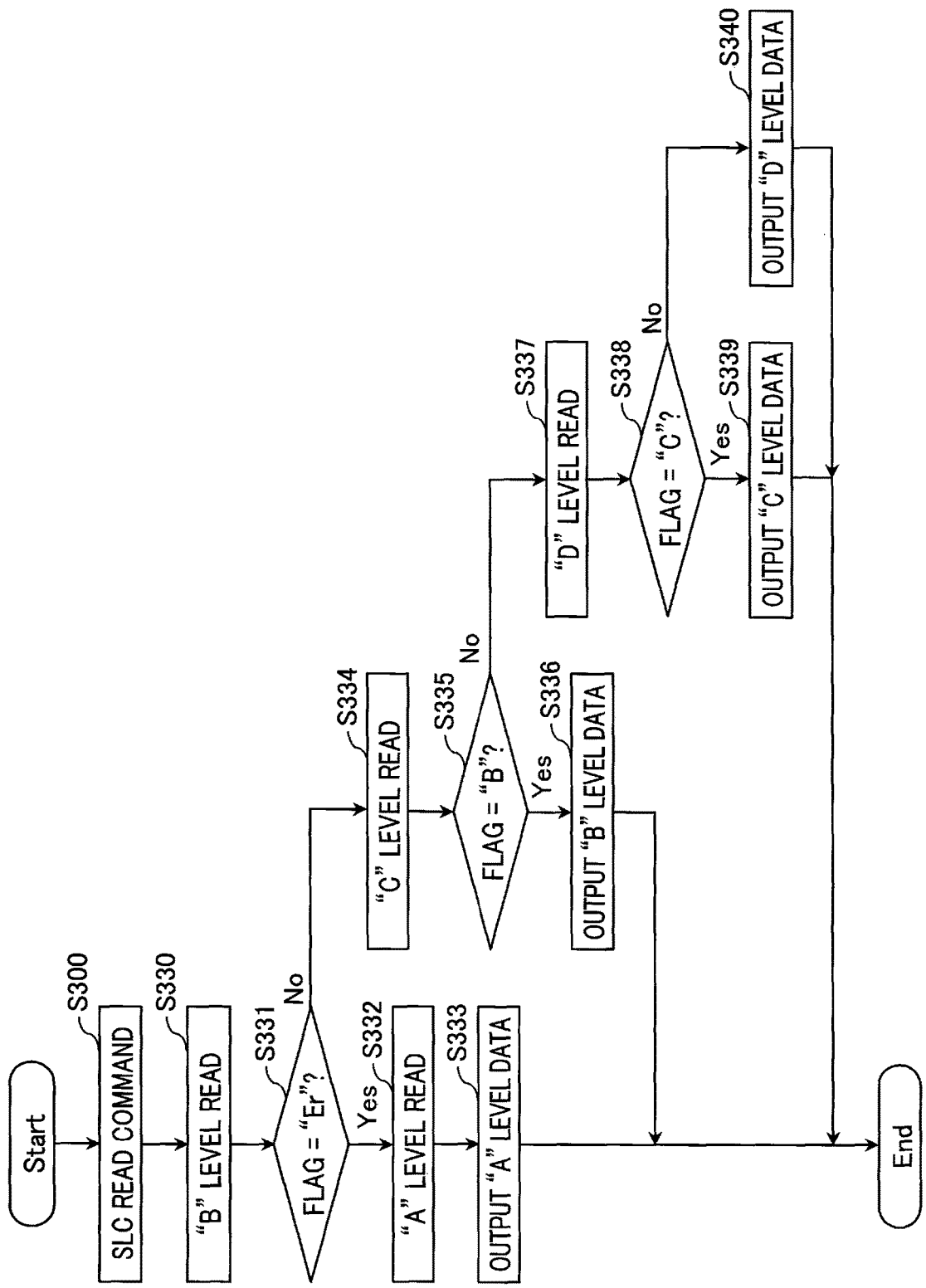
F I G. 50

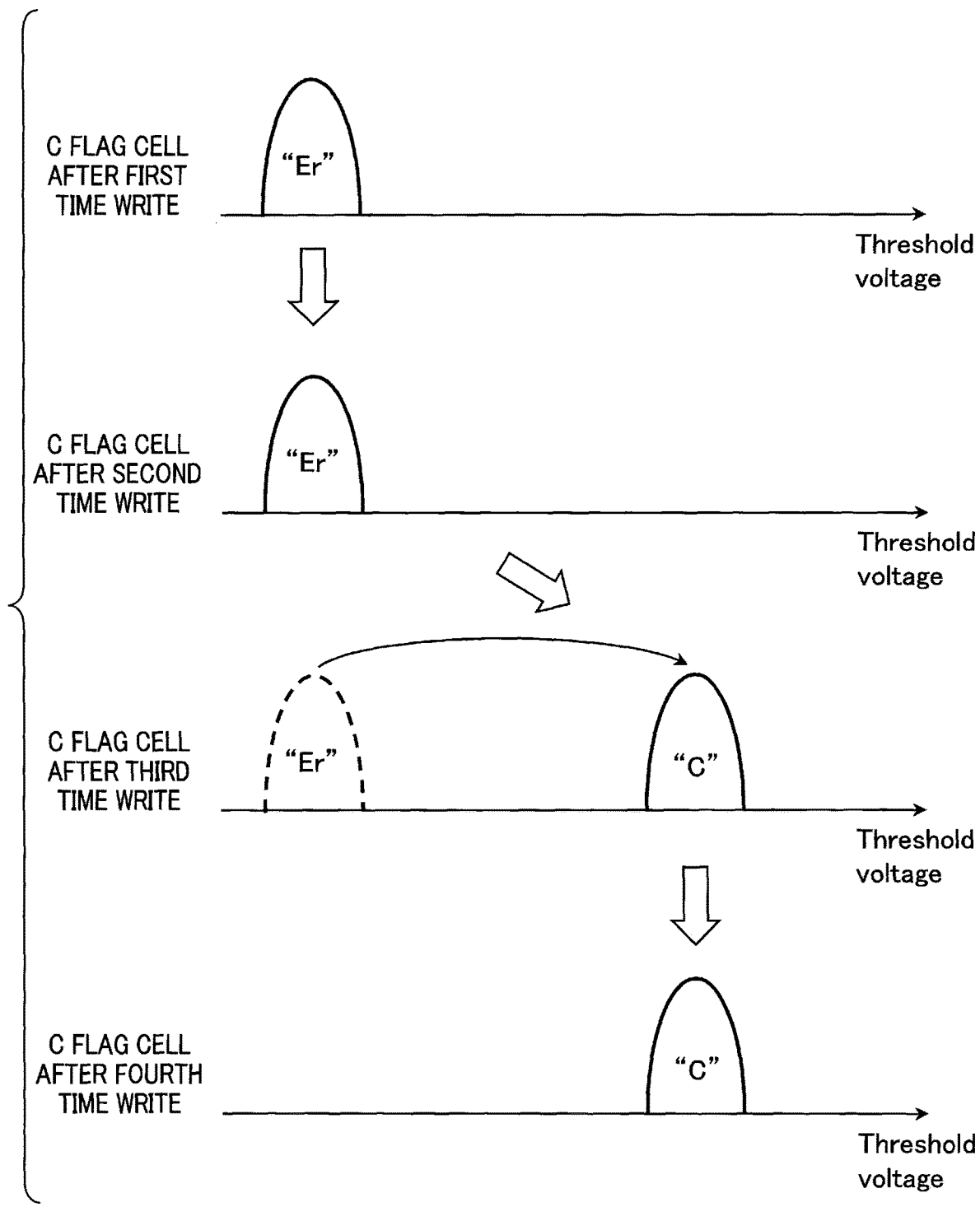
F I G. 52

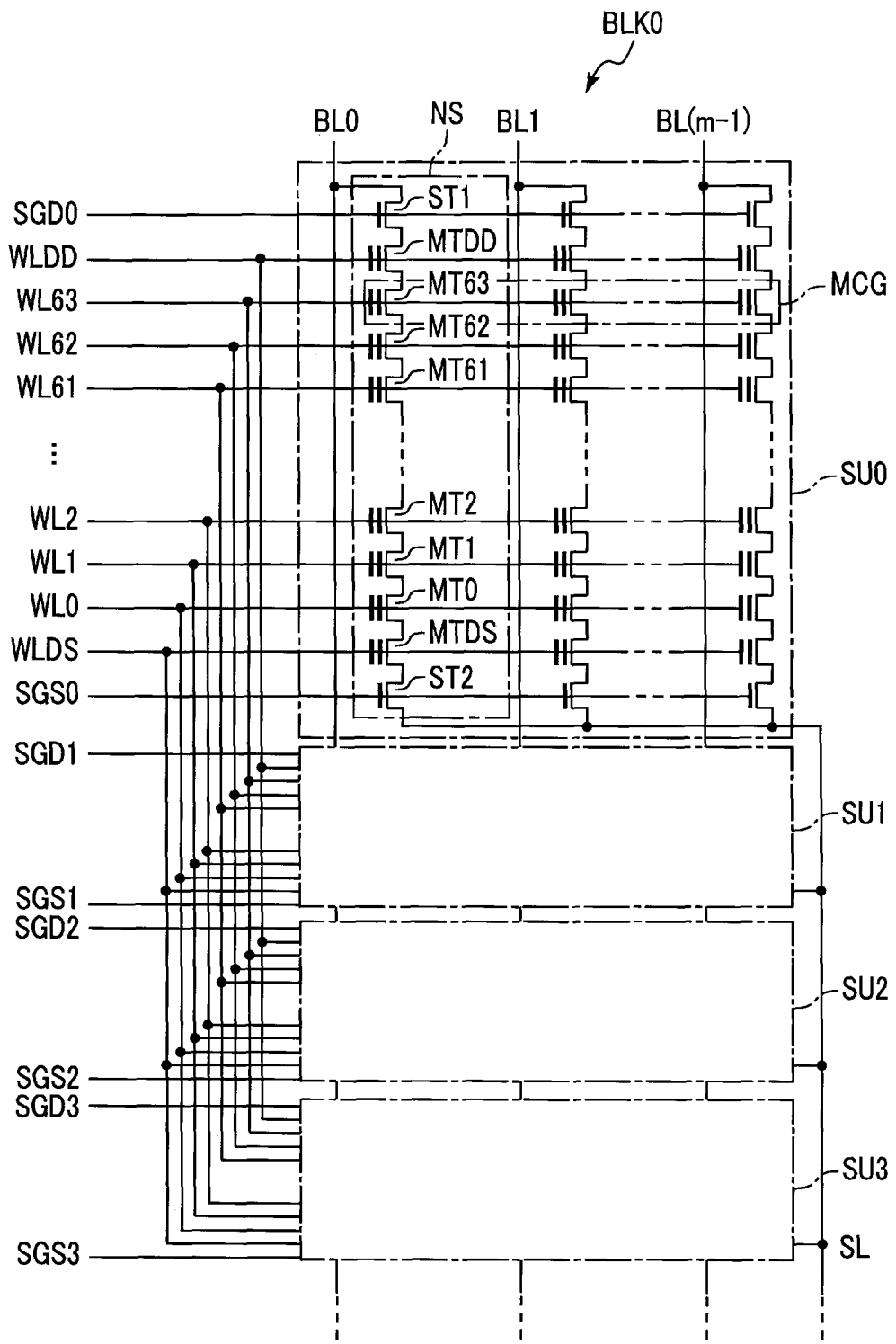
F I G. 55

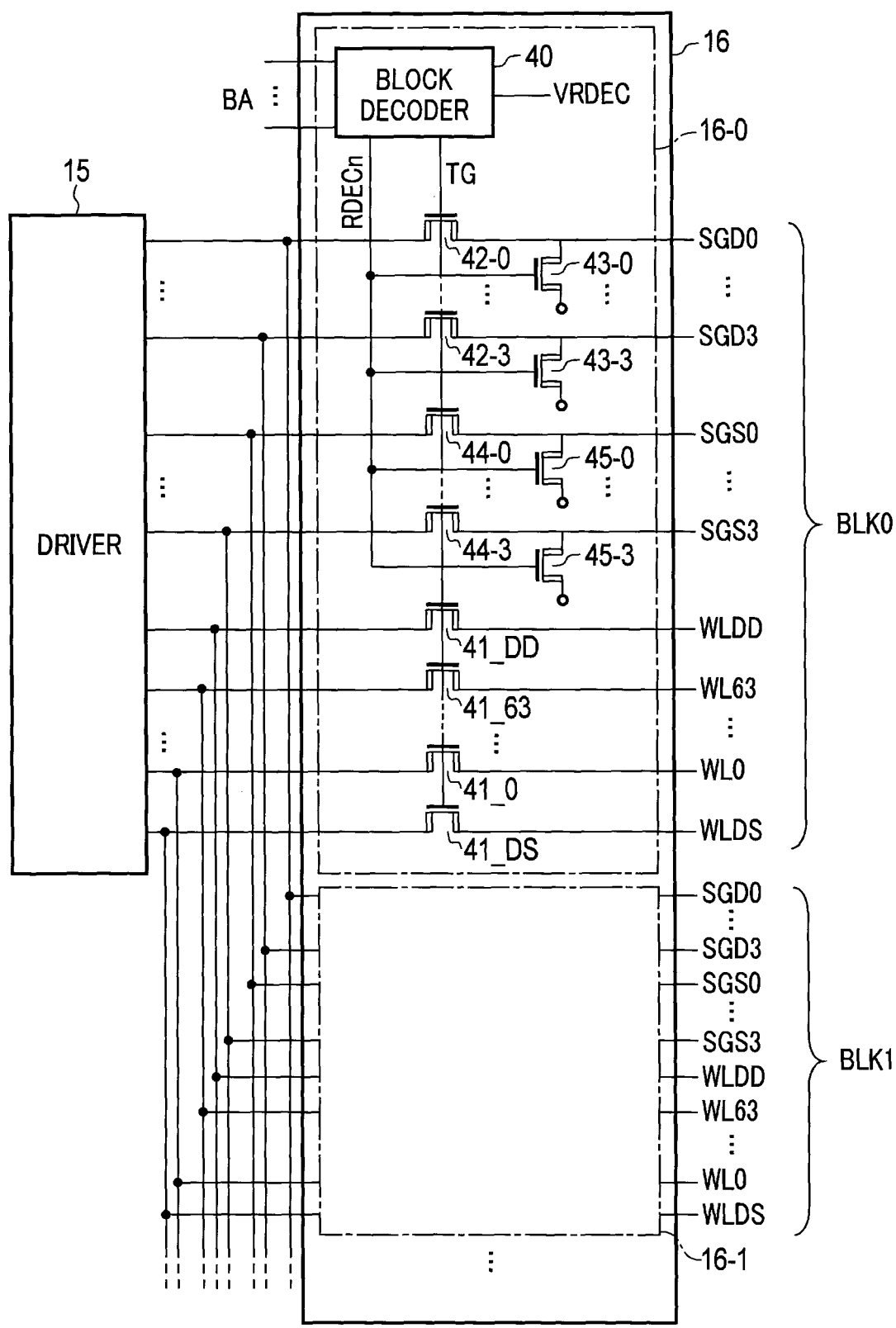
F I G. 56

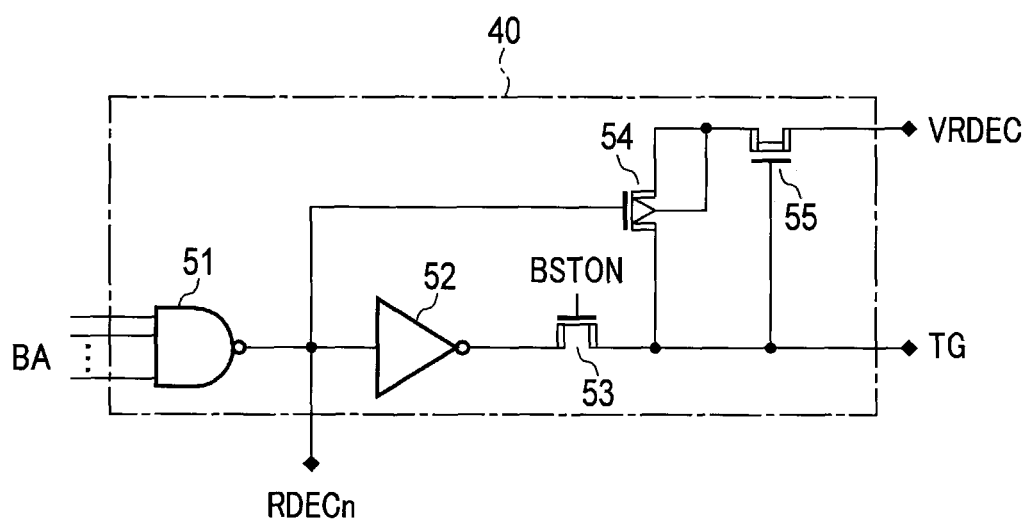
F I G. 57

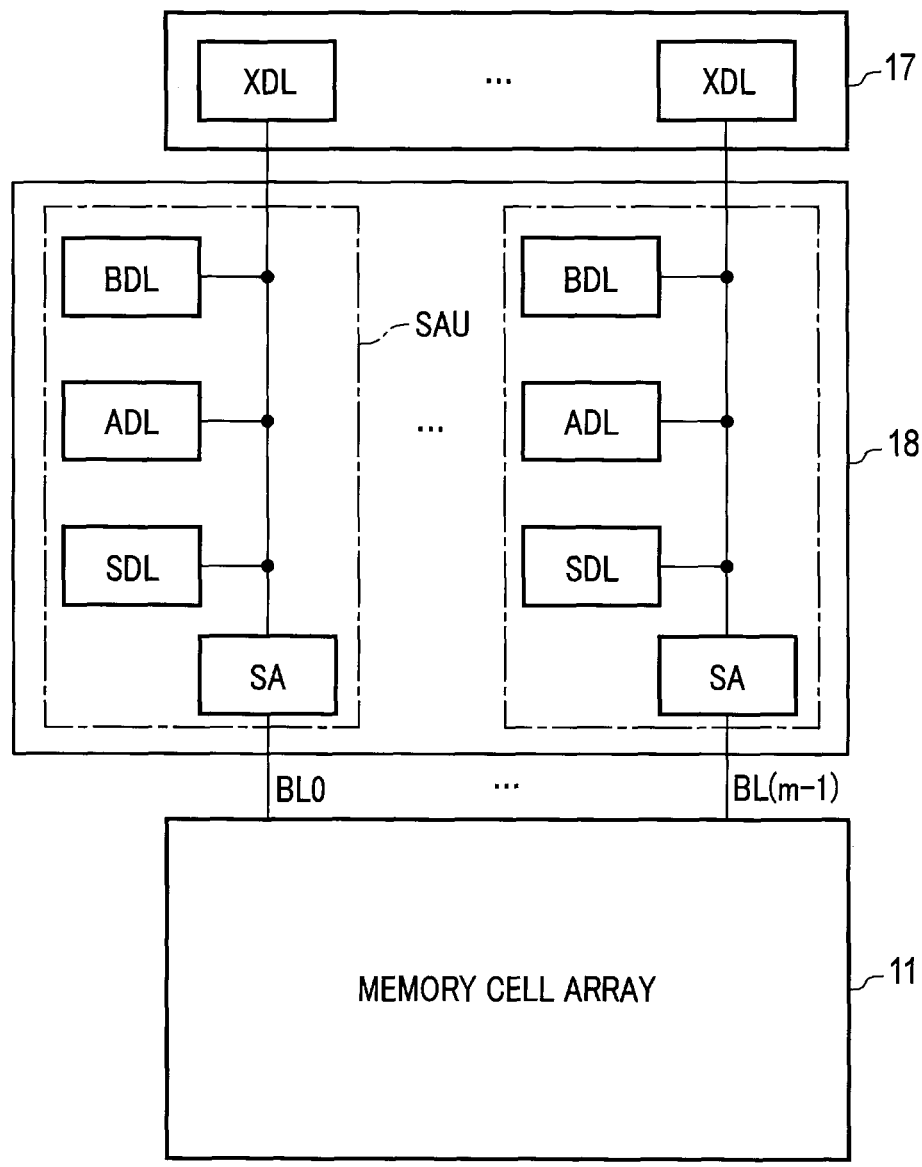
F I G. 58

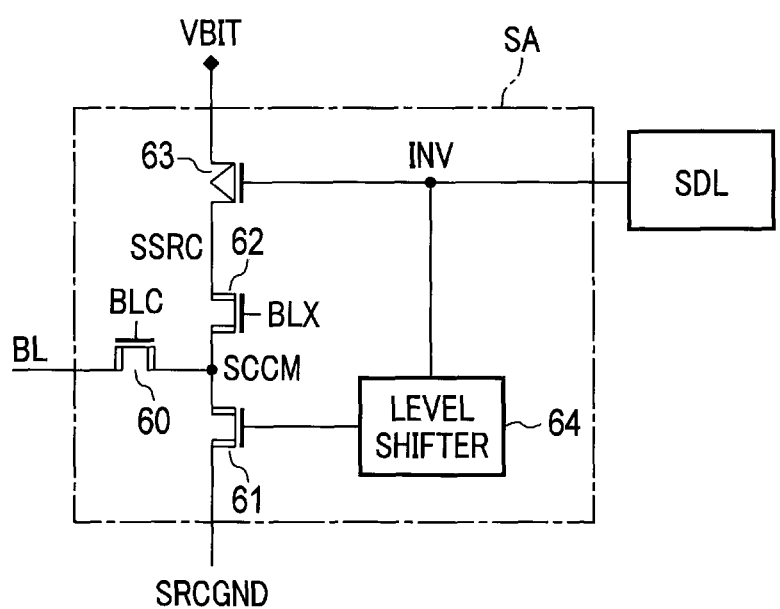
F I G. 59

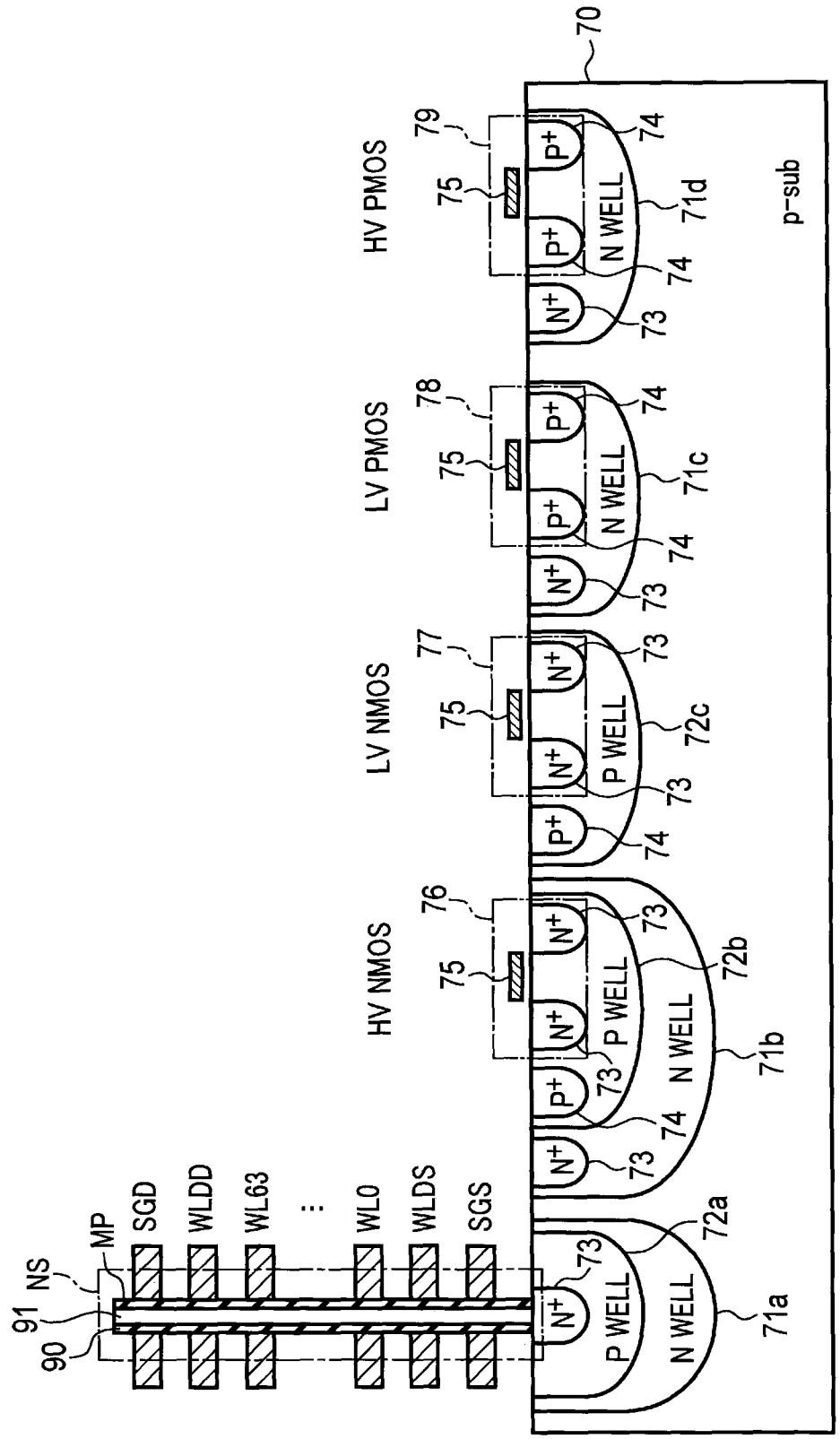
F I G. 60

|  | MEMORY CELL ARRAY | | HV NMOS (ROW DECODER, ETC.) | | LV NMOS | LV PMOS | HV PMOS | HV NMOS (INSIDE SAU) | |
|---|---|---|---|---|---|---|---|---|---|
|  | P WELL 72a | N WELL 71a | P WELL 72b | N WELL 71b | P WELL 72c | N WELL 71c | N WELL 71d | P WELL 72b | N WELL 71b |
| ERASE | VERA | VERA | VBB | VSS | VSS | VDD | VERAH or \|-VthD\| | VSS | VSS |
| WRITE | VSS or VBB | VSS | VSS or VBB | VSS | VSS | VDD | VPGMH or \|-VthD\| | VSS or VBB | VSS |
| READ | VSS | VSS | VBB | VSS | VSS | VDD | VREAD or \|-VthD\| | VSS | VSS |

F I G. 61

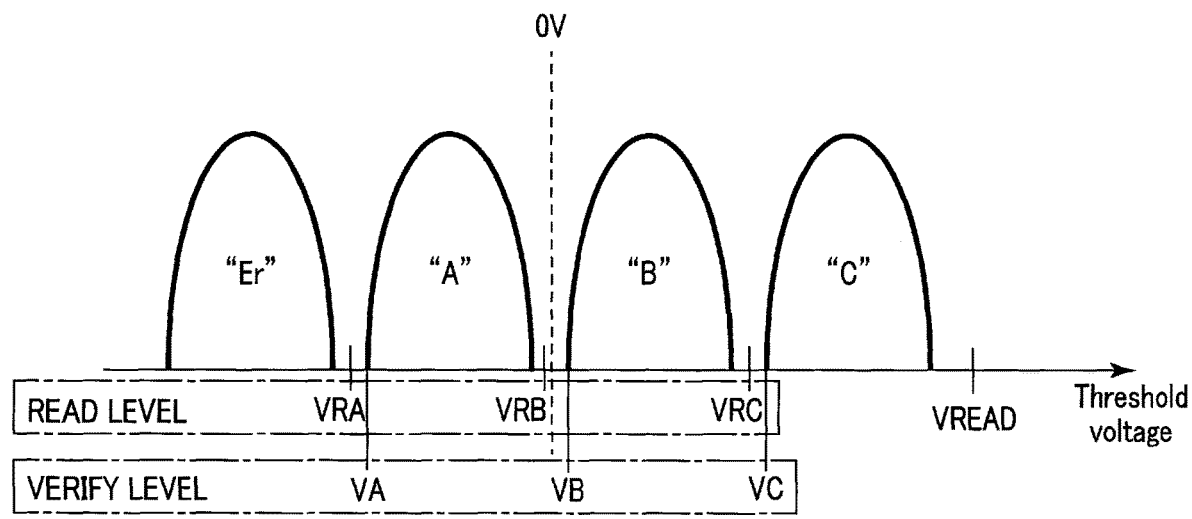
F I G. 62
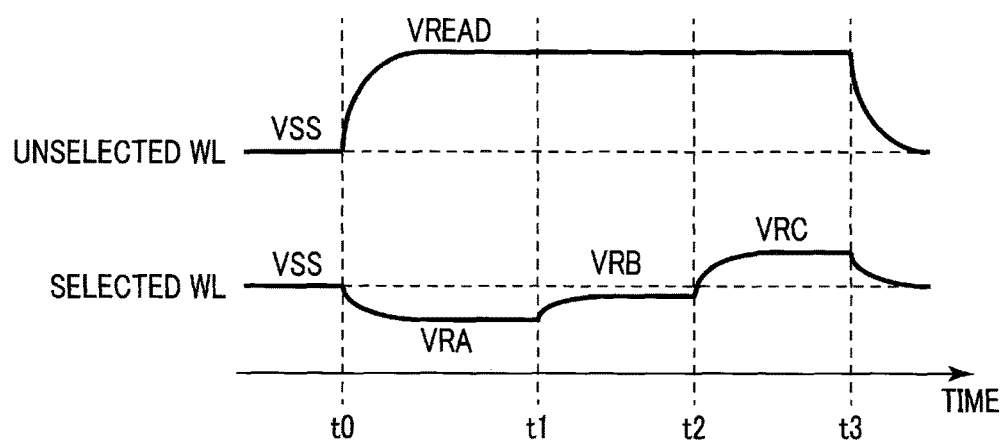
F I G. 63

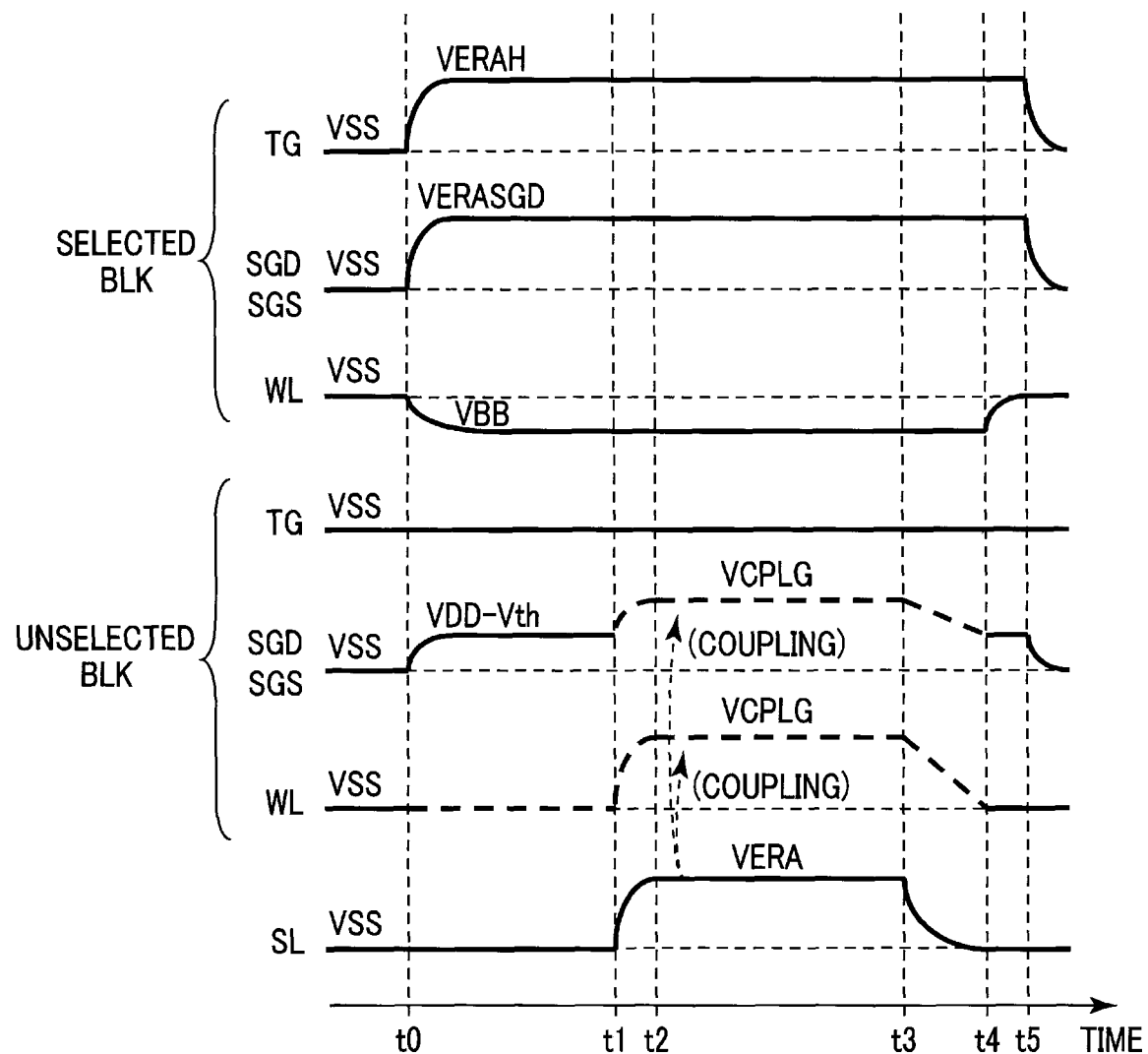
F I G. 64

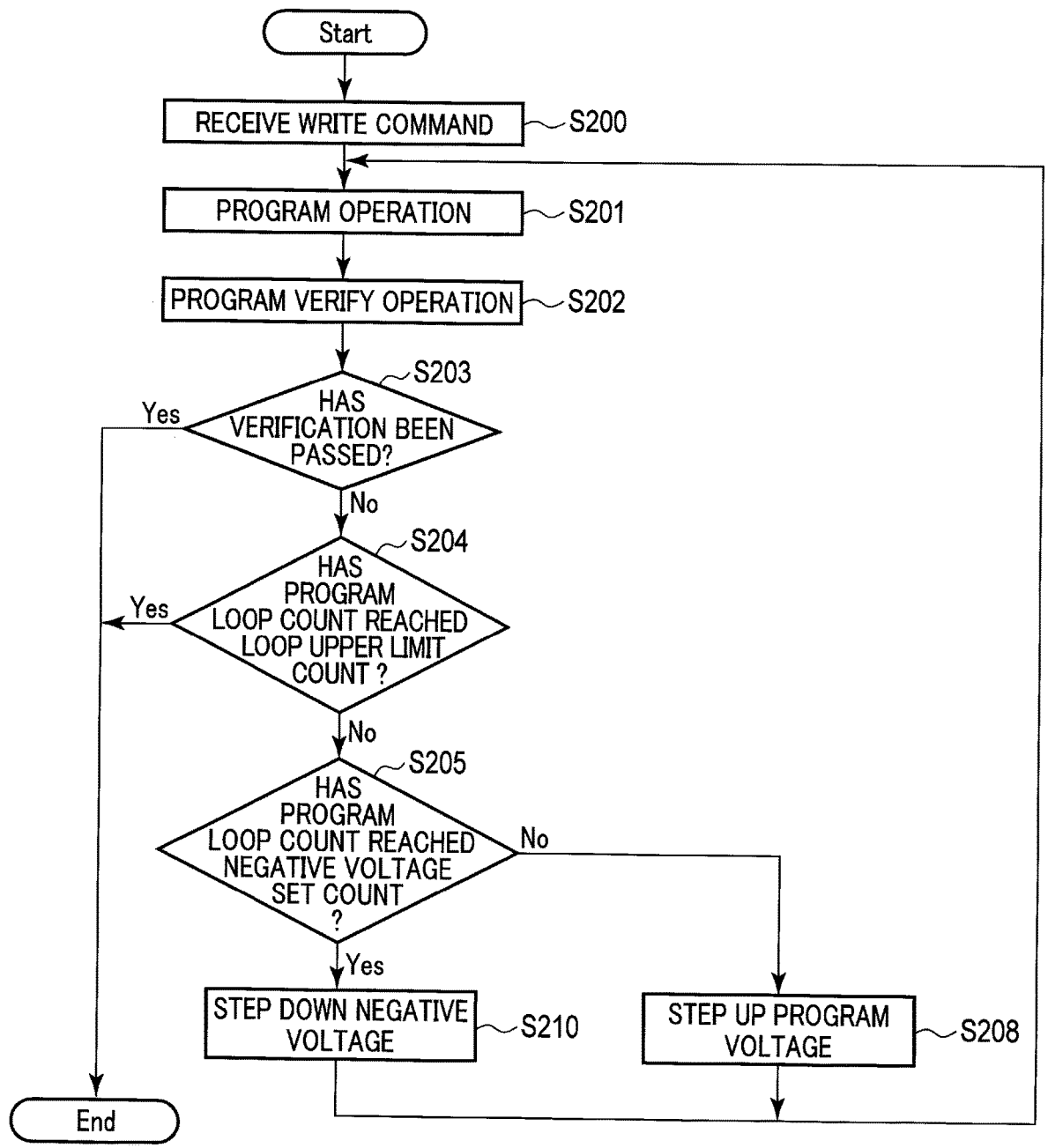
F I G. 69

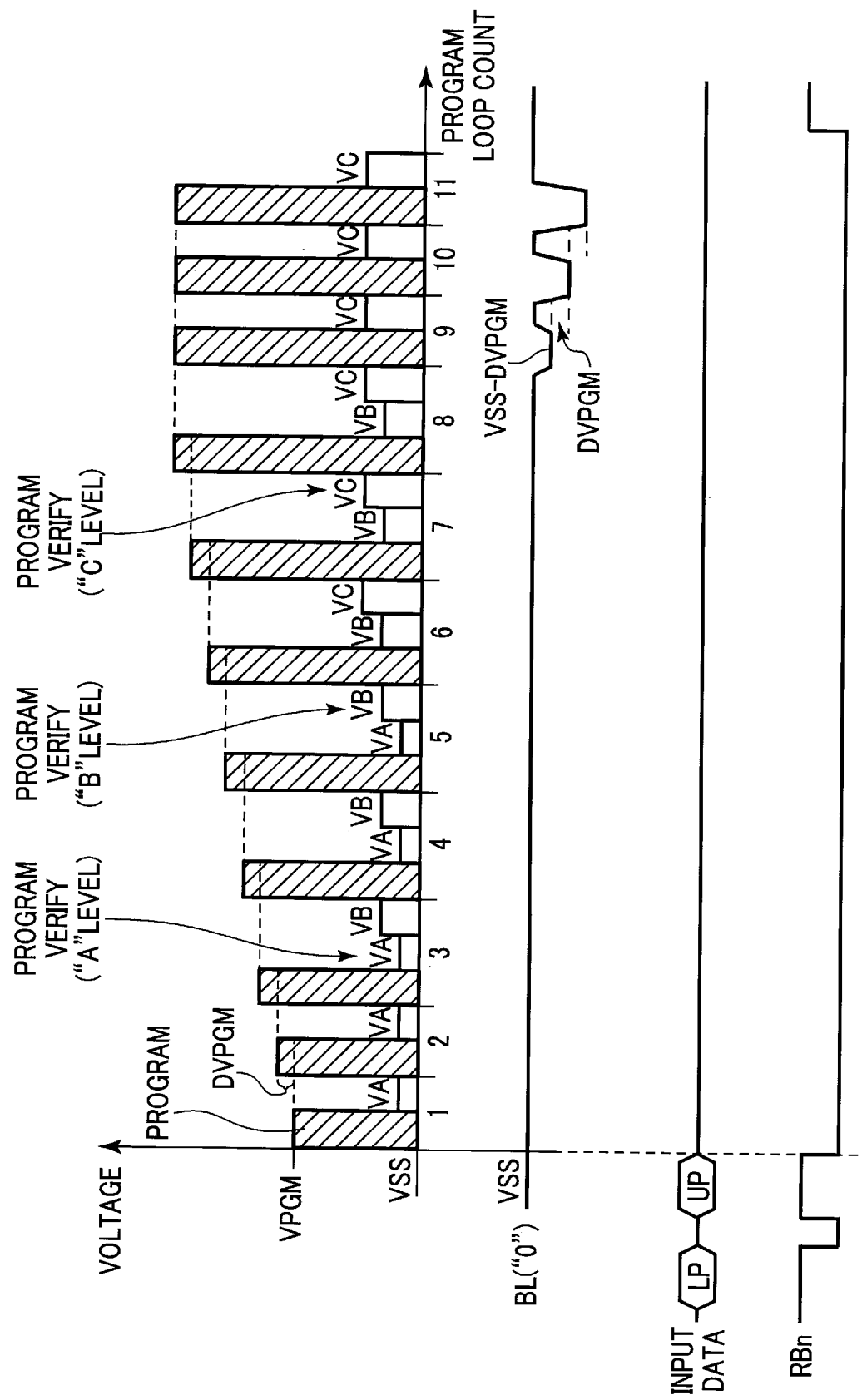
F I G. 70

SEMICONDUCTOR MEMORY DEVICE, MEMORY SYSTEM, AND WRITE METHOD

CROSS-REFERENCE TO RELATED APPLICATIONS

This application is a Continuation application of U.S. application Ser. No. 17/874,968, filed Jul. 27, 2022, and issued as U.S. Pat. No. 11,621,039 on Apr. 4, 2023, which is a Continuation application of U.S. application Ser. No. 17/158,567, filed Jan. 26, 2021, and issued as U.S. Pat. No. 11,437,095 on Sep. 6, 2022, which is a Divisional application of U.S. application Ser. No. 16/529,644, filed Aug. 1, 2019, and issued as U.S. Pat. No. 10,943,651 on Mar. 9, 2021, which is a Continuation-in-Part application of U.S. patent application Ser. No. 16/275,776, filed Feb. 14, 2019, now abandoned, and is based upon and claims the benefit of priority from Japanese Patent Application No. 2018-146833, filed Aug. 3, 2018, the entire contents of all of which are incorporated herein by reference.

FIELD

Embodiments of the present invention relate to a semiconductor memory device, a memory system, and a write method.

BACKGROUND

As a semiconductor memory device, a NAND-type flash memory is known.

BRIEF DESCRIPTION OF THE DRAWINGS

FIG. 1 is a block diagram of a memory system according to a first embodiment;

FIG. 2 is a circuit diagram of a memory cell array in a semiconductor memory device according to the first embodiment;

FIG. 6 is a diagram showing conversion from 4-bit data constituted of a lower bit, a middle bit, an upper bit, and a top bit into 2-bit data constituted of a X1 bit and a X2 bit in the memory system according to the first embodiment;

FIG. 10 is a diagram showing a case of recovering the 4-bit data from the 2-bit data corresponding to a "3" level, a "7" level, a "B" level, and an "F" level and the internal read data in the memory system according to the first embodiment;

FIG. 11 is a flowchart of a write operation in the memory system according to the first embodiment;

FIG. 12 is a diagram showing a command sequence of the first write operation in the memory system according to the first embodiment;

FIG. 13 is a diagram showing a command sequence of the second write operation of a first example in the memory system according to the first embodiment;

FIG. 15 is a diagram showing a data write sequence in the semiconductor memory device according to the first embodiment;

FIG. 16 is a flowchart of the write operation showing the data write sequence in the memory system according to the first embodiment;

FIG. 21 is a flowchart of the write operation in the normal state showing a data write sequence in the memory system according to the second embodiment;

FIG. 22 is a flowchart of the write operation in the normal state showing the data write sequence in the memory system according to the second embodiment;

FIG. 24 is a diagram showing a command sequence of an SLC write operation at power shutdown in the memory system according to the second embodiment;

FIG. 29 is a diagram showing a command sequence of the SLC read operation and the second write operation in the first example in the flow at power recovery of the second example in the memory system according to the second embodiment;

FIG. 31 is a flowchart of the SLC write operation at power shutdown showing the data write sequence in the memory system according to the second embodiment;

FIG. 32 is a diagram showing a data write sequence in a semiconductor memory device according to a third embodiment;

FIG. 34 is a flowchart of a write operation in the memory system according to a first example of the fourth embodiment;

FIG. 35 is a diagram showing a command sequence of the write operation in the first example in the memory system according to the first example of the fourth embodiment;

FIG. 38 is a diagram showing a command sequence of the write operation in the memory system according to the second example of the fourth embodiment;

FIG. 40 is a diagram showing a command sequence of the write operation in the memory system according to the third example of the fourth embodiment;

FIG. 43 is a diagram showing a first example of a data write sequence corresponding to the two times write operations in the semiconductor memory device according to the fifth embodiment;

FIG. 44 is a diagram showing a second example of the data write sequence corresponding to the two times write operations in the semiconductor memory device according to the fifth embodiment;

FIG. 45 is a flowchart showing an SLC read operation corresponding to the two times write operations in the semiconductor memory device according to the fifth embodiment;

FIG. 46 is a diagram showing a threshold distribution of write data in first to fourth times write operations in the SLC write operation corresponding to four times write operations in the semiconductor memory device according to a first example of the fifth embodiment;

FIG. 49 is a diagram showing the threshold distribution of the flag cell in first to fourth times write operations in the SLC write operation corresponding to four times write operations in the semiconductor memory device according to a second example of the fifth embodiment;

FIG. 50 is a flowchart of the SLC read operation corresponding to the four times write operations in the semiconductor memory device according to the second example of the fifth embodiment;

FIG. 52 is a diagram showing a threshold distribution of a C flag cell in the first to fourth times write operations in the SLC write operation corresponding to the four time write operations in the semiconductor memory device according to the third example of the fifth embodiment;

FIG. 55 is a circuit diagram of a memory cell array in a semiconductor memory device according to a sixth embodiment;

FIG. 56 is a circuit diagram of a row decoder in the semiconductor memory device according to the sixth embodiment;

FIG. 57 is a circuit diagram of a block decoder in the semiconductor memory device according to the sixth embodiment;

FIG. 58 is a block diagram of a sense amplifier in the semiconductor memory device according to the sixth embodiment;

FIG. 59 is a circuit diagram of a sense amplifier circuit in the semiconductor memory device according to the sixth embodiment;

FIG. 60 is a cross-sectional diagram of the semiconductor memory device according to the sixth embodiment;

FIG. 61 is a table showing voltages at P-well and N-well during an erase operation, a write operation, and a read operation in the semiconductor memory device according to the sixth embodiment;

FIG. 62 is a diagram showing a threshold distribution, a read level, and a verify level of a memory cell transistor in the semiconductor memory device according to the sixth embodiment;

FIG. 63 is a timing chart showing a voltage of each interconnect during the read operation in the semiconductor memory device according to the sixth embodiment;

FIG. 64 is a timing chart showing the voltage of each interconnect during an erase pulse applying operation in the semiconductor memory device according to the sixth embodiment;

FIG. 69 is a flowchart showing a flow of the write operation in a second example in the semiconductor memory device according to the sixth embodiment; and FIG. 70 is a timing chart showing a voltage of a selected word line, a bit line voltage, input data, and a ready/busy signal in the write operation in the second example in the semiconductor memory device according to the sixth embodiment.

DETAILED DESCRIPTION

Figure 3:
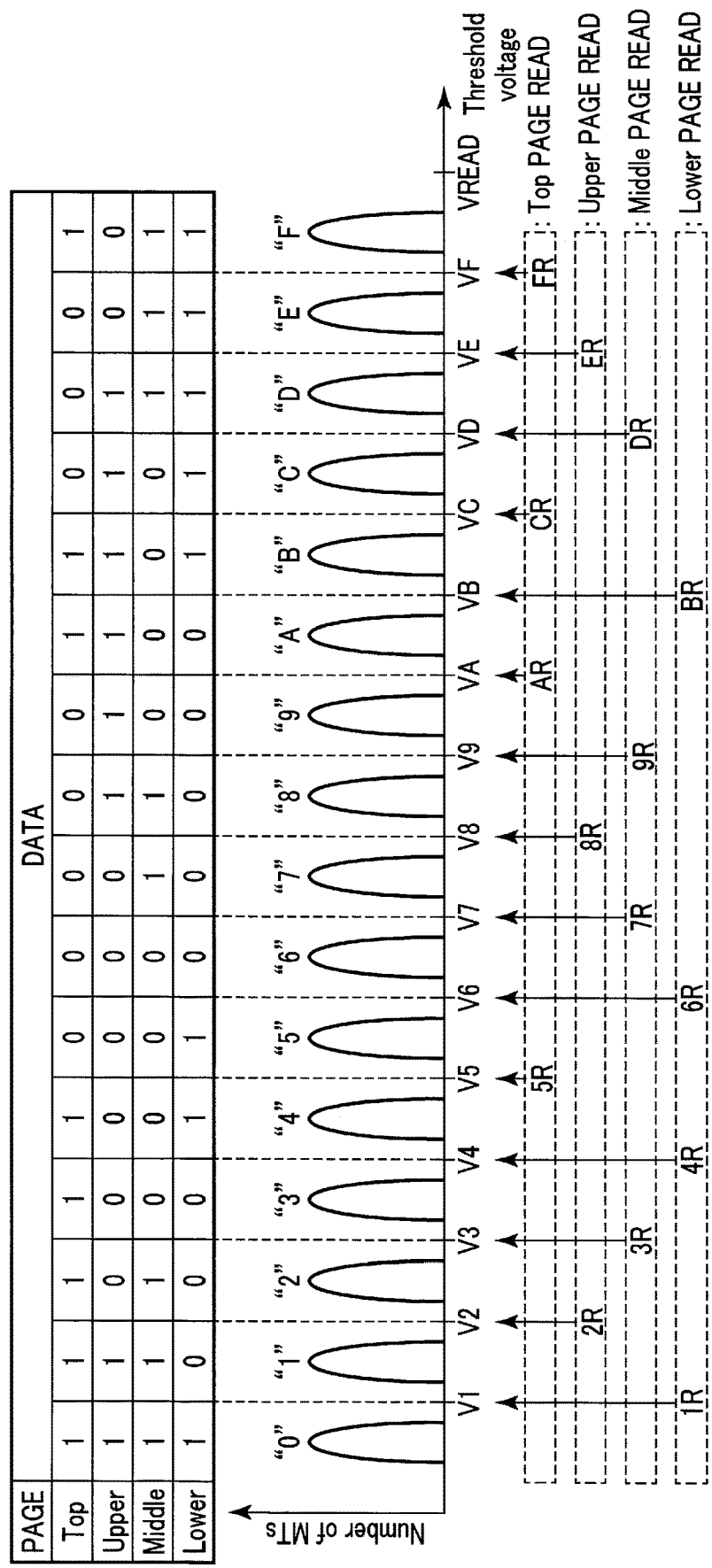
FIG. 3 is a diagram showing data assignment, a threshold distribution, and a read level of a memory cell transistor in the semiconductor memory device according to the first embodiment.

In general, according to one embodiment, a memory system includes a semiconductor memory device having a memory cell array including a memory cell capable of holding at least 4-bit data and a controller configured to control a first write operation and a second write operation based on the 4-bit data in the semiconductor memory device. The controller includes a conversion circuit configured to convert the 4-bit data into 2-bit data. The semiconductor memory device includes a recovery controller configured to recover the 4-bit data based on the converted 2-bit data and data written in the memory cell by the first write operation. The first write operation is executed based on the 4-bit data received from the controller, and the second write operation is executed based on the 4-bit data recovered by the recovery controller.

1. First Embodiment

A semiconductor memory device according to a first embodiment will be described. Hereinafter, as a semiconductor memory device, a three-dimensional stacked NAND-type flash memory in which memory cell transistors are stacked above a semiconductor substrate will be described as an example.

1.1 Configuration

1.1.1 Configuration of Memory System

The overall configuration of a memory system 1 will be described using FIG. 1. In the example of FIG. 1, a part of coupling between blocks is indicated by an arrow line; however, the coupling between the blocks is not limited thereto.

As shown in FIG. 1, the memory system 1 includes a NAND-type flash memory 10 (hereinafter referred to as a memory 10) and a controller 20 and is coupled to an external host apparatus 30.

The controller 20 issues instructions for performing a data read operation, a data write operation, a data erase operation, and the like to the memory 10, in response to a request (instruction) from the host apparatus 30. Further, the controller 20 manages a memory space of the memory 10.

The controller 20 includes a host interface circuit 21, a built-in memory (RAM) 22, a processor (CPU; central processing unit) 23, a buffer memory 24, an ECC circuit 25, a NAND interface circuit 26, and a data conversion circuit 27.

The host interface circuit 21 is coupled to the host apparatus 30 through a host bus and communicates with the host apparatus 30. For example, the host interface circuit 21 transfers an instruction and data, received from the host apparatus 30, respectively to the CPU 23 and the buffer memory 24. The host interface circuit 21 further transfers data in the buffer memory 24 to the host apparatus 30, in response to an instruction from the CPU 23.

The RAM 22 is a semiconductor memory such as DRAM and holds firmware for management of the memory 10, various management tables, or the like. Further, the RAM 22 is used as a work area of the CPU 23. More specifically, for example, the RAM 22 includes page clusters CL0 to CL(k−1) (k is an integer of 2 or more). The number of page clusters CL can be arbitrarily set according to a data write sequence in the memory 10 and the like. Hereinafter, in the present embodiment, a case where eight page clusters CL0 to CL7 are provided will be described. Each page cluster CL includes regions PG0 and PG1, for example. The regions PG can each hold 1 page data. The definition of the "page" will be described later. Namely, the page cluster CL can hold 2-page data. The number of the regions PG in the page cluster CL can be arbitrarily set according to a method of writing data in the memory 10 and the like.

The CPU 23 controls the overall operation of the controller 20. For example, the CPU 23 issues a write command to the NAND interface circuit 26, in response to a write instruction received from the host apparatus 30. This operation is similar for a read command and an erase command. Further, the CPU 23 executes various processes for managing a memory space of the memory 10, such as wear leveling.

The buffer memory 24 temporarily holds read data, received by the controller 20 from the memory 10, write data, received from the host apparatus 30, and so on.

The ECC circuit 25 executes a data error checking and correcting (ECC) process. Specifically, the ECC circuit 25 generates parity bits, based on write data during data writing. Then, the ECC circuit 25 generates syndrome bits from the parity bits during data reading, to detect an error, and thus to correct the detected error.

The NAND interface circuit 26 is coupled to the memory 10 through a NAND bus and communicates with the memory 10. For example, the NAND interface circuit 26 transmits various control signals to the memory 10 based on a command received from the CPU 23, receives a ready/busy signal RBn from the memory 10, and transmits or receives an input/output signal I/O to or from the memory 10.

The ready/busy signal RBn is a signal indicating whether the memory 10 can receive an instruction from the controller 20. The ready/busy signal RBn is set to a high ("H") level, for example when the memory 10 is in a ready state in which the memory 10 can receive the instruction from the controller 20, and the ready/busy signal RBn is set to a low ("L") level when the memory 10 is in a busy state in which the memory 10 cannot receive the instruction.

The input/output signal I/O is a signal of 8 bits, for example, and includes a command CMD, an address ADD, data DAT, and the like. For example, during a write operation, the input/output signal I/O transferred to the memory 10 includes a write command CMD issued by the CPU 23, the address ADD, and write data DAT in the buffer memory 24. On the other hand, during a read operation, the input/output signal I/O transferred to the memory 10 includes a read command CMD and the address ADD, and the input/output signal I/O transferred to the controller 20 includes read data DAT.

For example, when the memory cell transistor included in the memory 10 is a QLC (quad level cell) holding 4-bit (16-ary) data, the data conversion circuit 27 converts the 4-bit data corresponding to QLC into 2-bit data. In other words, the data conversion circuit 27 generates 2-bit data from 4-bit data of QLC. The converted 2-bit data is stored in the RAM 22. The data conversion circuit 27 may be provided in the CPU 23. In addition, the number of bits of data converted by the data conversion circuit 27 can be arbitrarily set. For example, 3-bit data may be converted into 1-bit data, and 5-bit data may be converted into 3-bit data or 2-bit data.

Examples of the host apparatus 30 using the memory system 1 described above include a digital camera and a personal computer.

Next, the configuration of the memory 10 will be described. The memory 10 includes a memory cell array 11, a command register 12, an address register 13, a sequencer 14, a driver circuit 15, a row decoder 16, a data register 17, a sense amplifier 18, and a data recovery controller 19.

The memory cell array 11 includes a plurality of blocks BLK0 to BLKn (n is an integer of 1 or more). The block BLK is a collection of a plurality of nonvolatile memory cell transistors associated with a bit line and a word line and is, for example, a data erase unit.

The memory cell array 11 includes a user area and a management area as a spatial area of a memory, and for example, the blocks BLK are allocated to the user area and the management area. The user area is an area used for write operation and read operation of data received from the host apparatus 30. The management area is, for example, an area where management data such as a control program or various setting parameters is stored. In the management area, for example, backup data at power shutdown is stored.

The command register 12 holds the command CMD received from the controller 20. The address register 13 holds the address ADD received from the controller 20. The address ADD includes a column address CA, a page address PA, and a block address BA.

The sequencer 14 controls the overall operation of the memory 10, based on the command CMD held by the command register 12. Specifically, the sequencer 14 controls the driver circuit 15, the row decoder 16, the data register 17, the sense amplifier 18, the data recovery controller 19, and so on, based on the command CMD and executes the data write operation, the data read operation, or the like.

The driver circuit 15 generates a necessary voltage, based on an instruction from the sequencer 14. Further, the driver circuit 15 supplies the generated voltage to the row decoder 16, based on the page address PA held by the address register 13.

The row decoder 16 selects any one of the blocks BLK0 to BLKn, based on the block address BA held by the address register 13. Further, the row decoder 16 selects a row direction in the selected block BLK and applies the voltage, supplied from the driver circuit 15, to a word line and the like.

The data register 17 includes a plurality of latch circuits. The latch circuit temporarily holds data. For example, in the write operation, the data register 17 temporarily holds the write data received via an input/output circuit (not shown), and transmits the data to the sense amplifier 18. On the other hand, for example, in the read operation, the data register 17 temporarily holds the read data received from the sense amplifier 18, and transmits the data to the controller 20 via the input/output circuit.

The sense amplifier 18 senses the data read from the memory cell array 11 in the read operation. Then, the sense amplifier 18 transmits the read data to the data register 17. The sense amplifier 18 transmits the write data to the memory cell array 11 in the write operation. Further, the sense amplifier 18 includes a plurality of latch circuits (not shown) for holding data.

The data recovery controller 19 holds, in the data register 17, 2-bit converted data received from the controller 20 and data (hereinafter also referred to as internal data) read from the memory cell array 11 and performs calculation to recover the 4-bit data corresponding to QLC. The data recovery controller 19 may be provided in the sequencer 14.

1.1.2 Configuration of Memory Cell Array

Next, a configuration of the memory cell array 11 will be described using FIG. 2. Although the example in FIG. 2 shows the block BLK0, the other blocks BLK have the same configurations as the block BLK0.

As shown in FIG. 2, the block BLK0 includes, for example, four string units SU0 to SU3. Hereinafter, in the case where the string units SU0 to SU3 are not limited, they are referred to as a string unit SU or SUi (i is an integer from 0 to 3). Each of the string units SU includes a plurality of NAND strings NS. Each of the NAND strings NS includes, for example, 96 memory cell transistors MT0 to MT95 and select transistors ST1 and ST2. Hereinafter, in the case where the memory cell transistors MT0 to MT95 are not limited, they are referred to as a memory cell transistor MT. The memory cell transistor MT is provided with a control gate and a charge storage layer and nonvolatilely holds data.

The number of the string units SU is not limited to four. Further, the memory cell transistor MT may be of a MONOS type using an insulating film for the charge storage layer or an FG type using a conductive layer for the charge storage layer. The number of the memory cell transistors MT is not limited to 96 but may be 8, 16, 32, 64, 128, or the like. The number is not limited. Moreover, the number of the select transistors ST1 and ST2 is arbitrary, and one or a plurality of the select transistors may be provided, respectively.

The memory cell transistors MT are coupled in series between a source of the select transistor ST1 and a drain of the select transistor ST2. More specifically, current paths of the memory cell transistors MT0 to MT95 are coupled in series. A drain of the memory cell transistor MT95 is coupled to the source of the select transistor ST1, and a source of the memory cell transistor MT0 is coupled to the drain of the select transistor ST2.

Gates of the select transistors ST1 in the string units SU0 to SU3 are coupled to select gate lines SGD0 to SGD3, respectively. Similarly, gates of the select transistors ST2 in the string units SU0 to SU3 are coupled to select gate lines SGS0 to SGS3, respectively. Hereinafter, in the case where the select gate lines SGD0 to SGD3 are not limited, they are referred to as a select gate line SGD. In the case where the select gate lines SGS0 to SGS3 are not limited, they are referred to as a select gate line SGS. The select gate lines SGS0 to SGS3 of the string units SU may be commonly coupled.

Control gates of the memory cell transistors MT0 to MT95 in the block BLK are commonly coupled to the word lines WL0 to WL95, respectively. Hereinafter, in the case where the word lines WL0 to WL95 are not limited, they are referred to as a word line WL or WLj (j is an integer from 0 to 95).

Drains of the select transistors ST1 of the NAND strings NS in the string unit SU are coupled to different bit lines BL0 to BL(m−1) (m is an integer of 2 or more). Hereinafter, in the case where the bit lines BL0 to BL(m−1) are not limited, they are referred to as a bit line BL. Each of the bit lines BL commonly couples the NAND string NS in each of the string units SU between the blocks BLK. Sources of the select transistors ST2 are commonly coupled to a source line SL. In other words, the string units SU are coupled to the bit lines BL which are different from one another, and are an assembly of the NAND strings NS and are coupled to the same select gate lines SGD and SGS. In addition, the block BLK is an assembly of the string units SU which employ a common set of the word lines WL. Also, the memory cell array 11 is an assembly of the blocks BLK which employ a common set of the bit lines BL.

The writing of data and the reading of data are collectively performed with respect to the memory cell transistor MT which is coupled to any one of the word lines WL in any one of the string units SU. Hereinafter, a group of the memory cell transistors MT selected collectively in the data write operation and the data read operation is referred to as a "memory cell group MCG". In the memory cell group MCG, a group of 1-bit data to be written to or read from each of the memory cell transistors MT is referred to as a "page". Accordingly, when 4-bit data is stored in the memory cell transistor MT, data corresponding to four pages is stored in the memory cell group MCG coupled to the word line WL.

In the present embodiment, the memory cell transistor MT in the user area can hold 4-bit data. That is, the memory cell transistor MT in the user area in the present embodiment is a QLC (quad level cell) holding 4-bit data. The 4-bit data held by the QLC is referred to as a "lower bit", a "middle bit", an "upper bit", and a "top bit" in order from lower bits. A collection of lower bits held by the memory cell group MCG is referred to as a "lower page", a collection of middle bits is referred to as a "middle page", a collection of upper bits is referred to as an "upper page", and a collection of top bits is referred to as a "top page".

The number of bits of data that the memory cell transistor MT can hold is not limited to 4 bits. The present embodiment can be applied as long as the memory cell transistor MT can hold data of 3 bits or more.

1.2 Threshold Distribution of Memory Cell Transistor MT

Next, a threshold distribution of the memory cell transistor MT will be described using FIG. 3. FIG. 3 shows data, the threshold distribution, and a voltage used during a read operation that can be taken by each of the memory cell transistors MT.

As shown in FIG. 3, when the memory cell transistor MT holds 4-bit data, a distribution of a threshold voltage thereof is divided into 16 segments. The 16 threshold distributions are referred to as a "0" level, a "1" level, a "2" level, a "3" level, a "4" level, a "5" level, a "6" level, a "7" level, an "8" level, a "9" level, an "A" level, a "B" level, a "C" level, a "D" level, an "E" level, and an "F" level in the ascending order of threshold voltages.

Figure 4:
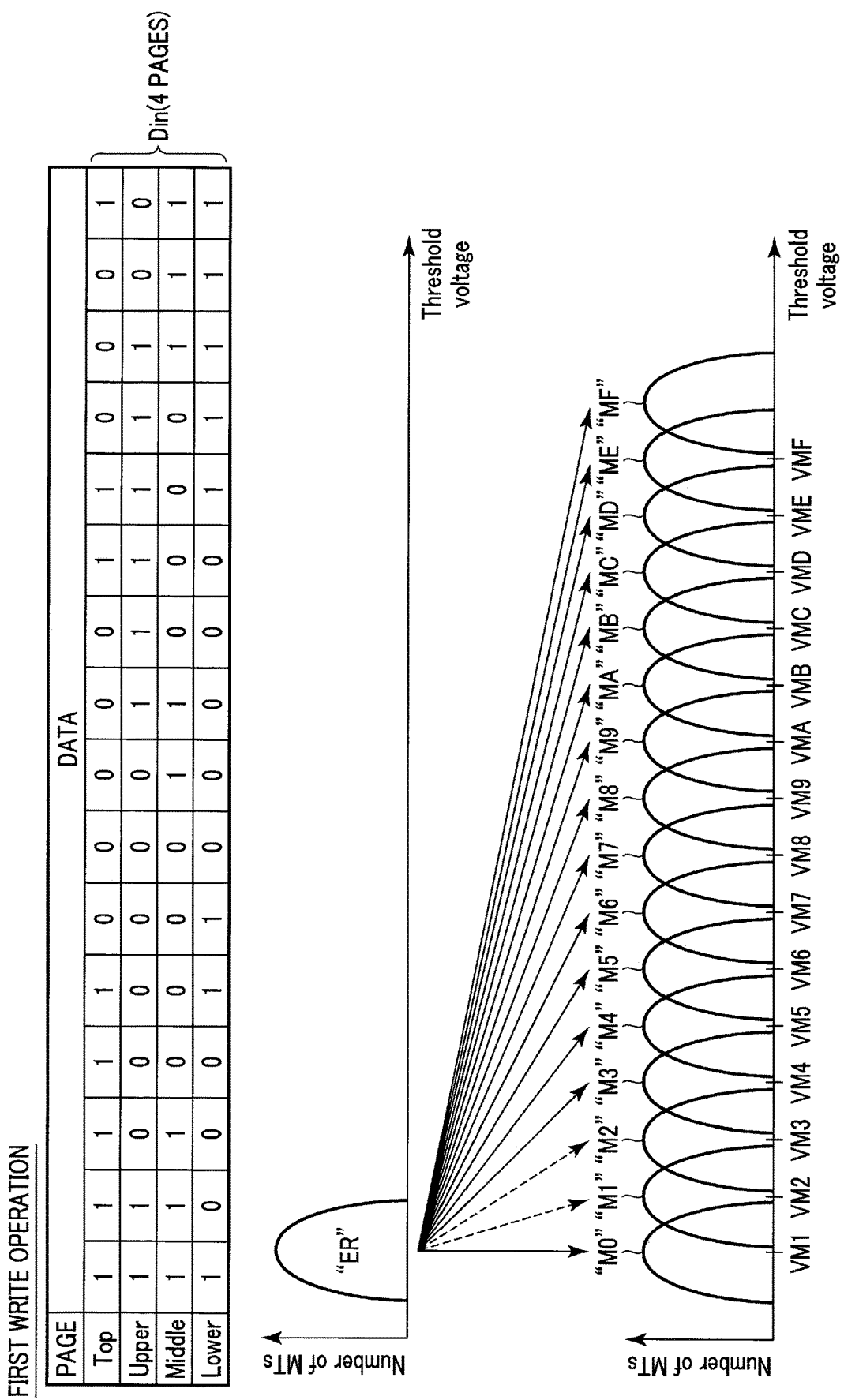
FIG. 4 is a diagram showing a change in threshold distribution of the memory cell transistor according to a first write operation in the semiconductor memory device according to the first embodiment.

Voltages V1, V2, V3, V4, V5, V6, V7, V8, V9, VA, VB, VC, VD, VE, and VF shown in FIG. 4 are used for the verification of the "0" level, the "1" level, the "2" level, the "3" level, the "4" level, the "5" level, the "6" level, the "7" level, the "8" level, the "9" level, the "A" level, the "B" level, the "C" level, the "D" level, the "E" level, and the "F" level, respectively, during the write operation. A voltage VREAD is a voltage applied to an unselected word line during the read operation. When the voltage VREAD is applied to the gate of the memory cell transistor MT, the memory cell transistor MT is held in an on state regardless of held data. A relationship of those voltage values is $V1<V2<V3<V4<V5<V6<V7<V8<V9<VA<VB<VC<VD<VE<VF<VREAD$.

The "0" level of the above threshold distributions corresponds to an erase state of the memory cell transistor MT. A threshold voltage at the "0" level is less than the voltage V1. A threshold voltage at the "1" level is equal to or higher than the voltage V1 and lower than the voltage V2. A threshold voltage at the "2" level is equal to or higher than the voltage V2 and lower than the voltage V3. A threshold voltage at the "3" level is equal to or higher than the voltage V3 and lower than the voltage V4. A threshold voltage at the "4" level is equal to or higher than the voltage V4 and lower than the voltage V5. A threshold voltage at the "5" level is equal to or higher e than the voltage V5 and lower than the voltage V6. A threshold voltage at the "6" level is equal to or higher than the voltage V6 and lower than the voltage V7. A threshold voltage at the "7" level is equal to or higher than the voltage V7 and lower than the voltage V8. A threshold voltage at the "8" level is equal to or higher than the voltage V8 and lower than the voltage V9. A threshold voltage at the "9" level is equal to or higher than the voltage V9 and lower than the voltage VA. A threshold voltage at the "A" level is equal to or higher than the voltage VA and lower than the voltage VB. A threshold voltage at the "B" level is equal to or higher than the voltage VB and lower than the voltage VC. A threshold voltage at the "C" level is equal to or higher than the voltage VC and lower than the voltage VD. A threshold voltage at the "D" level is equal to or higher than the voltage VD and lower than the voltage VE. A threshold voltage at the "E" level is equal to or higher than the voltage VE and lower than the voltage VF. A threshold voltage at the "F" level is equal to or higher than the voltage VE and lower than the voltage VREAD.

In order to simplify description, the read operation in this example will be described, taking as an example a case where a verify voltage is used as a read voltage. Hereinafter, read operations using the voltages V1, V2, V3, V4, V5, V6, V7, V8, V9, VA, VB, VC, VD, VE, and VF are referred to as read operations 1R, 2R, 3R, 4R, 5R, 6R, 7R, 8R, 9R, AR, BR, CR, DR, ER, and FR, respectively. The read operation 1R determines whether or not the threshold voltage of the memory cell transistor MT is less than the voltage V1. The read operation 2R determines whether or not the threshold voltage of the memory cell transistor MT is less than the voltage V2. The read operation 3R determines whether or not the threshold voltage of the memory cell transistor MT is less than the voltage V3. The same applies hereinafter.

The above 16 threshold distributions are formed by writing 4-bit data constituted of a lower bit, a middle bit, an upper bit, and a top bit. The 16 threshold distributions correspond to 4-bit data items being different from each other. In the present embodiment, data is assigned to "top bit/upper bit/middle bit/lower bit" for the memory cell transistor MT included in each level as follows.

The memory cell transistor MT included at the "0" level holds "1111" data. The memory cell transistor MT included at the "1" level holds "1110" data. The memory cell transistor MT included at the "2" level holds "1010" data. The memory cell transistor MT included at the "3" level holds "1000" data. The memory cell transistor MT included at the "4" level holds "1001" data. The memory cell transistor MT included at the "5" level holds "0001" data. The memory cell transistor MT included at the "6" level holds "0000" data. The memory cell transistor MT included at the "7" level holds "0010" data. The memory cell transistor MT included at the "8" level holds "0110" data. The memory cell transistor MT included at the "9" level holds "0100" data. The memory cell transistor MT included at the "A" level holds "1100" data. The memory cell transistor MT included at the "B" level holds "1101" data. The memory cell transistor MT included at the "C" level holds "0101" data. The memory cell transistor MT included at the "D" level holds "0111" data. The memory cell transistor MT included at the "E" level holds "0011" data. The memory cell transistor MT included at the "F" level holds "1011" data.

When data thus assigned is read, the lower bit is determined by the read operations 1R, 4R, 6R, and BR. The middle bit is determined by the read operations 3R, 7R, 9R, and DR. The upper bit is determined by the read operations 2R, 8R, and ER. The top bit is determined by the read operations 5R, AR, CR, and FR. Namely, values of the lower bit, the middle bit, the upper bit, and the top bit are determined by four-time read operations, four-time read operations, three-time read operations, and four-time read operations, respectively. Hereinafter, this data assignment is referred to as a "4-4-3-4 code".

1.3 Write Operation

Next, the write operation will be described. The write operation roughly includes a program operation and a program verify operation. By repeating a combination of the program operation and the program verify operation (hereinafter referred to as a "program loop"), the threshold voltage of the memory cell transistor MT is increased to a target level.

The program operation is an operation which causes a threshold voltage to be increased by injecting electrons to the charge storage layer (or causes the threshold voltage to be maintained by prohibiting the injection).

The program verify operation is an operation of reading data after the program operation and determining whether or not the threshold voltage of the memory cell transistor MT has reached the aimed target level.

1.3.1 First and Second Write Operations

Next, the write operation of the present embodiment will be described in detail. In the present embodiment, the write operation of 4-page data corresponding to QLC is executed in two steps. Hereinafter, the write operation executed for the first time in a certain memory cell group MCG is referred to as a "first write operation", and the write operation executed secondly is referred to as a "second write operation". The first write operation and the second write operation are each executed based on write data of four pages. In the present embodiment, 4-page data is roughly written in the first write operation, and 4-page data is finely written in the second write operation. The write operation may be executed in three or more steps. For example, the 4-page data may be written divided into three times.

First, the first write operation will be described using FIG. 4. FIG. 4 shows a change in threshold distribution of the memory cell transistor MT according to the first write operation.

As shown in FIG. 4, the sequencer 14 executes the first write operation based on the 4-page data input from the controller 20.

The threshold voltage of the memory cell transistor MT before execution of the first write operation is distributed at an "ER" level. The threshold voltage at the "ER" level is lower than the voltage V1 and corresponds to the erase state of the memory cell transistor MT.

In the first write operation, the sequencer 14 uses voltages VM1, VM2, VM3, VM4, VM5, VM6, VM7, VM8, VM9, VMA, VMB, VMC, VMD, VME, and VMF as verify voltages. The voltages VM1, VM2, VM3, VM4, VM5, VM6, VM7, VM8, VM9, VMA, VMB, VMC, VMD, VME, and VMF are used respectively when "1111" ("lower bit/middle bit/upper bit/top bit") data, "1110" data, "1010" data, "1000" data, "1001" data, "0001" data, "0000" data, "0010" data, "0110" data, "0100" data, "1100" data, "1101" data, "0101" data, "0111" data, "0011" data, and "1011" data are written. The voltage VM1 is lower than the voltage V1. The voltage VM2 is equal to or higher than the voltage V1 and lower than the voltage V2. The voltage VM3 is equal to or higher than the voltage V2 and lower than the voltage V3. The voltage VM4 is equal to or higher than the voltage V3 and lower than the voltage V4. The voltage VM5 is equal to or higher than the voltage V4 and lower than the voltage V5. The voltage VM6 is equal to or higher than the voltage V5 and lower than the voltage V6. The voltage VM7 is equal to or higher than the voltage V6 and lower than the voltage V7. The voltage VM8 is equal to or higher than the voltage V7 and lower than the voltage V8. The voltage VM9 is equal to or higher than the voltage V8 and lower than the voltage V9. The voltage VMA is equal to or higher than the voltage V9 and lower than the voltage VA. The voltage VMB is equal to or higher than the voltage VA and lower than the voltage VB. The voltage VMC is equal to or higher than the voltage VB and lower than the voltage VC. The voltage VMD is equal to or higher than the voltage VC and lower than the voltage VD. The voltage VME is equal to or higher than the voltage VD and lower than the voltage VE. The voltage VMF is equal to or higher than the voltage VE and lower than the voltage VF.

When the first write operation is executed, the threshold voltage of the memory cell transistor MT increases based on write data, and 16 threshold distributions are formed. In the first write operation, as shown in FIG. 4, the 16 threshold distributions sometimes overlap the adjacent threshold distributions. An "M0" level shown in FIG. 4 is formed by the memory cell transistors MT in which the "1111" data is written. The "M1" level is formed by the memory cell transistors MT in which the "1110" data is written. The "M2" level is formed by the memory cell transistors MT in which the "1010" data is written. The "M3" level is formed by the memory cell transistors MT in which the "1000" data is written. The "M4" level is formed by the memory cell transistors MT in which the "1001" data is written. The "M5" level is formed by the memory cell transistors MT in which the "0001" data is written. The "M6" level is formed by the memory cell transistors MT in which the "0000" data is written. The "M7" level is formed by the memory cell transistors MT in which the "0010" data is written. The "M8" level is formed by the memory cell transistors MT in which the "0110" data is written. The "M9" level is formed by the memory cell transistors MT in which the "0100" data is written. The "MA" level is formed by the memory cell transistors MT in which the "1100" data is written. The "MB" level is formed by the memory cell transistors MT in which the "1101" data is written. The "MC" level is formed by the memory cell transistors MT in which the "0101" data is written. The "MD" level is formed by the memory cell transistors MT in which the "0111" data is written. The "ME" level is formed by the memory cell transistors MT in which the "0011" data is written. The "MF" level is formed by the memory cell transistors MT in which the "1011" data is written.

The threshold voltage at the "M0" level is lower than the voltage V1, and as in the above "0" level and "ER" level, the threshold voltage at the "M0" level corresponds to the erase state of the memory cell transistor MT. Namely, in the first write operation, the increase in threshold voltage is suppressed in the memory cell transistor MT in which the "1111" data is written. However, the threshold voltage at the "M0" level is slightly increased by the first write operation, although not so much as to change the threshold level to the "1" level. A threshold voltage at the "M1" level is equal to or higher than the voltage VM1 and lower than the voltage V2. A threshold voltage at the "M2" level is equal to or higher than the voltage VM2 and lower than the voltage V3. A threshold voltage at the "M3" level is equal to or higher than the voltage VM3 and lower than the voltage V4. A threshold voltage at the "M4" level is equal to or higher than the voltage VM4 and lower than the voltage V5. A threshold voltage at the "M5" level is equal to or higher than the voltage VM5 and lower than the voltage V6. A threshold voltage at the "M6" level is equal to or higher than the voltage VM6 and lower than the voltage V7. A threshold voltage at the "M7" level is equal to or higher than the voltage VM7 and lower than the voltage V8. A threshold voltage at the "M8" level is equal to or higher than the voltage VM8 and lower than the voltage V9. A threshold voltage at the "M9" level is equal to or higher than the voltage VM9 and lower than the voltage VA. A threshold voltage at the "MA" level is equal to or higher than the voltage VMA and lower than the voltage VB. A threshold voltage at the "MB" level is equal to or higher than the voltage VMB and lower than the voltage VC. A threshold voltage at the "MC" level is equal to or higher than the voltage VMC and lower than the voltage VD. A threshold voltage at the "MD" level is equal to or higher than the voltage VMD and lower than the voltage VE. A threshold voltage at the "ME" level is equal to or higher than the voltage VME and lower than the voltage VF. A threshold voltage at the "MF" level is equal to or higher than the voltage VMF and lower than the voltage VREAD.

Thus, the voltages VM1, VM2, VM3, VM4, VM5, VM6, VM7, VM8, VM9, VMA, VMB, VMC, VMD, VME, and VMF used in the program verify operation in the first write operation are set such that the threshold voltage of the memory cell transistor MT having passed verification does not exceed the voltages V2, V3, V4, V5, V6, V7, V8, V9, VA, VB, VC, VD, VE, VF, and VREAD, respectively.

Figure 5:
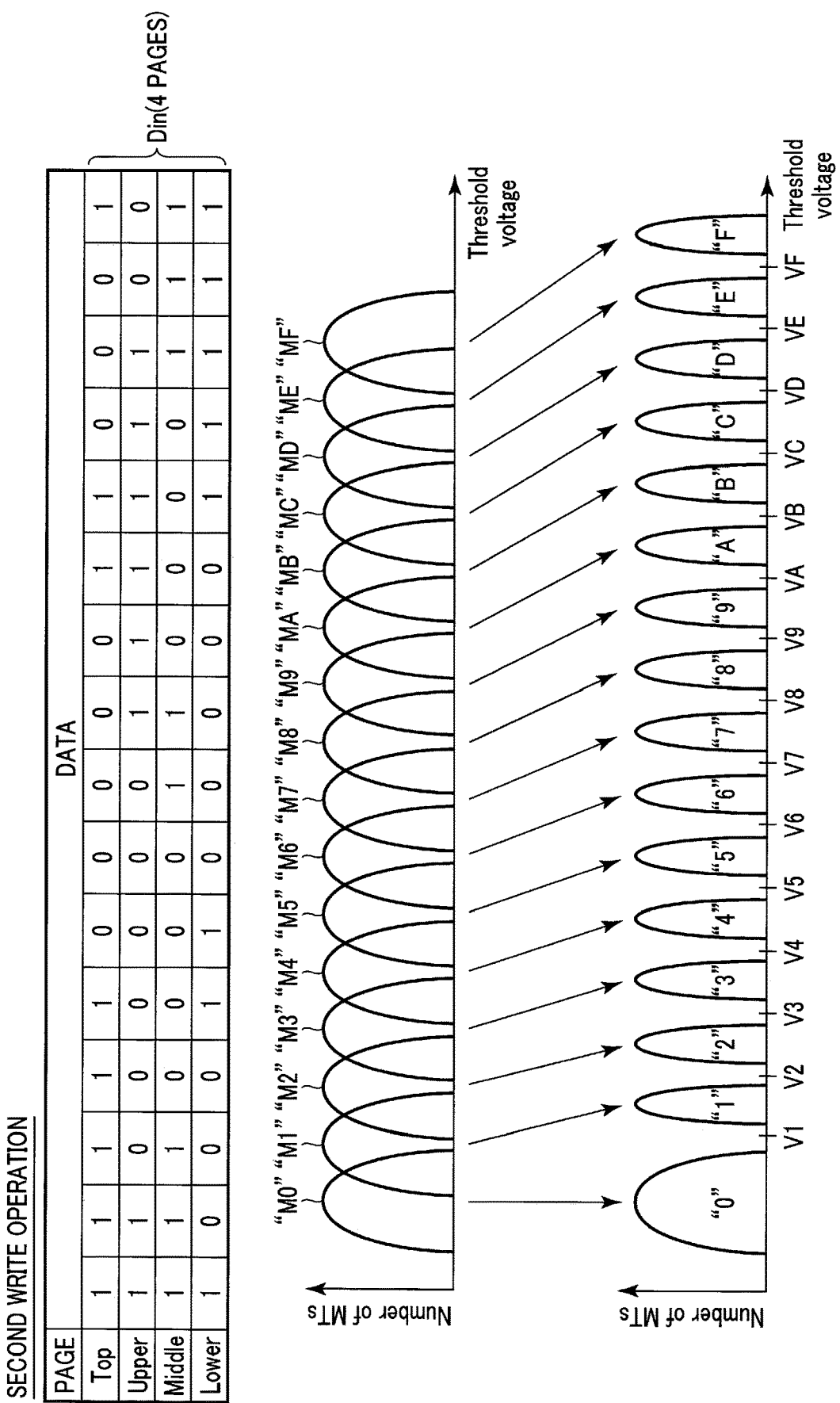
FIG. 5 is a diagram showing a change in threshold distribution of the memory cell transistor according to a second write operation in the semiconductor memory device according to the first embodiment.

Next, the second write operation will be described using FIG. 5. FIG. 5 shows a change in threshold distribution of the memory cell transistor MT according to the second write operation.

As shown in FIG. 5, the sequencer 14 executes the second write operation based on the 4-page data.

In the second write operation, the sequencer 14 uses the voltages V1, V2, V3, V4, V5, V6, V7, V8, V9, VA, VB, VC, VD, VE, and VF as verify voltages. When the second write operation is executed, the threshold voltage of the memory cell transistor MT increases based on write data, and 16 thin threshold distributions are formed from 16 wide threshold distributions. For example, a threshold distribution at the "0" level is formed from a threshold distribution at the "M0" level, a threshold distribution at the "1" level is formed from a threshold distribution at the "M1" level, and a threshold distribution at the "2" level is formed from a threshold distribution at the "M2" level. The same applies hereinafter.

1.3.2 Write Data Conversion Processing

Next, write data conversion processing will be described using FIG. 6. In the present embodiment, after the first write operation is executed using 4-page (top page/upper page/middle page/lower page) data, the 4-page data is converted into 2-page data in the data conversion circuit 27 to be stored in the page cluster CL in the RAM 22. That is, the data conversion circuit 27 converts 4-bit (top bit/upper bit/middle bit/lower bit) data into 2-bit data. Hereinafter, the upper bit of the 2-bit data after conversion is referred to as an "X1 bit", and the lower bit thereof is referred to as an "X2 bit". In addition, a collection of the X2 bits is referred to as an "X2 page", and a collection of the X2 bits is referred to as an "X2 page".

As shown in FIG. 6, the data conversion circuit 27 converts 4-bit data into 2-bit (X1 bit/X2 bit) data.

More specifically, the "1111" data at the "0" level is converted into "11" data. The "1110" data at the "1" level is converted into "01" data. The "1010" data at the "2" level is converted into "00" data. The "1000" data at the "3" level is converted into "10" data. The "1001" data at the "4" level is converted into "11" data. The "0001" data at the "5" level is converted into "01" data. The "0000" data at the "6" level is converted into "00" data. The "0010" data at the "7" level is converted into "10" data. The "0110" data at the "8" level is converted into "11" data. The "0100" data at the "9" level is converted into "01" data. The "1100" data at the "A" level is converted into "00" data. The "1101" data at the "B" level is converted into "10" data. The "0101" data at the "C" level is converted into "11" data. The "0111" data at the "D" level is converted into "01" data. The "0011" data at the "E" level is converted into "00" data. The "1011" data at the "F" level is converted into "10" data.

That is, the "11" data is assigned to the "0" level, the "4" level, the "8" level, and the "C" level. The "01" data is assigned to the "1" level, the "5" level, the "9" level, and the "D" level. The "00" data is assigned to the "2" level, the "6" level, the "A" level, and the "E" level. The "10" data is assigned to the "3" level, the "7" level, the "B" level, and the "F" level. In the 2-bit data at adjacent levels (threshold distributions), the "11" data, the "01" data, the "00" data, and the "10" data are repeatedly assigned from the "0" level to the "F" level so that the 2-bit data becomes a gray code that is different by 1 bit.

1.3.3 Write Data Recovery Processing

Next, write data recovery processing will be described using FIGS. 7 to 10. In the present embodiment, the data recovery controller 19 recovers 4-page (top page/upper page/middle page/lower page) data from 2-page (X1 page/X2 page) data received from the controller 20 and data after the first write operation read from the memory cell transistor MT. Then, the sequencer 14 executes the second write operation by using the recovered 4-page data. Hereinafter, a read operation for recovering 4-page data is referred to as an "internal data read operation". For example, data read by the internal data read operation is not transmitted to the controller 20 but transmitted to the data recovery controller 19.

Figure 7:
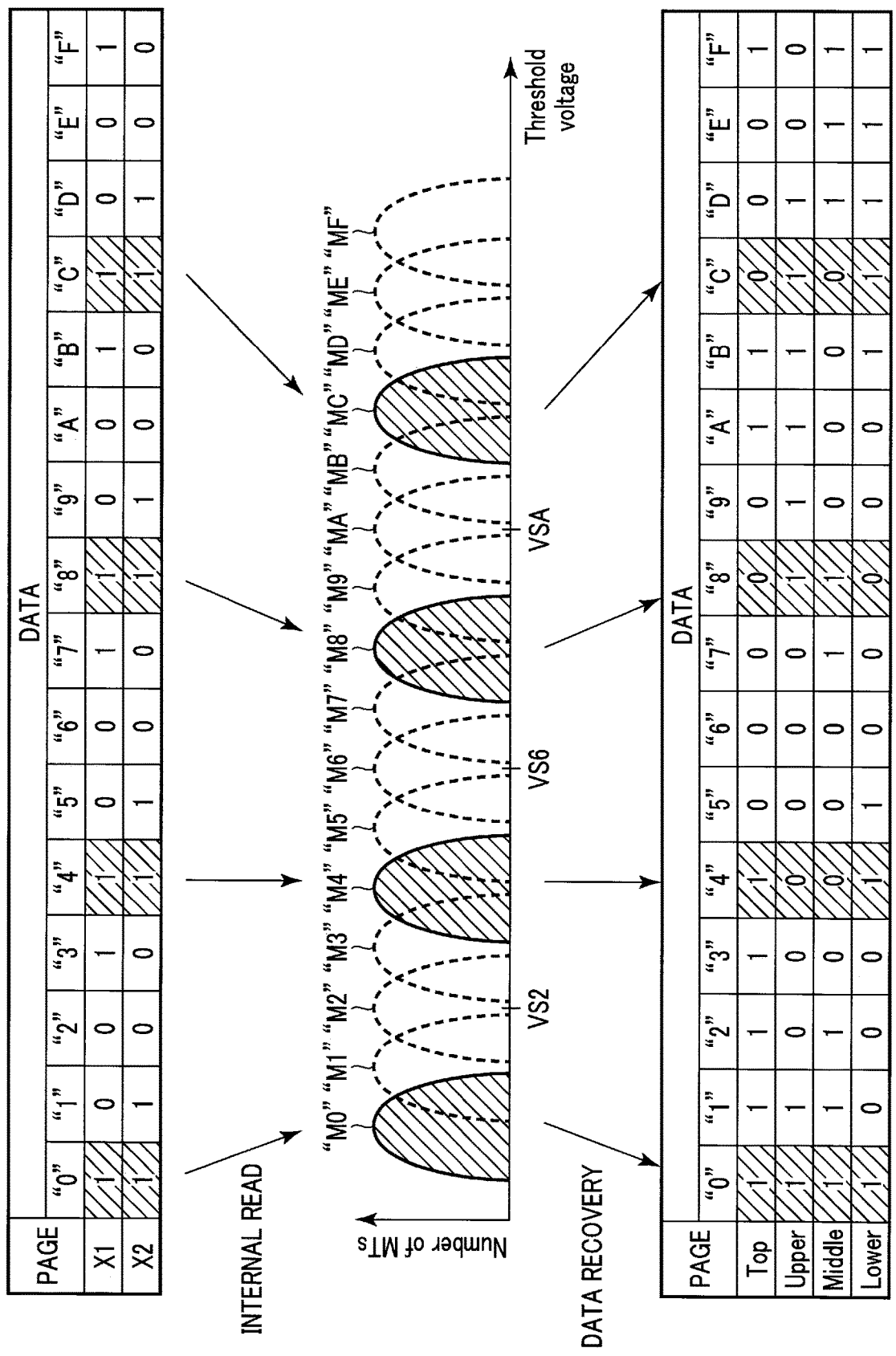
FIG. 7 is a diagram showing a case of recovering the 4-bit data from the 2-bit data corresponding to a "0" level, a "4" level, a "8" level, and a "C" level and internal read data in the memory system according to the first embodiment.

As shown in FIG. 7, the "11" (X1 bit/X2 bit) data corresponds to any of the "0" level, the "4" level, the "8"

level, and the "C" level. In the memory cell transistor MT after the first write operation, the threshold distributions corresponding to the "0" level, the "4" level, the "8" level, and the "C" level are respectively the "M0" level, the "M4" level, the "M8" level, and the "MC" level. The threshold distributions at these four levels are separated from each other and do not overlap. In order to distinguish these four levels, the sequencer 14 performs the internal data read operation between the "M0" level, the "M4" level, the "M8" level, and the "MC" level.

More specifically, for example, the sequencer 14 performs the internal data read operation three times using the read voltages VS2, VS6, and VSA. The voltage VS2 is higher than the threshold distribution at the "M0" level and lower than the threshold distribution at the "M4" level, that is, higher than the voltage V1 and lower than the voltage VM4. The voltage VS6 is higher than the threshold distribution at the "M4" level and lower than the threshold distribution at the "M8" level, that is, higher than the voltage V5 and lower than the voltage VM8. The voltage VSA is higher than the threshold distribution at the "M8" level and lower than the threshold distribution at the "MC" level, that is, higher than the voltage V9 and lower than the voltage VMC.

From the result of the internal data read operation, the data recovery controller 19 recovers 4-bit data at the "0" level, the "4" level, the "8" level, and the "C" level.

Figure 8:
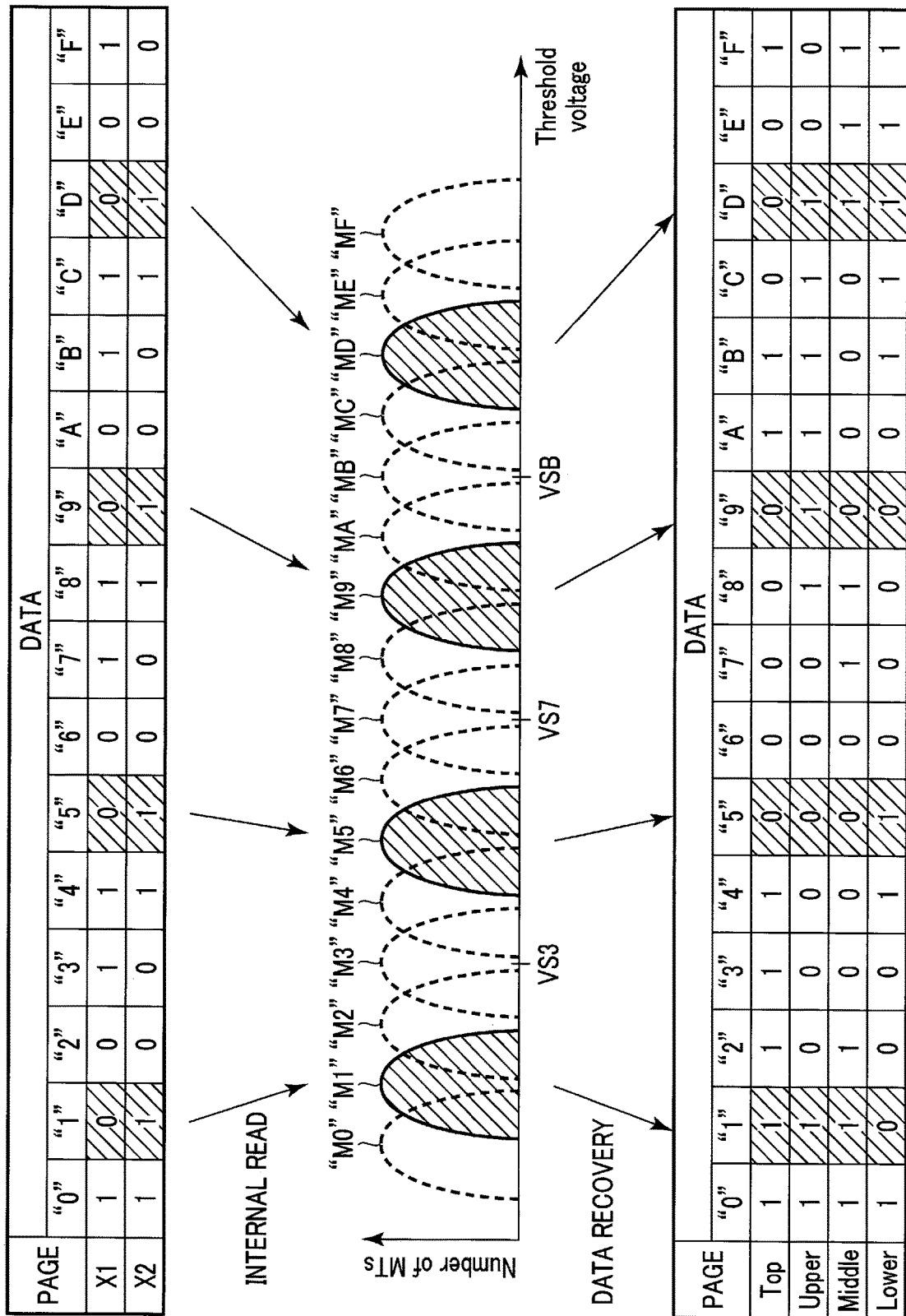
FIG. 8 is a diagram showing a case of recovering the 4-bit data from the 2-bit data corresponding to a "1" level, a "5" level, a "9" level, and a "D" level and the internal read data in the memory system according to the first embodiment.

As shown in FIG. 8, the "01" (X1 bit/X2 bit) data corresponds to any of the "1" level, the "5" level, the "9" level, and the "D" level. In the memory cell transistor MT after the first write operation, the threshold distributions corresponding to the "1" level, the "5" level, the "9" level, and the "D" level are respectively the "M1" level, the "M5" level, the "M9" level, and the "MD" level. In order to distinguish these four levels, the sequencer 14 performs the internal data read operation between the "M1" level, the "M5" level, the "M9" level, and the "MD" level.

More specifically, for example, the sequencer 14 performs the internal data read operation three times using the read voltages VS3, VS7, and VSB. The voltage VS3 is higher than the threshold distribution at the "M1" level and lower than the threshold distribution at the "M5" level, that is, higher than the voltage V2 and lower than the voltage VM5. The voltage VS7 is higher than the threshold distribution at the "M5" level and lower than the threshold distribution at the "M9" level, that is, higher than the voltage V6 and lower than the voltage VM9. The voltage VSB is higher than the threshold distribution at the "M9" level and lower than the threshold distribution at the "MD" level, that is, higher than the voltage VA and lower than the voltage VMD.

From the result of the internal data read operation, the data recovery controller 19 recovers 4-bit data at the "1" level, the "5" level, the "9" level, and the "D" level.

Figure 9:
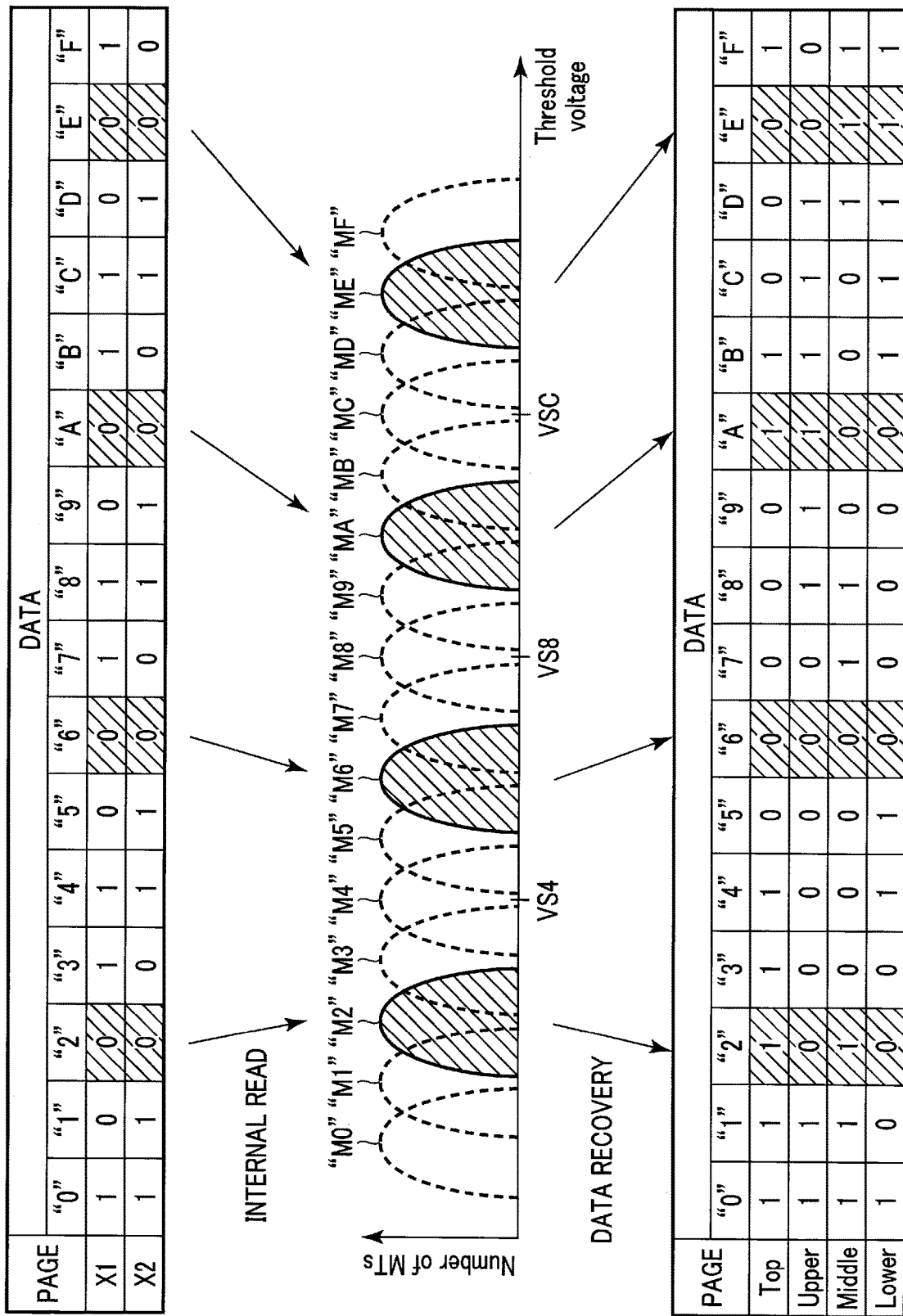
FIG. 9 is a diagram showing a case of recovering the 4-bit data from the 2-bit data corresponding to a "2" level, a "6" level, an "A" level, and an "E" level and the internal read data in the memory system according to the first embodiment.

As shown in FIG. 9, the "00" (X1 bit/X2 bit) data corresponds to any of the "2" level, the "6" level, the "A" level, and the "E" level. In the memory cell transistor MT after the first write operation, the threshold distributions corresponding to the "2" level, the "6" level, the "A" level, and the "E" level are respectively the "M2" level, the "M6" level, the "MA" level, and the "ME" level. In order to distinguish these four levels, the sequencer 14 performs the internal data read operation between the "M2" level, the "M6" level, the "MA" level, and the "ME" level.

More specifically, for example, the sequencer 14 performs the internal data read operation three times using the read voltages VS4, VS8, and VSC. The voltage VS4 is higher than the threshold distribution at the "M2" level and lower than the threshold distribution at the "M6" level, that is, higher than the voltage V3 and lower than the voltage VM6. The voltage VS8 is higher than the threshold distribution at the "M6" level and lower than the threshold distribution at the "MA" level, that is, higher than the voltage V7 and lower than the voltage VMA. The voltage VSC is higher than the threshold distribution at the "MA" level and lower than the threshold distribution at the "ME" level, that is, higher than the voltage VB and lower than the voltage VME.

From the result of the internal data read operation, the data recovery controller 19 recovers 4-bit data at the "2" level, the "6" level, the "A" level, and the "E" level.

As shown in FIG. 10, the "10" (X1 bit/X2 bit) data corresponds to any of the "3" level, the "7" level, the "B" level, and the "F" level. In the memory cell transistor MT after the first write operation, the threshold distributions corresponding to the "3" level, the "7" level, the "B" level, and the "F" level are respectively the "M3" level, the "M7" level, the "MB" level, and the "MF" level. In order to distinguish these four levels, the sequencer 14 performs the internal data read operation between the "M3" level, the "M7" level, the "MB" level, and the "MF" level.

More specifically, for example, the sequencer 14 performs the internal data read operation three times using the read voltages VS5, VS9, and VSD. The voltage VS5 is higher than the threshold distribution at the "M3" level and lower than the threshold distribution at the "M7" level, that is, higher than the voltage V4 and lower than the voltage VM7. The voltage VS9 is higher than the threshold distribution at the "M7" level and lower than the threshold distribution at the "MB" level, that is, higher than the voltage V8 and lower than the voltage VMB. The voltage VSD is higher than the threshold distribution at the "MB" level and lower than the threshold distribution at the "MF" level, that is, higher than the voltage VC and lower than the voltage VMF.

From the result of the internal data read operation, the data recovery controller 19 recovers 4-bit data at the "3" level, the "7" level, the "B" level, and the "F" level.

In the example of FIGS. 7 to 10, the internal data read operation is executed three times, that is, a total of 12 times for each of the "11" data, the "01" data, the "00" data, and the "10" data. However, for example, some of the read voltages VS2 to VSD may be set to the same voltage value to reduce the number of times of reading internal data. For example, the voltage VS2 and the voltage VS3 are set to the same voltage VS23. The voltage VS23 is higher than the voltage V2 and lower than the voltage VM4. As a result, distinction of the "M0" level in the "11" data and distinction of the "M1" level in the "01" data may be performed at the same time. The same applies to other read voltages.

1.3.4 Overall Flow of Write Operation

Next, the overall flow of the write operation will be described using FIG. 11. The example of FIG. 11 shows the write operation performed on the memory cell group MCG, and the write operation performed on the other memory cell groups MCG is omitted.

As shown in FIG. 11, the host apparatus 30 transmits a write request corresponding to four pages to the controller 20 (step S10).

When the CPU 23 receives the write request from the host apparatus 30, the CPU 23 transmits a first write operation command including 4-page (top page/upper page/middle page/lower page) data to the memory 10 (step S11).

The sequencer 14 executes the first write operation based on a command from the controller 20 (step S12).

After the 4-page data is transmitted to the memory 10, the data conversion circuit 27 converts the 4-page data into 2-page (X1 page/X2 page) data (step S13) and stores the 2-page data in the page cluster CL in the RAM 22. More specifically, for example, the X1 page data is stored in the region PG0 of the page cluster CL0, and the X2 page data is stored in the region PG1 of the page cluster CL0.

After the data conversion, the CPU 23 transmits a second write operation command including 2-page (X1 page/X2 page) data to the memory 10 (step S14). After the data conversion, step S14 may be executed after the first write operation is executed for another memory cell group MCG (not shown).

The sequencer 14 executes the internal data read operation based on a command from the controller 20 (step S15).

The data recovery controller 19 recovers the 4-page (top page/upper page/middle page/lower page) data from the 2-page data and the read data (step S16).

The sequencer 14 executes the second write operation using the recovered 4-bit data (step S17).

1.3.5 Command Sequence

Next, a command sequence transmitted from the controller 20 to the semiconductor memory device will be described.

1.3.5.1 Command Sequence in First Write Operation

First, a command sequence in the first write operation will be described using FIG. 12. FIG. 12 shows the input/output signal I/O and the ready/busy signal RBn input to the memory 10. The command CMD input to the memory 10 is stored in the command register 12, the address ADD is stored in the address register 13, and the data DAT is stored in the data register 17. In the following description, a combination of commands corresponding to the first write operation is referred to as a "first command set".

As shown in FIG. 12, first, the CPU 23 issues a command "0Dh" and transmits the command "0Dh" to the memory 10. The command "0Dh" is a command for recognizing the first write operation.

Next, the CPU 23 issues a command "80h" and transmits the command "80h" to the memory 10. The command "80h" is a command providing notification of the write operation.

Next, the CPU 23 transmits an address "ADD_L" of the lower page and data "DAT-L" to the memory 10 in succession. The sequencer 14 holds the received data "DAT_L" in the latch circuit of the data register 17.

Next, the CPU 23 issues a command "1Ah" and transmits the command "1Ah" to the memory 10. When the command "1Ah" is stored in the command register 12, the sequencer 14 sets the ready/busy signal RBn to "L" level and transfers the data "DAT_L" held in the data register 17 to the sense amplifier 18. When the transfer of the data "DAT_L" to the sense amplifier 18 is completed, the sequencer 14 sets the ready/busy signal RBn to "H" level.

Upon receiving the ready/busy signal RBn at the "H" level, the CPU 23 sequentially transmits the command "80h", an address "ADD_M" of the middle page, data "DAT_M", and the command "1Ah" to the memory 10. When the command "1Ah" is stored in the command register 12, the sequencer 14 sets the ready/busy signal RBn to the "L" level and transfers the data "DAT_M" held in the data register 17 to the sense amplifier 18. When the transfer of the data "DAT_M" to the sense amplifier 18 is completed, the sequencer 14 sets the ready/busy signal RBn to "H" level.

Upon receiving the ready/busy signal RBn at the "H" level, the CPU 23 sequentially transmits the command "80h", an address "ADD_U" of the upper page, data "DAT_U", and the command "1Ah" to the memory 10. When the command "1Ah" is stored in the command register 12, the sequencer 14 sets the ready/busy signal RBn to the "L" level and transfers the data "DAT_U" held in the data register 17 to the sense amplifier 18. When the transfer of the data "DAT_U" to the sense amplifier 18 is completed, the sequencer 14 sets the ready/busy signal RBn to "H" level.

Upon receiving the ready/busy signal RBn at the "H" level, the CPU 23 sequentially transmits the command "80h", an address "ADD_T" of the top page, data "DAT_T", and a command "10h" to the memory 10. The command "10h" is a command instructing execution of the write operation.

When the command "10h" is stored in the command register 12, the sequencer 14 sets the ready/busy signal RBn to the "L" level and transfers the data "DAT_T" held in the data register 17 to the sense amplifier 18. Then, the sequencer 14 executes the first write operation based on the data "DAT_L", "DAT_M", "DAT_U", and "DAT_T" stored in the sense amplifier 18.

The order in which the lower page data, the middle page data, the upper page data, and the top page data are transmitted from the controller 20 to the memory 10 can be arbitrarily set. For example, the controller 20 may first transmit the top page data to the memory 10.

1.3.5.2 Command Sequence in Second Write Operation

Next, two examples of a command sequence in the second write operation will be described. In the following description, a combination of commands corresponding to the second write operation is referred to as a "second command set".

1.3.5.2.1 Command Sequence of First Example

Next, a command sequence of a first example in the second write operation will be described using FIG. 13.

As shown in FIG. 13, first, the CPU 23 issues a command "XXh" and transmits the command "XXh" to the memory 10. The command "XXh" is a command instructing the memory 10 to recover data and perform the second write operation.

Next, the CPU 23 sequentially transmits the command "80h", an address "ADD_X1" of the X1 page, data "DAT_X1", and the command "1Ah" to the memory 10. When the command "1Ah" is stored in the command register 12, the sequencer 14 sets the ready/busy signal RBn to the "L" level and transfers the data "DAT_X1" held in the data register 17 to the sense amplifier 18. When the transfer of the data "DAT_X1" to the sense amplifier 18 is completed, the sequencer 14 sets the ready/busy signal RBn to "H" level.

Next, upon receiving the ready/busy signal RBn at the "H" level, the CPU 23 sequentially transmits the command "80h", an address "ADD_X2" of the X2 page, data "DAT_X2", and the command "10h" to the memory 10.

When the command "10h" is stored in the command register 12, the sequencer 14 sets the ready/busy signal RBn to the "L" level and transfers the data "DAT_X2" held in the data register 17 to the sense amplifier 18. Thereafter, the sequencer 14 executes the internal data read operation. Next, the data recovery controller 19 recovers the 4-page data from the X1 page data, the X2 page data, and the read data and transfers them to the sense amplifier 18. Next, the sequencer 14 executes the second write operation based on the 4-page data stored in the sense amplifier 18.

The order in which the X1 page data and the X2 page data are transmitted from the controller 20 to the memory 10 can be arbitrarily set.

1.3.5.2.2 Command Sequence of Second Example

Next, a command sequence of a second example in the second write operation will be described using FIG. 14.

Figure 14:
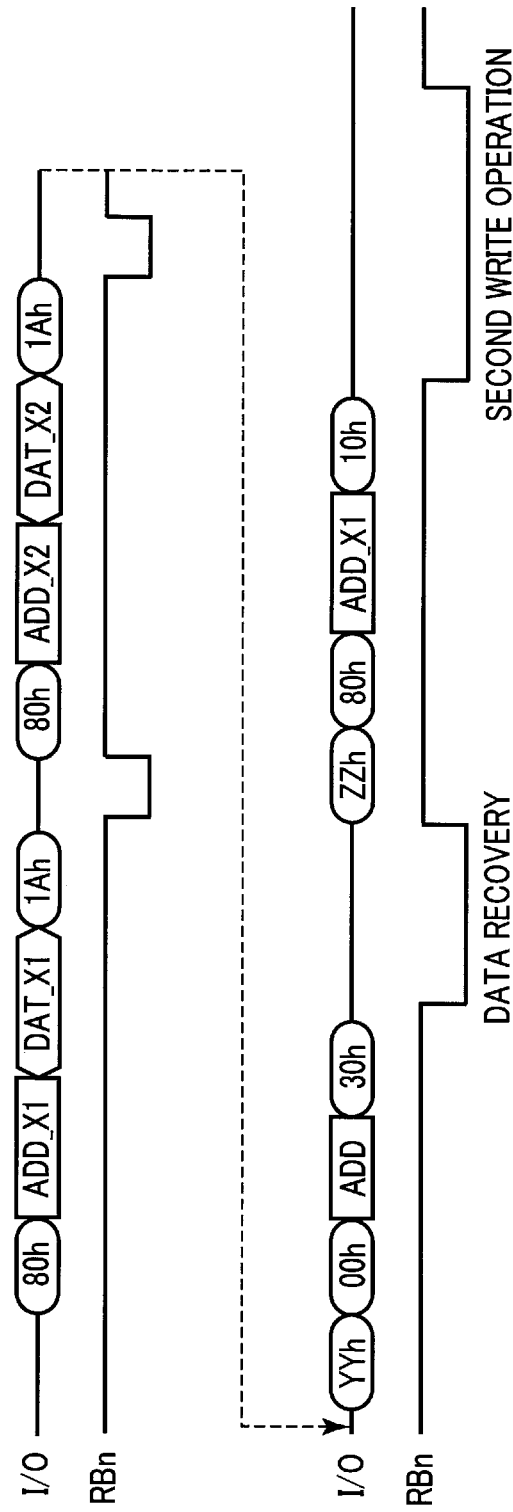
FIG. 14 is a diagram showing a command sequence of the second write operation of a second example in the memory system according to the first embodiment.

As shown in FIG. 14, the CPU 23 sequentially transmits the command "80h", the address "ADD_X1", the data "DAT_X1", and the command "1Ah" to the memory 10. When the command "1Ah" is stored in the command register 12, the sequencer 14 sets the ready/busy signal RBn to the "L" level and transfers the data "DAT_X1" held in the data register 17 to the sense amplifier 18. When the transfer of the data "DAT_X1" to the sense amplifier 18 is completed, the sequencer 14 sets the ready/busy signal RBn to "H" level.

Next, upon receiving the ready/busy signal RBn at the "H" level, the CPU 23 sequentially transmits the command "80h", the address "ADD_X2", the data "DAT_X2", and the command "1Ah" to the memory 10. When the command "1Ah" is stored in the command register 12, the sequencer 14 sets the ready/busy signal RBn to the "L" level and transfers the data "DAT_X2" held in the data register 17 to the sense amplifier 18. When the transfer of the data "DAT_X2" to the sense amplifier 18 is completed, the sequencer 14 sets the ready/busy signal RBn to "H" level.

Next, upon receiving the ready/busy signal RBn at the "H" level, the CPU 23 sequentially transmits a command "YYh", a command "00h", an address "ADD", and a command "30h" to the memory 10. The command "YYh" is a command for recognizing the internal data read operation and data recover operation. The command "00h" is a command providing notification of the read operation. The command "30h" is a command giving an instruction on execution of the read operation. When the command "30h" is stored in the command register 12, the sequencer 14 sets the ready/busy signal RBn to the "L" level, executes the internal data read operation and the data recovery operation using the data recovery controller 19, and stores recovered 4-bit data in the sense amplifier 18. When the store of the recovered 4-bit data to the sense amplifier 18 is completed, the sequencer 14 sets the ready/busy signal RBn to "H" level.

Next, upon receiving the ready/busy signal RBn at the "H" level, the CPU 23 sequentially transmits a command "ZZh", the command "80h", the address "ADD_X1", and the command "10h" to the memory 10. The command "ZZh" is a command for recognizing the second write operation using the 4-bit data stored in the sense amplifier 18. Accordingly, in this case, data transfer from the controller 20 to the memory 10 is unnecessary. When the command "10h" is stored in the command register 12, the sequencer 14 executes the second write operation by using the 4-bit data stored in the sense amplifier 18.

The order in which the X1 page data and the X2 page data are transmitted from the controller 20 to the memory 10 can be arbitrarily set.

1.3.6 Data Write Sequence

Next, the data write sequence will be described using FIG. 15. FIG. 15 shows a selection order of the string units SU in the block BLK. A solid rectangular frame partitioned into two upper and lower sections with a broken line shows the memory cell group MCG. The upper section of the rectangular frame shows the second write operation (reference symbol "WRT2"), and the lower section of the rectangular frame shows the first write operation (reference symbol "WRT1").

As shown in FIG. 15, first, the sequencer 14 executes the first write operation in which, as the zeroth to third operations, the word line WL0 is selected and the string units SU0 to SU3 are sequentially selected.

Next, the sequencer 14 executes, as the fourth to seventh operations, the first write operation in which the word line WL1 is selected and the string units SU0 to SU3 are sequentially selected.

Next, the sequencer 14 executes the second write operation in which, as the eighth to eleventh operations, the word line WL0 is selected and the string units SU0 to SU3 are sequentially selected.

Next, the sequencer 14 executes the first write operation in which, as the twelfth to fifteenth operations, the word line WL2 is selected and the string units SU0 to SU3 are sequentially selected.

Next, the sequencer 14 executes the second write operation in which, as the sixteenth to nineteenth operations, the word line WL1 is selected and the string units SU0 to SU3 are sequentially selected.

That is, the sequencer 14 executes the first write operation in which a word line WL(j+1) and the string units SU0 to SU3 are sequentially selected, and then executes the second write operation in which the word line WLj and the string units SU0 to SU3 are sequentially selected. Next, the sequencer 14 selects a word line WLj+2 and repeats the same operation.

The sequencer 14 executes the first write operation in which, as the 756th to 759th operations, the word line WL95 is selected and the string units SU0 to SU3 are sequentially selected. Next, the sequencer 14 executes the second write operation in which, as the 760th to 763rd operations, the word line WL94 is selected and the string units SU0 to SU3 are sequentially selected and the second write operation in which, as the 764th to 767th operations, the word line WL95 is selected and the string units SU0 to SU3 are sequentially selected and completes the write operation in the block BLK.

The sequencer 14 executes the write operation in the above order based on the address ADD and the data DAT transmitted from the controller 20.

In the case of executing the write operation in the above write sequence, the RAM 22 is provided with eight or more page clusters CL. For example, when the second write operation (the eighth write operation) is executed for the memory cell group MCG corresponding to the word line WL0 and the string unit SU0, the eight page clusters CL are used in order to store, in the RAM 22, 2-page data corresponding to each of the eight memory cell groups MCG executing the zeroth to the seventh write operations (the first write operation).

1.3.7 Detailed Flow of Write Operation Indicating Data Write Sequence

Next, a detailed flow of the write operation indicating the data write sequence will be described using FIGS. 16 and 17. In the following description, in order to simplify the description, a variable j is used for the number of the word line WL, and a variable i is used for the number of the string unit SU. The variables i and j are held by a counter of the controller 20, for example, and incremented by control from the controller 20. The sequencer 14 executes the write operation based on the address ADD and the data DAT received from the controller 20.

As shown in FIG. 16, first, when the write operation is executed for the block BLK, the CPU 23 selects j=0, that is, the word line WL0 (step S100) and further selects i=0, that is, the string unit SU0 (step S101). Then, the CPU 23 transmits the first command set to the memory 10.

The sequencer 14 selects the word line WL0 and the string unit SU0 based on the first command set and executes the first write operation (step S102).

Next, after the completion of the first write operation, the CPU 23 confirms whether the variable i of the string unit SUi is i=3 (step S103).

When i=3 is negated (step S103_No), the CPU 23 increments the variable i to i=i+1 (step S104) and transmits the first command set to the memory 10. Returning to step S102, the sequencer 14 executes the first write operation.

When i=3 is affirmed (step S103_Yes), the CPU 23 confirms whether the variable j of the word line WLj is j=0 (step S105).

When j=0 is affirmed (step S105_Yes), the CPU 23 increments the variable j to j=j+1 (step S106). Then, the CPU 23 returns to step S101, selects the variable i=0, and transmits the first command set to the memory 10.

When j=0 is negated (step S105_No), the CPU 23 sets the variable j to j=j−1 and sets the variable i to i=0 (step S107). Then, the CPU 23 transmits the second command set to the memory 10.

The sequencer 14 first executes the internal data read operation based on the second command set (step S108).

The data recovery controller 19 recovers 4-page data based on 2-page data of the second command set and the read data (step S109).

The sequencer 14 executes the second write operation using the recovered 4-page data (step S110).

Next, after the completion of the second write operation, the CPU 23 confirms whether the variable i of the string unit SUi is i=3 (step S111).

When i=3 is negated (step S111_No), the CPU 23 increments the variable i to i=i+1 (step S112) and transmits the second command set to the memory 10. Returning to step S108, the sequencer 14 executes the internal data read operation.

When i=3 is affirmed (step S111_Yes), the CPU 23 confirms whether the variable j of the word line WLj is j=94 (step S113).

Figure 17:
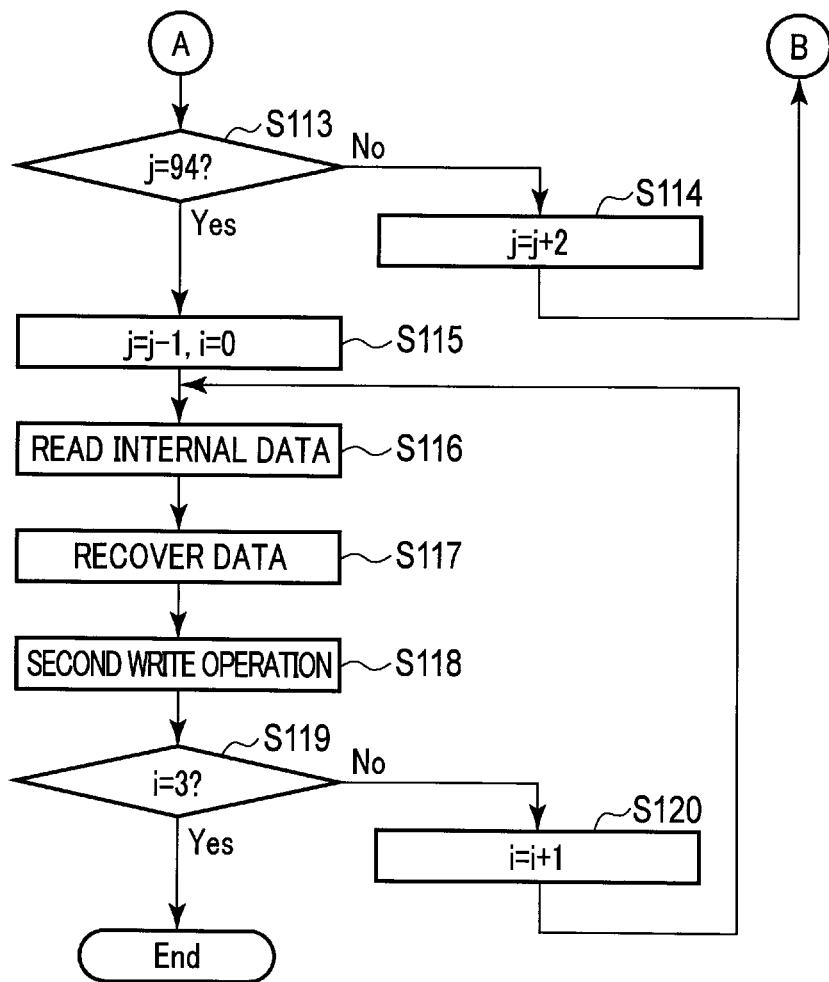
FIG. 17 is a flowchart of the write operation showing the data write sequence in the memory system according to the first embodiment.

As shown in FIG. 17, when j=94 is negated (step S113_No), the CPU 23 increments the variable j to j=j+2 (step S114). Then, the CPU 23 returns to step S101, selects the variable i=0, and transmits the first command set to the memory 10.

When j=94 is affirmed (step S113_Yes), the CPU 23 sets the variable j to j=j+1 and sets the variable i to i=0 (step S115). Then, the CPU 23 transmits the second command set to the memory 10.

The sequencer 14 first executes the internal data read operation based on the second command set (step S116).

The data recovery controller 19 recovers 4-page data based on 2-page data of the second command set and the read data (step S117).

The sequencer 14 executes the second write operation using the recovered 4-page data (step S118).

Next, after the completion of the second write operation, the CPU 23 confirms whether the variable i of the string unit SUi is i=3 (step S119).

When i=3 is negated (step S119_No), the CPU 23 increments the variable i to i=i+1 (step S120) and transmits the second command set to the memory 10. Returning to step S116, the sequencer 14 executes the internal data read operation.

When i=3 is affirmed (step S119_Yes), the CPU 23 completes the write operation in the block BLK.

1.4 Effects According to the Present Embodiment

With a configuration according to the present embodiment, it is possible to suppress an increase in chip area. The effects will be described in detail.

For example, the threshold voltage of the data-written memory cell transistor MT may fluctuate due to the write operation to the adjacent memory cell transistor MT, a disturb during the write operation to the other string units SU, or the like. Thus, the write operation of 4-page data to the memory cell group MCG may be executed in two steps including the first write operation and the second write operation. In this case, it is necessary to hold 4-page data of the memory cell groups MCG subjected to the first write operation in the RAM of the controller according to the selection order of the memory cell group MCG. For example, in a case where the first write operation is executed for the four memory cell groups MCG corresponding to the word line WLj and the string units SU0 to SU3 and the four memory cell groups MCG corresponding to the word line WL(j+1) and the string units SU0 to SU3, and then the second write operation is executed for the memory cell group MCG corresponding to the word line WLj and the string unit SU0, it is necessary to store, in the RAM, 4-page data of the eight memory cell groups MCG, that is, data corresponding to 32 pages. For example, when there are eight string units SU, the RAM requires a storage capacity for storing data corresponding to 64 pages. As described above, when the storage capacity of the RAM is increased according to the number of the string units SU, the selection order of the memory cell group MCG, and the like, the chip area tends to increase.

On the other hand, with the configuration according to the present embodiment, the memory system 1 includes the data conversion circuit 27 in the controller 20 and the data recovery controller 19 in the memory 10. As a result, the memory system 1 can convert 4-page (bit) data after the first write operation into 2-page (bit) data. In addition, the memory system 1 recovers the 4-page data with the converted 2-page data and data after the first write operation read from the memory cell group MCG and can execute the second write operation. Consequently, the amount of data stored in the RAM 22 corresponding to the memory cell group MCG can be reduced from 4 pages to 2 pages. For example, the storage capacity of the RAM necessary for the eight memory cell groups MCG can be reduced from 32 pages to 16 pages. Thus, an increase in the chip area of the memory system 1 can be suppressed. Accordingly, an increase in manufacturing cost of the memory system 1 can be suppressed.

In addition, in the configuration according to the present embodiment, when the second write operation is executed, it is sufficient to transmit 2-page data from the controller 20 to the memory 10, so that a data transfer amount can be reduced from 4 pages to 2 pages. Accordingly, a data transfer time from the controller 20 to the memory 10 can be reduced.

In addition, with the configuration according to the present embodiment, it is possible to assign data such that the converted 2-bit data becomes the gray code with respect to adjacent threshold distributions of the memory cell transistor MT. Accordingly, even when erroneous reading, erroneous writing, or the like occurs, the fluctuation of 2-bit data can be accommodated in 1 bit, so that data reliability can be improved.

2. Second Embodiment

Next, the second embodiment will be described. In the second embodiment, a case where, when a power supply of a memory system 1 is shut down, 4-page data held by a controller 20 is converted into 2-page data and saved in the memory 10 will be described. Hereinafter, differences from the first embodiment will be mainly described.

2.1 Configuration of RAM

First, a configuration of a RAM 22 will be described using FIG. 18.

Figure 18:
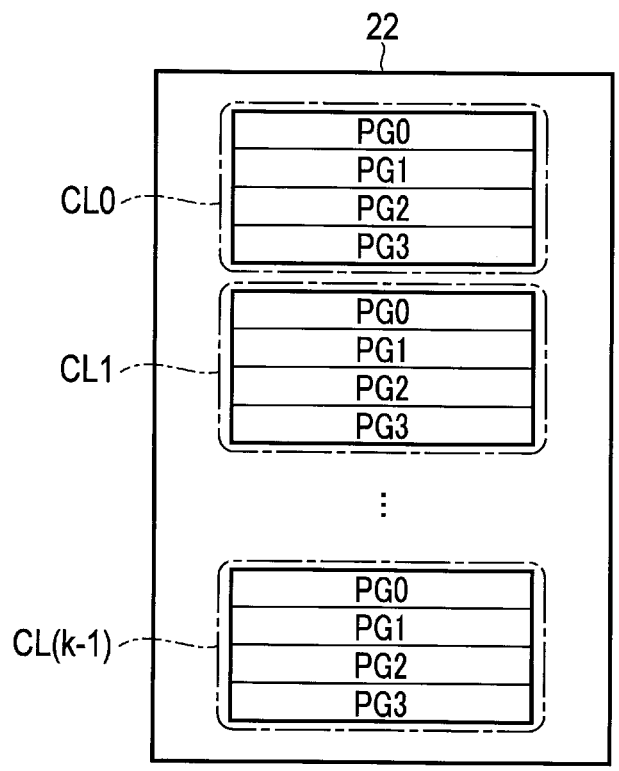
FIG. 18 is a block diagram of a RAM included in a memory system according to a second embodiment.

As shown in FIG. 18, a page cluster CL of the RAM 22 in the present embodiment includes regions PG0 to PG3. Namely, the page clusters CL can each hold 4-page data. In the present embodiment, as in the first embodiment, the case where eight page clusters CL0 to CL7 are provided will be described.

2.2 Write Operation

Next, the write operation will be described. In the present embodiment, the data write operation differs between a normal state and a power shutdown state. In the normal state, the controller 20 does not convert the 4-page data into the 2-page data. That is, even in a second write operation, the 4-page data is transmitted from the controller 20 to the memory 10. When the power supply is shut down, out of the 4-page data stored in the RAM 22, the controller 20 converts the 4-page data, which has been subjected to the first write operation, into 2-page data. Then, the controller 20 saves the data in the controller 20 into, for example, a management area of a memory cell array 11 (the controller 20 writes the data in the management area) by using the electric charge charged in a capacitive element of the memory system 1. The memory cell transistor MT used for saving data in the management area functions as an SLC (single level cell) holding 1-bit (binary) data. In order to shorten write time, the sequencer 14 then executes write operation of 1-bit (binary) data (hereinafter referred to as an SLC write operation). That is, a plurality of pieces of page data are written in different memory cell groups MCG.

2.3 Write Operation in Normal State

The following describes the write operation in the normal state, focusing on differences from the first embodiment.

2.3.1 Overall Flow of Write Operation

The overall flow of the write operation in the normal state will be described using FIG. 19. The example of FIG. 19 shows the write operation performed on the memory cell group MCG, and the write operation performed on the other memory cell groups MCG is omitted.

Figure 19:
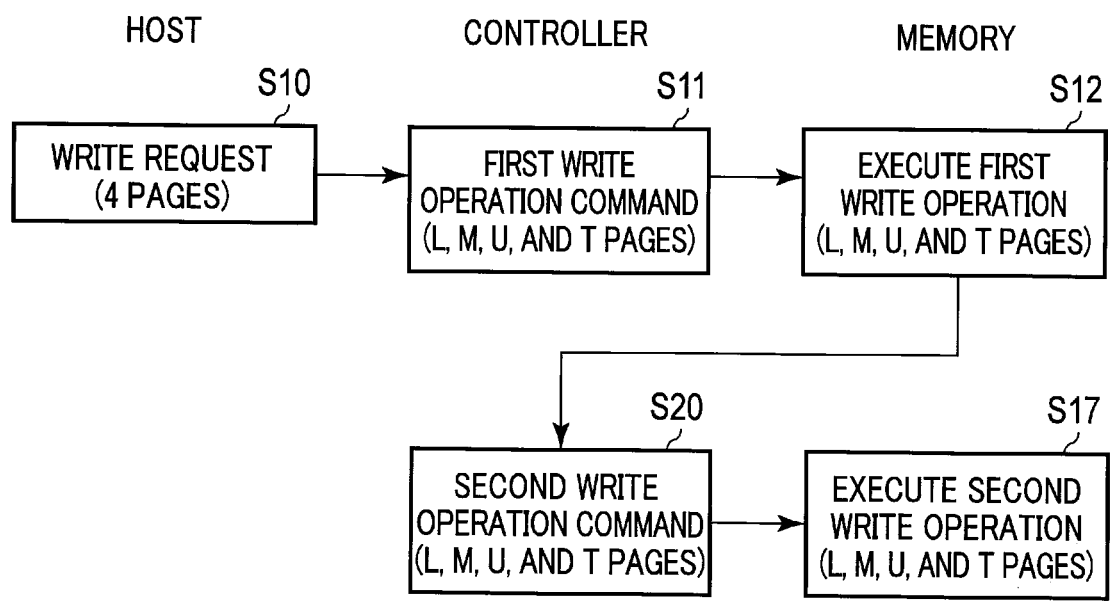
FIG. 19 is a flowchart of a write operation in a normal state in the memory system according to the second embodiment.

As shown in FIG. 19, similarly to steps S10 to S12 described in FIG. 11 of the first embodiment, the first write operation is executed.

The 4-page data is stored in each of the regions PG0 to PG3 in the page cluster CL in the RAM 22. After the first write operation is completed, the CPU 23 transmits a second write operation command including 4-page data to the memory 10 (step S20).

The sequencer 14 executes the second write operation using 4-bit data as in step S17 of FIG. 11.

2.3.2 Command Sequence in Second Write Operation

Next, a command sequence in the second write operation in the normal state will be described using FIG. 20. A command sequence of the first write operation is the same as that of FIG. 12 of the first embodiment.

Figure 20:
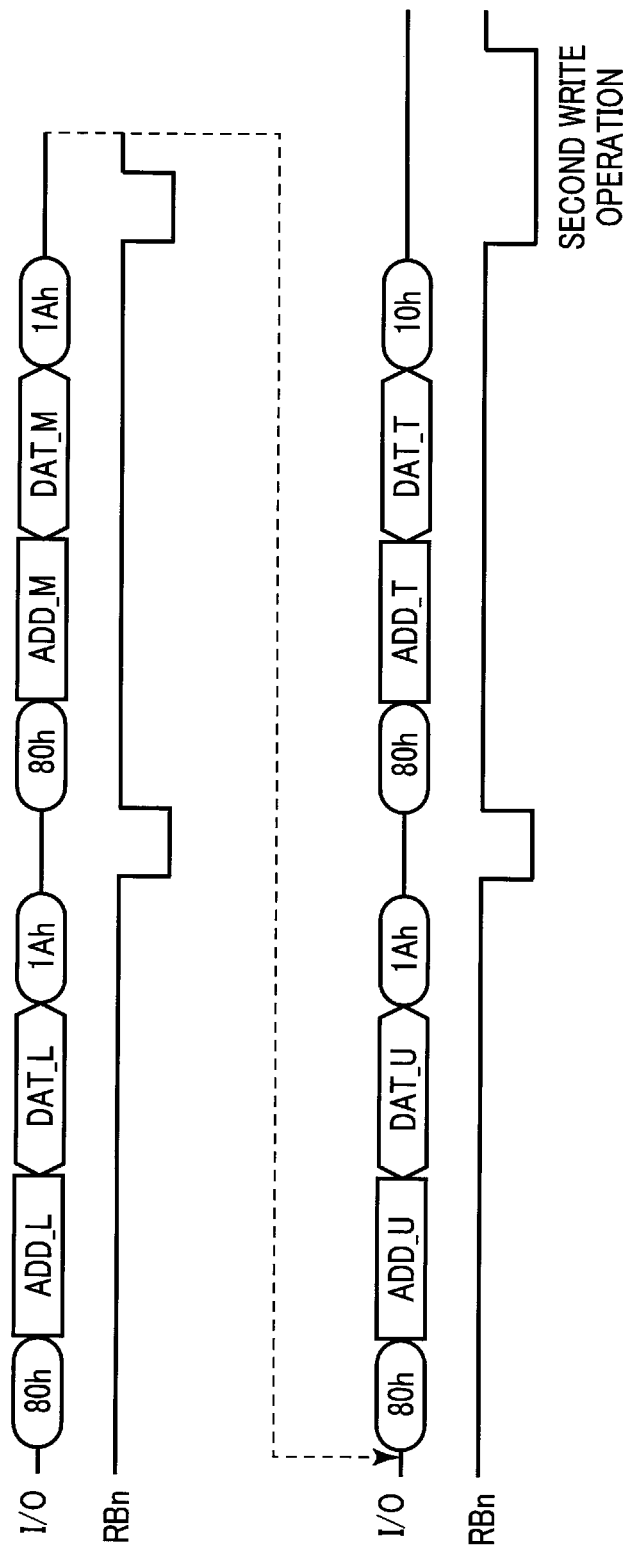
FIG. 20 is a diagram showing a command sequence of a second write operation in the normal state in the memory system according to the second embodiment.

As shown in FIG. 20, first, the CPU 23 sequentially transmits a command "80h", an address ADD_L of a lower page, data DAT_L, and a command "1Ah" to the memory 10. When the command "1Ah" is stored in a command register 12, the sequencer 14 sets a ready/busy signal RBn to "L" level and transfers the data DAT_L held in a data register 17 to a sense amplifier 18. When the transfer of the data "DAT_L" to the sense amplifier 18 is completed, the sequencer 14 sets the ready/busy signal RBn to "H" level.

Next, upon receiving the ready/busy signal RBn at "H" level, the CPU 23 sequentially transmits the command "80h", an address ADD_M of a middle page, data DAT_M, and the command "1Ah" to the memory 10. When the command "1Ah" is stored in the command register 12, the sequencer 14 sets the ready/busy signal RBn to the "L" level and transfers the data DAT_M held in the data register 17 to the sense amplifier 18. When the transfer of the data "DAT_M" to the sense amplifier 18 is completed, the sequencer 14 sets the ready/busy signal RBn to "H" level.

Next, upon receiving the ready/busy signal RBn at the "H" level, the CPU 23 sequentially transmits the command "80h", an address ADD_U of an upper page, data DAT_U, and the command "1Ah" to the memory 10. When the command "1Ah" is stored in the command register 12, the sequencer 14 sets the ready/busy signal RBn to the "L" level and transfers the data DAT_U held in the data register 17 to the sense amplifier 18. When the transfer of the data "DAT_U" to the sense amplifier 18 is completed, the sequencer 14 sets the ready/busy signal RBn to "H" level.

Next, upon receiving the ready/busy signal RBn at the "H" level, the CPU 23 sequentially transmits the command "80h", an address ADD_T of a top page, data DAT_T, and a command "10h" to the memory 10.

When the command "10h" is stored in the command register 12, the sequencer 14 sets the ready/busy signal RBn to the "L" level and transfers the data DAT_T held in the data register 17 to the sense amplifier 18. Then, the sequencer 14 executes the second write operation based on the data DAT_L, DAT_M, DAT_U, and DAT_T stored in the sense amplifier 18.

The order in which the lower page data, the middle page data, the upper page data, and the top page data are transmitted from the controller 20 to the memory 10 can be arbitrarily set.

2.3.3 Detailed Flow of Write Operation Indicating Data Write Sequence

Next, a detailed flow of the write operation indicating the data write sequence will be described using FIGS. 21 and 22.

As shown in FIGS. 21 and 22, the difference from FIGS. 16 and 17 of the first embodiment is that steps S108, S109, S116, and S117 are eliminated. That is, in the present embodiment, after receiving the second command set from the controller 20, the sequencer 14 omits internal data read operation and data recovery operation and executes the second write operation.

2.4 Write Operation in Power Shutdown State

Next, a write operation in the power shutdown state, that is, a data save operation will be described.

2.4.1 Flow at Power Shutdown

First, the flow at power shutdown will be described using FIG. 23.

Figure 23:
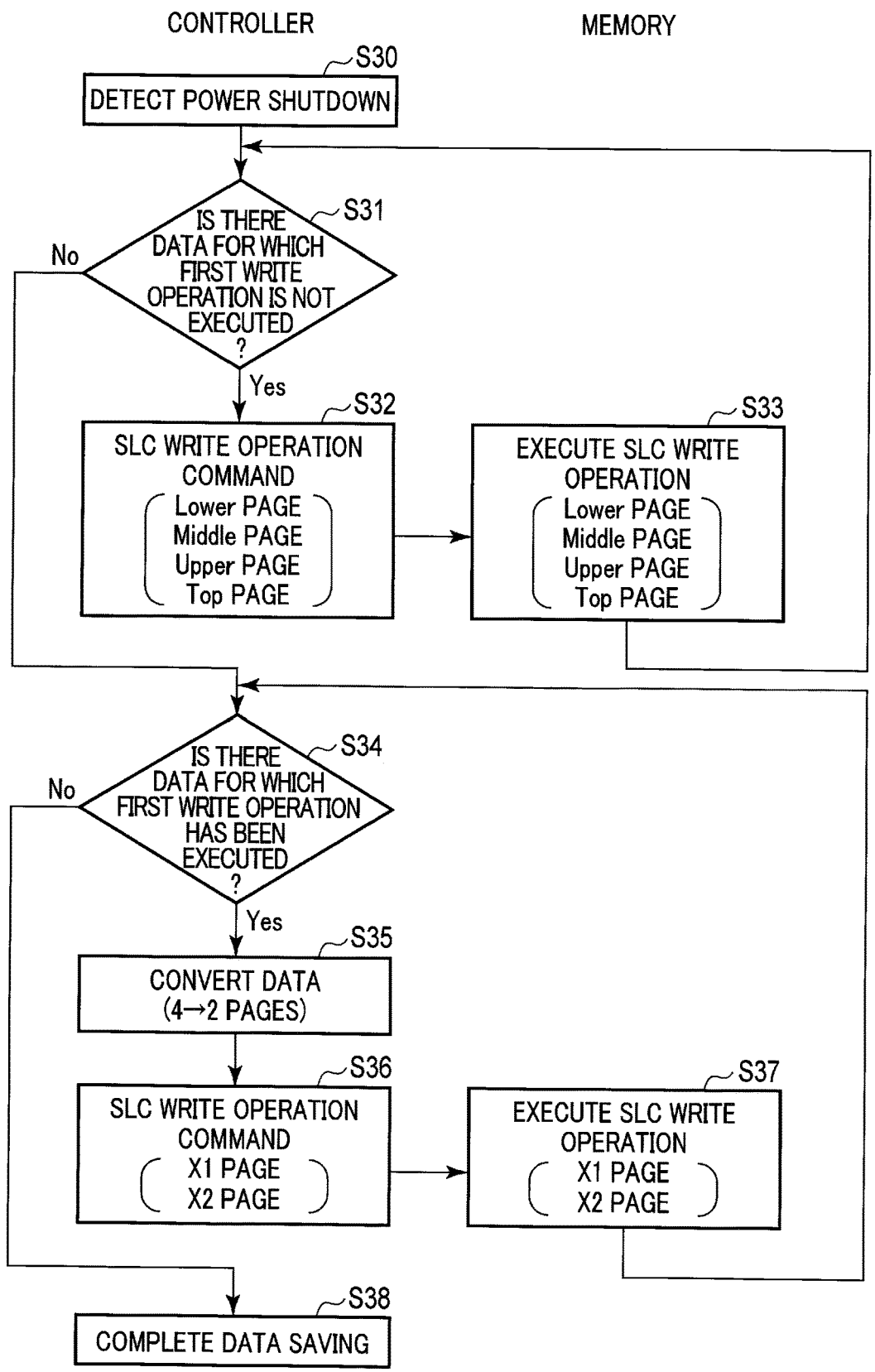
FIG. 23 is a flowchart showing the overall flow at power shutdown in the memory system according to the second embodiment.

As shown in FIG. 23, when the CPU 23 detects power shutdown (step S30), the CPU 23 confirms whether data held in the RAM 22 has data for which the first write operation is not executed in the memory 10 (step S31).

When there is data for which the first write operation is not executed (step S31_Yes), the CPU 23 transmits an SLC write operation command of each of the lower page data, the middle page data, the upper page data, and the top page data to the memory 10 (step S32). The sequencer 14 executes the SLC write operation of each of the lower page data, the middle page data, the upper page data, and the top page data based on an instruction from the controller 20 (step S33). The order in which the lower page data, the middle page data, the upper page data, and the top page data are transmitted from the controller 20 to the memory 10 can be arbitrarily set.

Upon completion of the SLC write operation in step S33, the process returns to step S31, and the CPU 23 confirms again whether there is data for which the first write operation is not executed. The loop of steps S31 to S33 is repeated until there is no more data for which the first write operation is not executed.

When there is no data for which the first write operation is not executed (step S31_No), the CPU 23 confirms whether there is data for which the first write operation has been executed (step S34).

When there is data for which the first write operation has been executed (step S34_Yes), the data conversion circuit 27 converts the 4-page data in the page cluster CL of the RAM 22 into 2-page (X1 page/X2 page) data (step S35).

After the data conversion, the CPU 23 transmits the SLC write operation command of each of the X1 page data and the X2 page data to the memory 10 (step S36). The sequencer 14 executes the SLC write operation of each of the X1 page data and the X2 page data based on an instruction from the controller 20 (step S37). The order in which the X1 page data and the X2 page data are transmitted from the controller 20 to the memory 10 can be arbitrarily set.

Upon completion of the SLC write operation in step S37, the process returns to step S34, and the CPU 23 confirms again whether there is data for which the first write operation has been executed. The loop of steps S34 to S37 is repeated until there is no more data for which the first write operation has been executed.

When there is no data for which the first write operation has been executed (step S34_No), the CPU 23 completes the data saving (step S38).

2.4.2 Command Sequence

Next, a command sequence transmitted from the controller 20 to a semiconductor memory device will be described using FIG. 24. The example in FIG. 24 is a command sequence giving an instruction on the SLC write operation of the X1 page data and the X2 page data. In the following description, a combination of commands corresponding to the SLC write operation is referred to as an "SLC command set". The example in FIG. 24 shows the SLC command set giving an instruction on the SLC write operation of the X1 page data and the SLC command set giving an instruction on the SLC write operation of the X2 page data.

As shown in FIG. 24, first, the CPU 23 issues a command "A2h" and transmits the command "A2h" to the memory 10. The command "A2h" is a command for SLC recognition.

Next, the CPU 23 sequentially transmits the command "80h", an address "ADD_S1" in the management area, data "DAT_X1", and the command "10h" to the memory 10. A combination of the command "80h", the address "ADD_S1", the data "DAT_X1", and the command "10h" is the SLC command set.

When the command "10h" is stored in the command register 12, the sequencer 14 sets the ready/busy signal RBn to the "L" level and transfers the data "DAT_X1" held in the data register 17 to the sense amplifier 18. Then, the sequencer 14 executes the SLC write operation based on the data "DAT_X1" stored in the sense amplifier 18. When the SLC write operation is completed, the sequencer 14 sets the ready/busy signal RBn to "H" level.

Next, upon receiving the ready/busy signal RBn at the "H" level, the CPU 23 sequentially transmits the command "A2h", the command "80h", an address "ADD_S2" in the management area, data "DAT_X2", and the command "10h" to the memory 10. When the command "10h" is stored in the command register 12, the sequencer 14 sets the ready/busy signal RBn to the "L" level and transfers the data "DAT_X2" held in the data register 17 to the sense amplifier 18. Then, the sequencer 14 executes the SLC write operation based on the data "DAT_X2" stored in the sense amplifier 18.

2.5 Flow at Power Recovery

Next, two examples of the flow at power recovery will be described.

2.5.1 Flow at Power Recovery in First Example

First, the flow at power recovery in a first example will be described.

2.5.1.1 Overall Flow at Power Recovery

Figure 25:
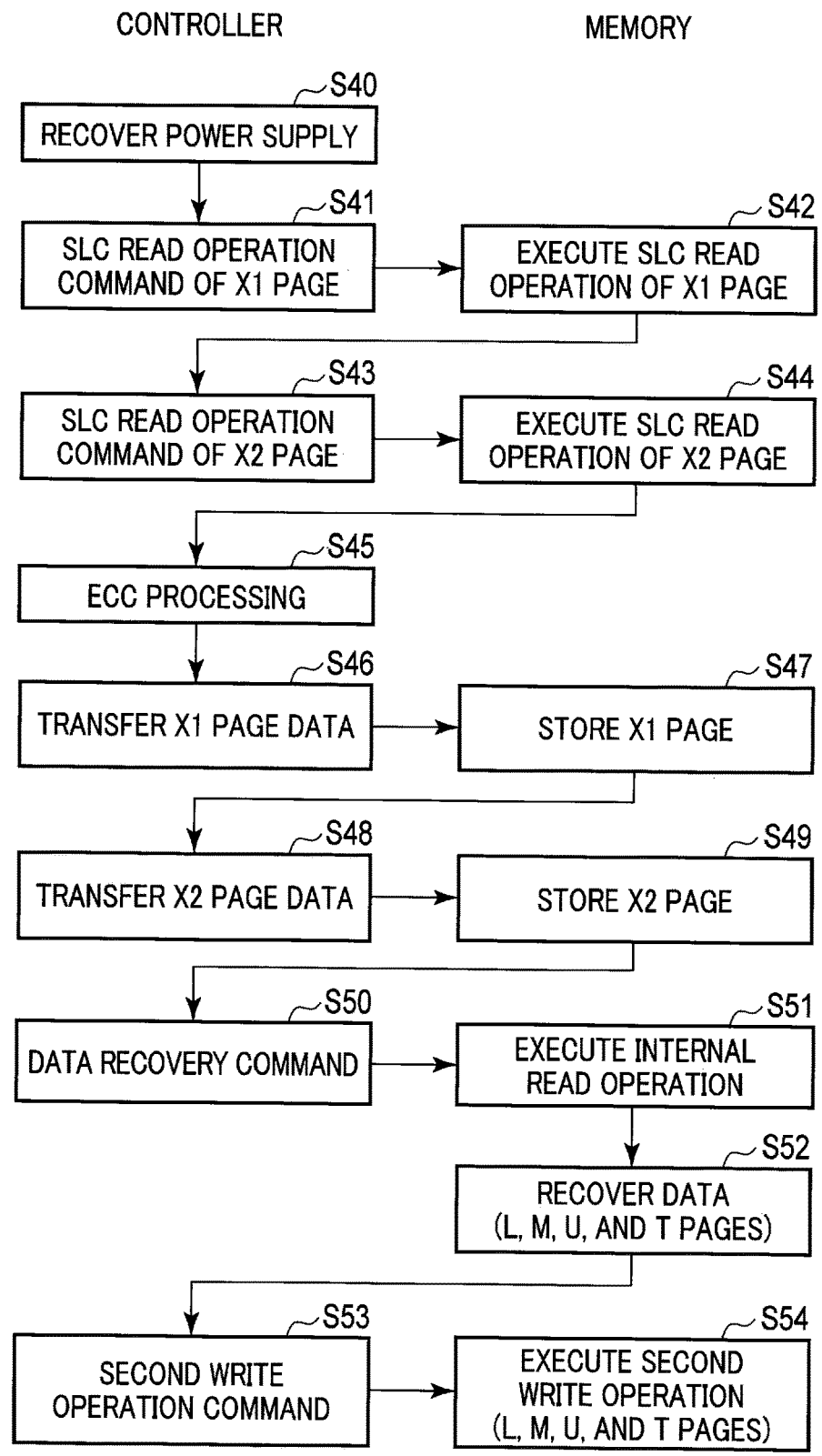
FIG. 25 is a flowchart showing the overall flow at power recovery of a first example in the memory system according to the second embodiment.

The overall flow at power recovery in the first example will be described using FIG. 25. In the example of FIG. 25, there will be described a case where the controller 20 reads the X1 page data and the X2 page data, saved in SLC in the management area of the memory cell array 11, page by page (this read operation is hereinafter referred to as an SLC read operation) and executes the second write operation.

As shown in FIG. 25, when the power supply is recovered (step S40), the CPU 23 first transmits an SLC read operation command of the X1 page data to the memory 10 (step S41). The sequencer 14 executes the SLC read operation of the X1 page data based on a command from the controller 20 (step S42).

After receiving the X1 page data from the memory 10, the CPU 23 transmits the SLC read operation command of the X2 page data to the memory 10 (step S43). The sequencer 14 executes the SLC read operation of the X2 page data based on a command from the controller 20 (step S44).

After receiving the X2 page data from the memory 10, the CPU 23 executes ECC processing of the X1 page data and the X2 page data in an ECC circuit 25 (step S45).

The CPU 23 transfers the X1 page data after the ECC processing to the memory 10 (step S46). The sequencer 14 stores the X1 page data in the sense amplifier 18 (step S47).

The CPU 23 transfers the X2 page data after the ECC processing to the memory 10 (step S48). The sequencer 14 stores the X2 page data in the sense amplifier 18 (step S49).

Upon completion of the transfer of the X2 page data, the CPU 23 transmits a data recovery command to the memory 10 (step S50).

The sequencer 14 executes the internal data read operation based on a command from the controller 20 (step S51). Then, a data recovery controller 19 recovers 4-bit data from 2-bit data and the read data (step S52).

Upon completion of the recovery of the 4-bit data, the CPU 23 transmits the second write operation command to the memory 10 (step S53).

The sequencer 14 executes the second write operation using the recovered 4-bit data based on an instruction from the controller 20 (step S54).

2.5.1.2 Command Sequence

Next, two examples of a command sequence transmitted from the controller 20 to the semiconductor memory device will be described.

2.5.1.2.1 Command Sequence of First Example

First, a command sequence of the first example will be described using FIG. 26.

Figure 26:
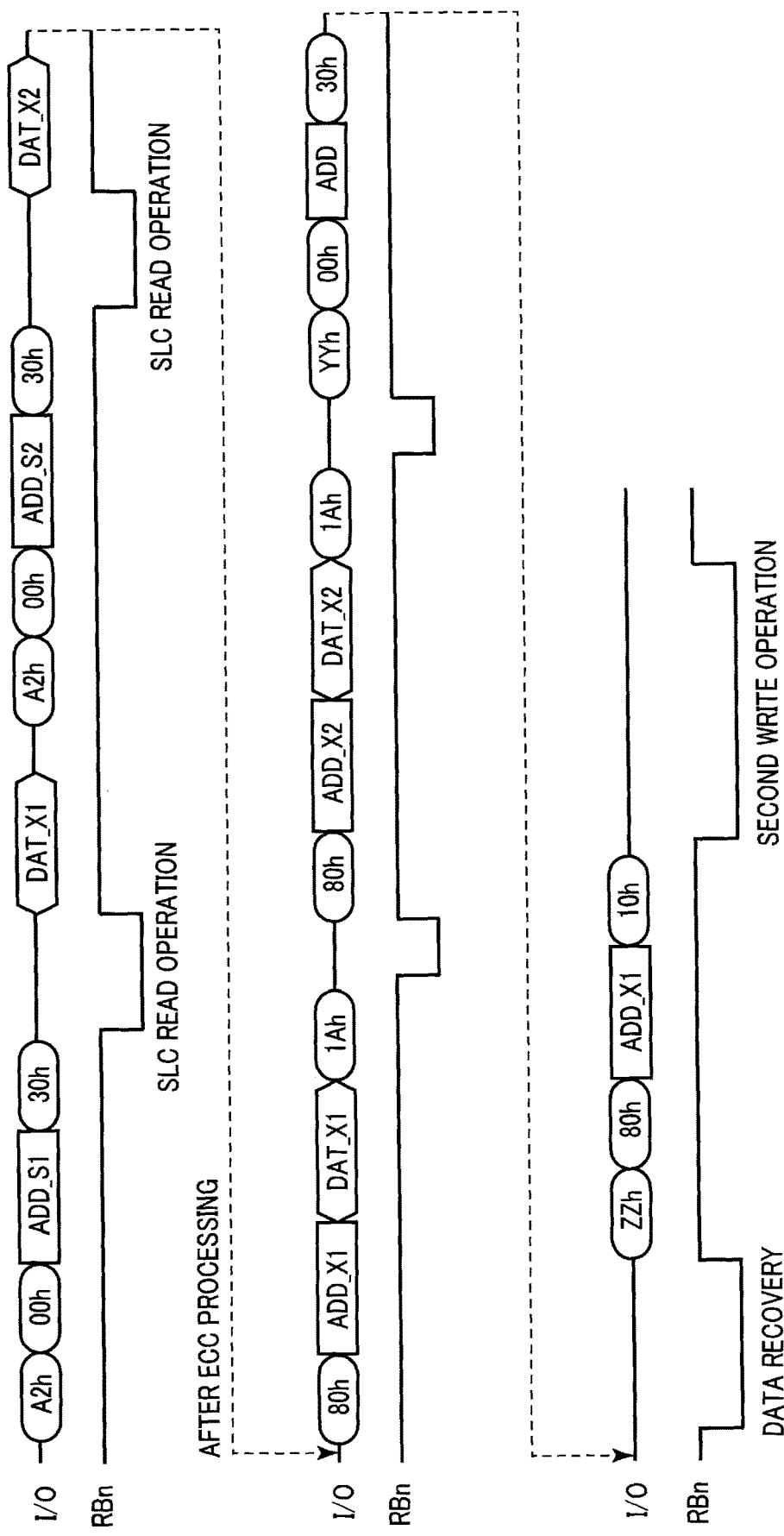
FIG. 26 is a diagram showing a command sequence of an SLC read operation and the second write operation in the first example in the flow at power recovery of the first example in the memory system according to the second embodiment.

As shown in FIG. 26, first, the CPU 23 sequentially transmits the command "A2h", a command "00h", the address "ADD_S1", and a command "30h" to the memory 10. When the command "30h" is stored in the command register 12, the sequencer 14 sets the ready/busy signal RBn to the "L" level, executes the SLC read operation of the X1 page data, and holds the data "DAT_X1" in the data register 17. And then, the sequencer 14 sets the ready/busy signal RBn to "H" level.

Upon receiving the ready/busy signal RBn at the "H" level, the CPU 23 reads the data "DAT_X1" held in the data register 17 from the memory 10.

Upon completion of the SLC read operation of the X1 page data, the CPU 23 sequentially transmits the command "A2h", the command "00h", the address "ADD_S2", and the command "30h" to the memory 10. When the command "30h" is stored in the command register 12, the sequencer 14 sets the ready/busy signal RBn to the "L" level, executes the SLC read operation of the X2 page data, and holds the data "DAT_X2" in the data register 17. And then, the sequencer 14 sets the ready/busy signal RBn to "H" level.

Upon receiving the ready/busy signal RBn at the "H" level, the CPU 23 reads the data "DAT_X2" held in the data register 17 from the memory 10.

Upon completion of the ECC processing of the X1 page data and the X2 page data, the CPU 23 sequentially transmits the command "80h", an address "ADD_X1", the data "DAT_X1", and the command "1Ah" to the memory 10. When the command "1Ah" is stored in the command register 12, the sequencer 14 sets the ready/busy signal RBn to the "L" level and transfers the data "DAT_X1" held in the data register 17 to the sense amplifier 18. And then, the sequencer 14 sets the ready/busy signal RBn to "H" level.

Upon receiving the ready/busy signal RBn at the "H" level, the CPU 23 sequentially transmits the command "80h", an address "ADD_X2", the data "DAT_X2", and the command "1Ah" to the memory 10. When the command "1Ah" is stored in the command register 12, the sequencer 14 sets the ready/busy signal RBn to the "L" level and transfers the data "DAT_X2" held in the data register 17 to the sense amplifier 18. And then, the sequencer 14 sets the ready/busy signal RBn to "H" level.

Upon receiving the ready/busy signal RBn at the "H" level, the CPU 23 sequentially transmits a command "YYh", the command "00h", an address "ADD", and the command "30h" to the memory 10. When the command "30h" is stored in the command register 12, the sequencer 14 sets the ready/busy signal RBn to the "L" level, executes the internal data read operation and the data recovery operation using the data recovery controller 19, and stores recovered 4-bit data in the sense amplifier 18. And then, the sequencer 14 sets the ready/busy signal RBn to "H" level.

Upon receiving the ready/busy signal RBn at the "H" level, the CPU 23 sequentially transmits a command "ZZh", the command "80h", the address "ADD_X1", and the command "10h" to the memory 10. Accordingly, in this case, data transfer from the controller 20 to the memory 10 is unnecessary. When the command "10h" is stored in the command register 12, the sequencer 14 executes the second write operation by using the 4-bit data stored in the sense amplifier 18.

2.5.1.2.2 Command Sequence of Second Example

Next, a command sequence of a second example will be described using FIG. 27.

Figure 27:
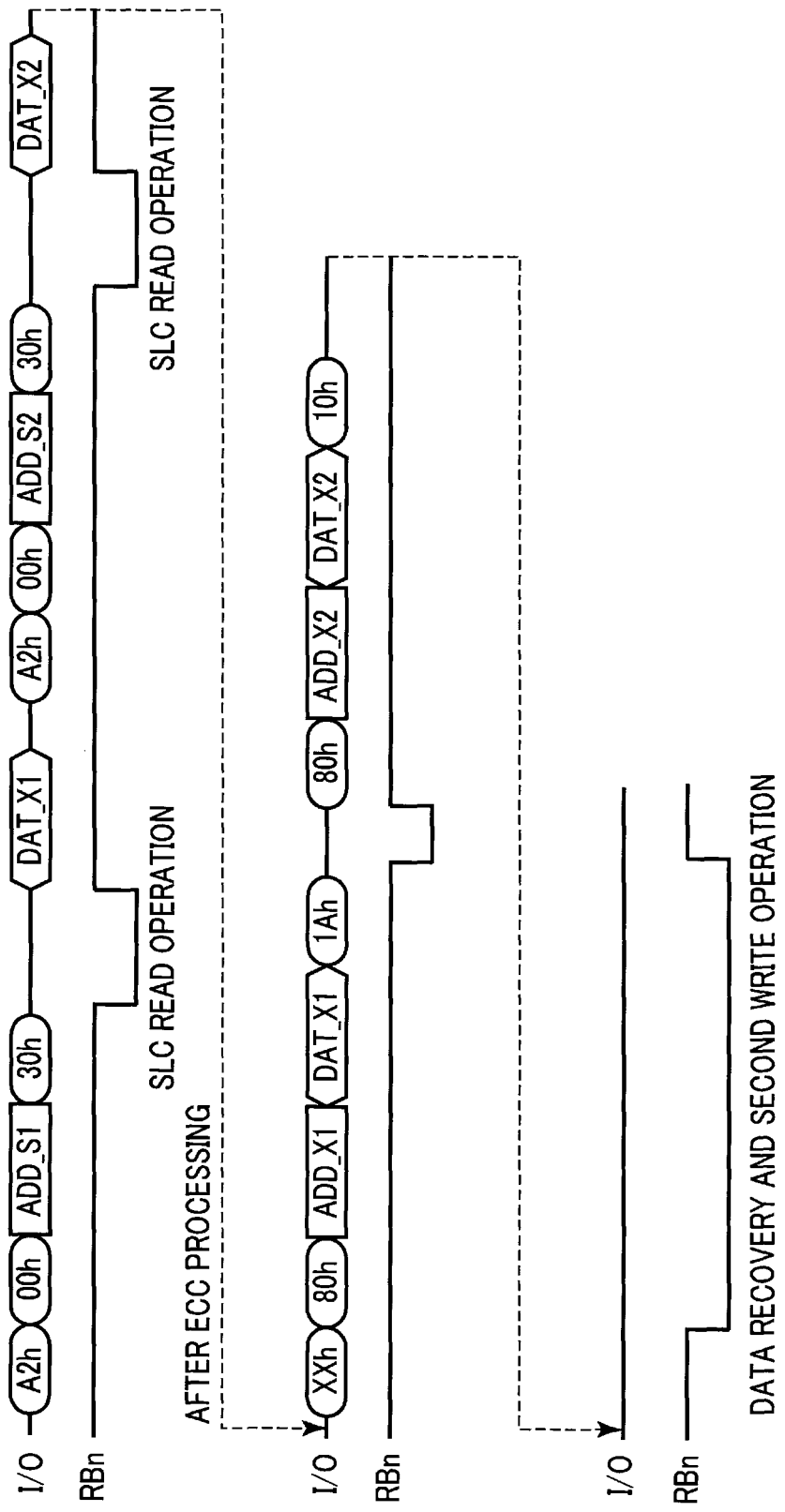
FIG. 27 is a diagram showing a command sequence of an SLC read operation and the second write operation in a second example in the flow at power recovery of the first example in the memory system according to the second embodiment.

As shown in FIG. 27, the processes up to the ECC processing of the X1 page data and the X2 page data in the controller 20 are the same as in FIG. 26 of the first example.

Upon completion of the ECC processing, the CPU 23 sequentially transmits a command "XXh", the command "80h", the address "ADD_X1", the data "DAT_X1", and the command "1Ah" to the memory 10. When the command "1Ah" is stored in the command register 12, the sequencer 14 sets the ready/busy signal RBn to the "L" level and transfers the data "DAT_X1" held in the data register 17 to the sense amplifier 18. And then, the sequencer 14 sets the ready/busy signal RBn to "H" level.

Upon receiving the ready/busy signal RBn at the "H" level, the CPU 23 sequentially transmits the command "80h", the address "ADD_X2", the data "DAT_X2", and the command "10h" to the memory 10.

When the command "10h" is stored in the command register 12, the sequencer 14 sets the ready/busy signal RBn to the "L" level and transfers the data "DAT_X2" held in the data register 17 to the sense amplifier 18. Thereafter, the sequencer 14 executes the internal data read operation. Next, the data recovery controller 19 recovers the 4-page data from the X1 page data, the X2 page data, and the read data and transfers them to the sense amplifier 18. Next, the sequencer 14 executes the second write operation based on the 4-page data stored in the sense amplifier 18.

The order in which the X1 page data and the X2 page data are transmitted from the controller 20 to the memory 10 can be arbitrarily set.

2.5.2 Flow at Power Recovery in Second Example

Next, the overall flow at power recovery in the second example will be described. In the second example, the ECC processing of the X1 page data and the X2 page data in the first example is omitted.

2.5.2.1 Overall Flow at Power Recovery

Figure 28:
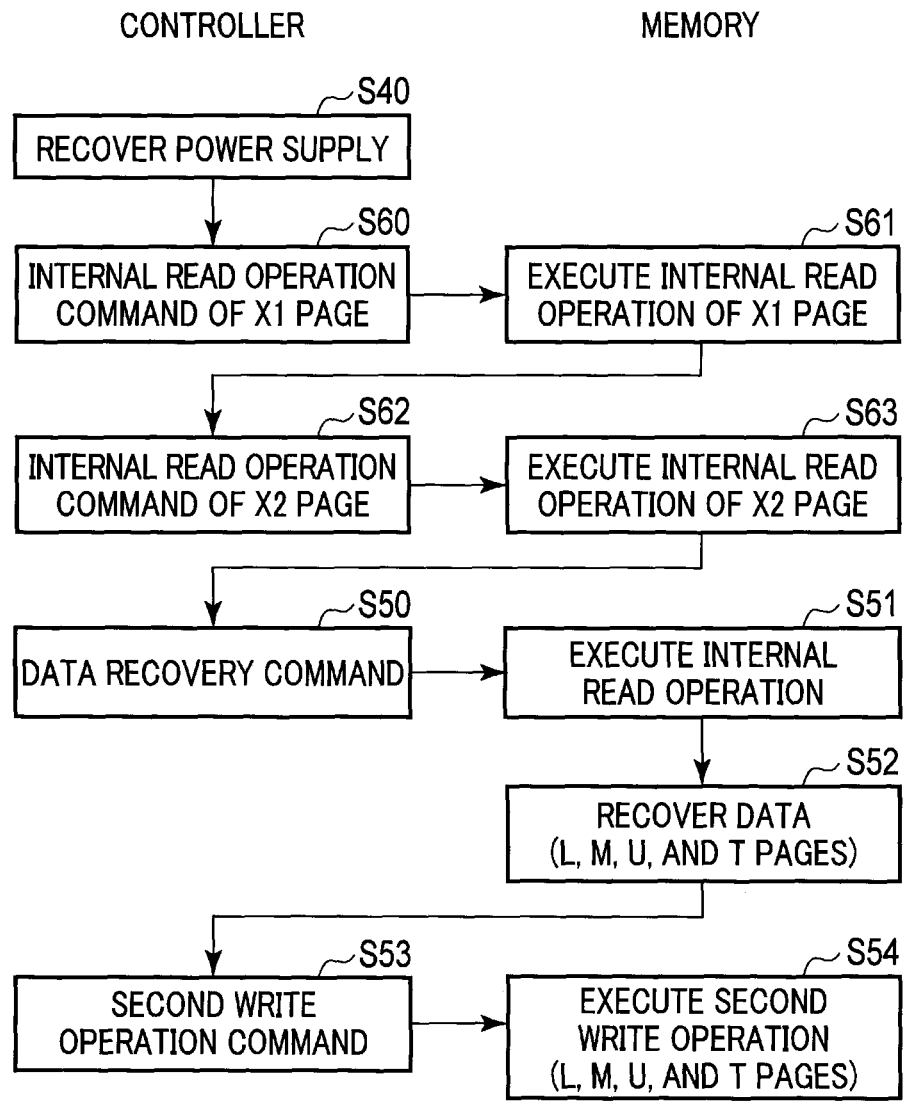
FIG. 28 is a flowchart showing the overall flow at power recovery of the second example in the memory system according to the second embodiment.

First, the overall flow at power recovery in the second example will be described using FIG. 28. As shown in FIG. 28, when the power supply is recovered (step S40), the CPU 23 first transmits an internal data read operation command of the X1 page data to the memory 10 (step S60). The sequencer 14 executes the internal data read operation of the X1 page data based on the instruction from the controller 20 and stores the read data in the sense amplifier 18 (step S61).

Upon completion of the internal data read operation of the X1 page data in the memory 10, the CPU 23 transmits the internal data read operation command of the X2 page data to the memory 10 (step S62). The sequencer 14 executes the internal data read operation of the X2 page data based on an instruction from the controller 20 and stores the read data in the sense amplifier 18 (step S63).

The subsequent operation is the same as steps S50 to S54 described in FIG. 25 of the first example.

2.5.2.2 Command Sequence

Next, two examples of a command sequence transmitted from the controller 20 to the semiconductor memory device will be described.

2.5.2.2.1 Command Sequence of First Example

First, a command sequence of the first example will be described using FIG. 29.

As shown in FIG. 29, first, the CPU 23 sequentially transmits a command "AX1h", the command "00h", the address "ADD_S1", and the command "30h" to the memory 10. The command "AX1h" is a command for recognizing the SLC internal data read operation of the X1 page data. The command "00h" is a command providing notification of the read operation. The command "30h" is a command giving an instruction on execution of the read operation. When the command "30h" is stored in the command register 12, the sequencer 14 sets the ready/busy signal RBn to the "L" level, executes the SLC read operation of the X1 page data, and holds the data "DAT_X1" in the data register 17. And then, the sequencer 14 sets the ready/busy signal RBn to "H" level.

Upon receiving the ready/busy signal RBn at the "H" level, the CPU 23 sequentially transmits a command "AX2h", the command "00h", the address "ADD_S2", and the command "30h" to the memory 10. The command "AX2h" is a command for recognizing the SLC internal data read operation of the X2 page data. When the command "30h" is stored in the command register 12, the sequencer 14 sets the ready/busy signal RBn to the "L" level, executes the SLC read operation of the X2 page data, and holds the data "DAT_X2" in the data register 17. And then, the sequencer 14 sets the ready/busy signal RBn to "H" level.

Upon receiving the ready/busy signal RBn at the "H" level, the CPU 23 sequentially transmits a command "YYh", the command "00h", an address "ADD", and the command "30h" to the memory 10. When the command "30h" is stored in the command register 12, the sequencer 14 sets the ready/busy signal RBn to the "L" level, executes the internal data read operation and the data recovery operation using the data recovery controller 19, and stores recovered 4-bit data in the sense amplifier 18. And then, the sequencer 14 sets the ready/busy signal RBn to "H" level.

Upon receiving the ready/busy signal RBn at the "H" level, the CPU 23 sequentially transmits a command "ZZh", the command "80h", the address "ADD_X1", and the command "10h" to the memory 10. In this case, data transfer from the controller 20 to the memory 10 is unnecessary. When the command "10h" is stored in the command register 12, the sequencer 14 executes the second write operation by using the 4-bit data stored in the sense amplifier 18.

2.5.2.2.2 Command Sequence of Second Example

Next, a command sequence of the second example will be described using FIG. 30.

Figure 30:
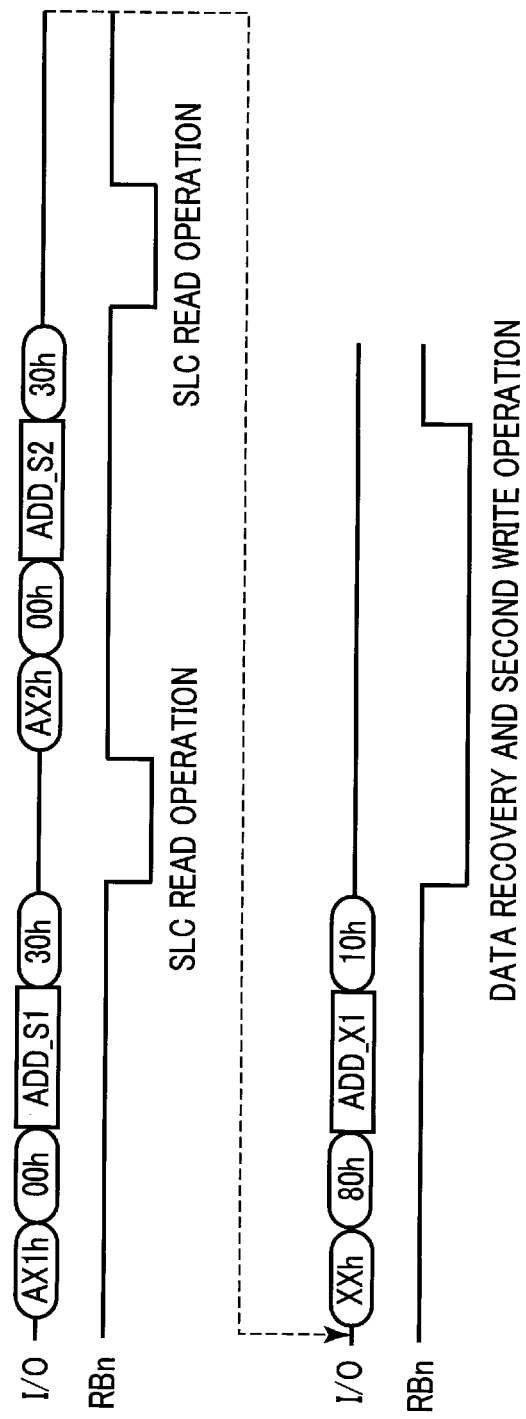
FIG. 30 is a diagram showing a command sequence of the SLC read operation and the second write operation in the second example in the flow at power recovery of the second example in the memory system according to the second embodiment.

As shown in FIG. 30, the processes up to the SLC internal data read operation of the X1 page data and the X2 page data in the memory 10 are the same as in FIG. 29 of the first example.

Upon completion of the SLC internal data read operation, the CPU 23 sequentially transmits the command "XXh", the command "80h", the address "ADD_X1", and the command "10h" to the memory 10.

When the command "10h" is stored in the command register 12, the sequencer 14 sets the ready/busy signal RBn to the "L" level and transfers the data "DAT_X2" held in the data register 17 to the sense amplifier 18. Thereafter, the sequencer 14 executes the internal data read operation. Next, the data recovery controller 19 recovers the 4-page data from the X1 page data, the X2 page data, and the read data and transfers them to the sense amplifier 18. Next, the sequencer 14 executes the second write operation based on the 4-page data stored in the sense amplifier 18.

The order in which the X1 page data and the X2 page data are transmitted from the controller 20 to the memory 10 can be arbitrarily set.

2.6 Detailed Flow of SLC Write Operation

Next, a detailed flow of the SLC write operation will be described using FIG. 31.

As shown in FIG. 31, first, when the SLC write operation is executed for a block BLK corresponding to SLC, the CPU 23 selects j=0, that is, a word line WL0 and further selects i=0, that is, a string unit SU0 (step S130). Then, the CPU 23 transmits the SLC command set to the memory 10.

The sequencer 14 selects the word line WL0 and the string unit SU0 based on the SLC command set and executes the SLC write operation (step S131).

Next, after the completion of the SLC write operation, the CPU 23 confirms whether a variable i of a string unit SUi is i=3 (step S132).

When i=3 is negated (step S132_No), the CPU 23 increments the variable i to i=i+1 (step S133) and transmits the SLC command set to the memory 10. Returning to step S131, the sequencer 14 executes the SLC write operation.

When i=3 is affirmed (step S132_Yes), the CPU 23 confirms whether a variable j of a word line WLj is j=95 (step S134).

When j=95 is negated (step S134_No), the CPU 23 increments the variable j to i=j+1 (step S135). Then, the CPU 23 returns to step S130, selects the variable i=0, and transmits the SLC command set to the memory 10.

When j=95 is affirmed (step S134_Yes), the CPU 23 completes the SLC write operation in the target block BLK.

2.7 Effects According to the Present Embodiment

With a configuration according to the present embodiment, it is possible to suppress an increase in chip area. The effects will be described in detail.

When power shutdown occurs, the memory system sometimes saves the data stored in the RAM using a volatile memory to a nonvolatile memory. In this case, data is written in the memory by using an electric charge charged in the capacitive element in the memory system. Accordingly, as the number of pages of data stored in the RAM increases, a data transfer time becomes longer, so that it is necessary to increase the capacitance of the capacitive element accordingly, and the chip area tends to increase.

On the other hand, with the configuration according to the present embodiment, the memory system 1 includes the data conversion circuit 27 in the controller 20 and the data recovery controller 19 in the memory 10. As a result, when the memory system 1 enters the power shutdown state, the memory system 1 can convert 4-page (bit) data after the first write operation into 2-page (bit) data and can write the 2-page data in the memory 10. In addition, the memory system 1 recovers the 4-page data with the converted 2-page data and data after the first write operation read from the memory cell group MCG and can execute the second write operation. Consequently, it is possible to reduce the amount of data written in the memory 10 in the power shutdown state. Thus, it is possible to suppress an increase in the capacitance of the capacitive element and suppress an increase in the chip area of the memory system 1. Accordingly, an increase in manufacturing cost of the memory system 1 can be suppressed.

In addition, in the configuration according to the present embodiment, when the second write operation is executed after power recovery, it is sufficient to transmit 2-page data from the controller 20 to the memory 10, so that a data transfer amount can be reduced from 4 pages to 2 pages. Accordingly, a data transfer time from the controller 20 to the memory 10 can be reduced.

In addition, with the configuration according to the present embodiment, it is possible to assign data such that the converted 2-bit data becomes the gray code with respect to adjacent threshold distributions of the memory cell transistor MT. Accordingly, even when erroneous reading, erroneous writing, or the like occurs, the fluctuation of 2-bit data can be accommodated in 1 bit, so that data reliability can be improved.

The first embodiment and the second embodiment may be combined. That is, conversion from 4-bit data into 2-bit data may be performed in both the normal state and the power shutdown state.

3. Third Embodiment

Next, the third embodiment will be described. In the third embodiment, the data write sequence different from that in the first embodiment will be described.

Hereinafter, differences from the first embodiment will be mainly described.

3.1 Data Write Sequence

The data write sequence will be described using FIG. 32. FIG. 32 shows a selection order of string units SU in a block BLK.

As shown in FIG. 32, first, the sequencer 14 executes the first write operation in which, as the zeroth to third operations, the word line WL0 is selected and the string units SU0 to SU3 are sequentially selected.

Next, the sequencer 14 executes, as the fourth and fifth operations, the first write operation in which the string unit SU0 and a word line WL1 are selected and the second write operation in which the string unit SU0 and the word line WL0 are selected. Further, the sequencer 14 alternately executes, as the sixth to eleventh operations in the order of the string units SU1 to SU3 in the same procedure as the fourth and fifth operations, the first write operation in which the word line WL1 is selected and the second write operation in which the word line WL0 is selected.

Next, as the twelfth to nineteenth operations, as in the fourth to eleventh operations, the sequencer 14 executes in the order of the string units SU0 to SU3 the first write operation in which the word line WL2 is selected and the second write operation in which the word line WL1 is selected.

That is, the sequencer 14 executes in the order of the string units SU0 to SU3 the first write operation in which a word line WL(j+1) is selected and the second write operation in which the word line WLj is selected.

The sequencer 14 executes, as the 756th to 763rd operations, in the order of the string units SU0 to SU3 the first write operation in which the word line WL95 is selected and the second write operation in which the word line WL94 is selected.

Next, the sequencer 14 executes, as the 764th to 767th operations, the second write operation in which the word line WL95 is selected and the string units SU0 to SU3 are sequentially selected, and completes the write operation in the block BLK.

In the case of executing the write operation in the above write sequence, the RAM 22 is provided with five or more page clusters CL. For example, when the second write operation (the fifth write operation) is executed for the memory cell group MCG corresponding to the word line WL0 and the string unit SU0, the five page clusters CL are used in order to store, in the RAM 22, 2-page data corresponding to each of the five memory cell groups MCG executing the zeroth to the fourth write operations (the first write operation).

3.2 Effects According to the Present Embodiment

The configuration according to the present embodiment can be applied to the first and second embodiments.

4. Fourth Embodiment

Next, the fourth embodiment will be described. In the fourth embodiment, three examples of a write operation in a case where a memory 10 executes conversion and recovery of data will be described. Hereinafter, differences from the first embodiment will be mainly described.

4.1 First Example

First, a write operation of a first example will be described. In the first example, a case where 2-page data converted by the memory 10 is stored in a RAM 22 will be described.

4.1.1 Configuration of Memory System

Figure 33:
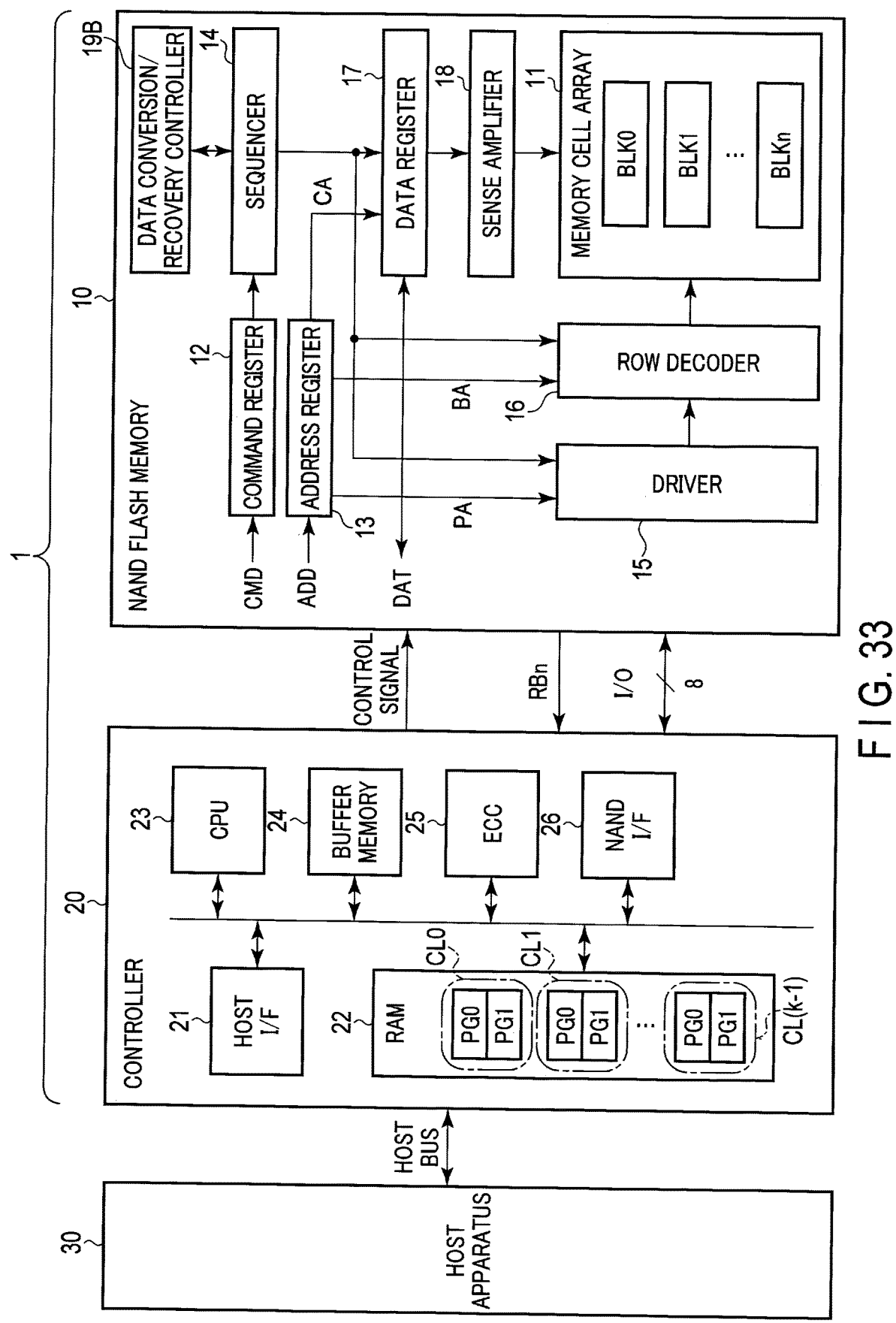
FIG. 33 is a block diagram of a memory system according to a fourth embodiment.

The overall configuration of a memory system 1 will be described using FIG. 33. In the example of FIG. 33, a part of coupling between blocks is indicated by an arrow line; however, the coupling between the blocks is not limited thereto.

As shown in FIG. 33, the difference from FIG. 1 of the first embodiment is that the data conversion circuit 27 is eliminated in the controller 20, and the memory 10 includes a data conversion/recovery controller 19B.

For example, when the memory cell transistor included in the memory 10 is a QLC (quad level cell) holding 4-bit (16-ary) data, the data conversion/recovery controller 19B converts the 4-bit data corresponding to QLC into 2-bit data. Further, the data conversion/recovery controller 19B holds, in a data register 17, 2-bit converted data and data read from a memory cell array 11 and performs calculation to recover the 4-bit data corresponding to QLC. The data conversion/recovery controller 19B may be provided in the sequencer 14. A data conversion circuit and a data recovery controller may be provided separately. In addition, the number of bits of data converted by the data conversion/recovery controller 19B can be arbitrarily set.

4.1.2 Overall Flow of Write Operation

Next, the overall flow of the write operation in the first example will be described using FIG. 34. The example of FIG. 34 shows the write operation performed on a memory cell group MCG, and the write operation performed on the other memory cell groups MCG is omitted.

As shown in FIG. 34, similarly to steps S10 to S12 described in FIG. 11 of the first embodiment, the first write operation is executed.

After execution of the first write operation, the data conversion/recovery controller 19B converts 4-page data into 2-page (X1 page/X2 page) data (step S70).

The converted X1 page data and X2 page data are transmitted to the controller 20 and stored in a page cluster CL in the RAM 22 (step S71).

During the first write operation, the data conversion/recovery controller 19B may perform data conversion, and the X1 page data and the X2 page data may be transmitted to the controller 20. In addition, the X1 page data and the X2 page data may be stored in the page cluster CL in the RAM 22.

The operation after data storage is the same as steps S14 to S17 described in FIG. 11 of the first embodiment. The data conversion/recovery controller 19B recovers 4-page (top page/upper page/middle page/lower page) data from 2-page data received from the controller 20 and the read data. After data storage, step S14 may be executed after the first write operation, data conversion, and data storage corresponding to the other memory cell groups MCG (not shown) are executed.

4.1.3 Command Sequence

Next, two examples of a command sequence transmitted from the controller 20 to the semiconductor memory device will be described.

4.1.3.1 Command Sequence of First Example

First, a command sequence of the first example will be described using FIG. 35.

As shown in FIG. 35, first, a CPU 23 sequentially transmits a command "0Dh", a command "80h", an address "ADD_L" of the lower page, data "DAT_L", and a command "1Ah" to the memory 10. When the command "1Ah" is stored in the command register 12, the sequencer 14 sets the ready/busy signal RBn to "L" level and transfers the data "DAT_L" held in the data register 17 to the sense amplifier 18. When the data transfer is completed, the sequencer 14 sets the ready/busy signal RBn to "H" level.

Upon receiving the ready/busy signal RBn at the "H" level, the CPU 23 sequentially transmits the command "80h", an address "ADD_M" of the middle page, data "DAT_M", and the command "1Ah" to the memory 10. When the command "1Ah" is stored in the command register 12, the sequencer 14 sets the ready/busy signal RBn to the "L" level and transfers the data "DAT_M" held in the data register 17 to the sense amplifier 18. When the data transfer is completed, the sequencer 14 sets the ready/busy signal RBn to "H" level.

Upon receiving the ready/busy signal RBn at the "H" level, the CPU 23 sequentially transmits the command "80h", an address "ADD_U" of the upper page, data "DAT_U", and the command "1Ah" to the memory 10. When the command "1Ah" is stored in the command register 12, the sequencer 14 sets the ready/busy signal RBn to the "L" level and transfers the data "DAT_U" held in the data register 17 to the sense amplifier 18. When the data transfer is completed, the sequencer 14 sets the ready/busy signal RBn to "H" level.

Upon receiving the ready/busy signal RBn at the "H" level, the CPU 23 sequentially transmits the command "80h", an address "ADD_T" of the top page, data "DAT_T", and a command "10h" to the memory 10. When the command "10h" is stored in the command register 12, the sequencer 14 sets the ready/busy signal RBn to the "L" level and transfers the data "DAT_T" held in the data register 17 to the sense amplifier 18. The sequencer 14 executes the first write operation based on the data "DAT_L", "DAT_M", "DAT_U", and "DAT_T" stored in the sense amplifier 18. After execution of the first write operation, the data conversion/recovery controller 19B converts 4-page data into 2-page data. When the conversion is completed, the sequencer 14 sets the ready/busy signal RBn to "H" level.

Upon receiving the ready/busy signal RBn at the "H" level, the CPU 23 reads data "DAT_X1" and "DAT_X2" from the memory 10.

The sequencer 14 may execute data conversion processing during the first write operation and output data after data conversion.

Next, a second write operation will be described.

After reading the data "DAT_X1" and "DAT_X2", the CPU 23 sequentially transmits a command "XXh", the command "80h", an address "ADD_X1" of the X1 page data, the data "DAT_X1", and the command "1Ah" to the memory 10. When the command "1Ah" is stored in the command register 12, the sequencer 14 sets the ready/busy signal RBn to the "L" level and transfers the data "DAT_X1"

held in the data register 17 to the sense amplifier 18. When the data transfer is completed, the sequencer 14 sets the ready/busy signal RBn to "H" level.

Next, upon receiving the ready/busy signal RBn at the "H" level, the CPU 23 sequentially transmits the command "80h", an address "ADD_X2" of the X2 page, data "DAT_X2", and the command "10h" to the memory 10.

When the command "10h" is stored in the command register 12, the sequencer 14 sets the ready/busy signal RBn to the "L" level and transfers the data "DAT_X2" held in the data register 17 to the sense amplifier 18. Thereafter, the sequencer 14 executes the internal data read operation. Next, the data recovery controller 19 recovers the 4-page data from the X1 page data, the X2 page data, and the read data and transfers them to the sense amplifier 18. Next, the sequencer 14 executes the second write operation based on the 4-page data stored in the sense amplifier 18.

4.1.3.2 Command Sequence of Second Example

Next, a command sequence of a second example will be described using FIG. 36.

Figure 36:
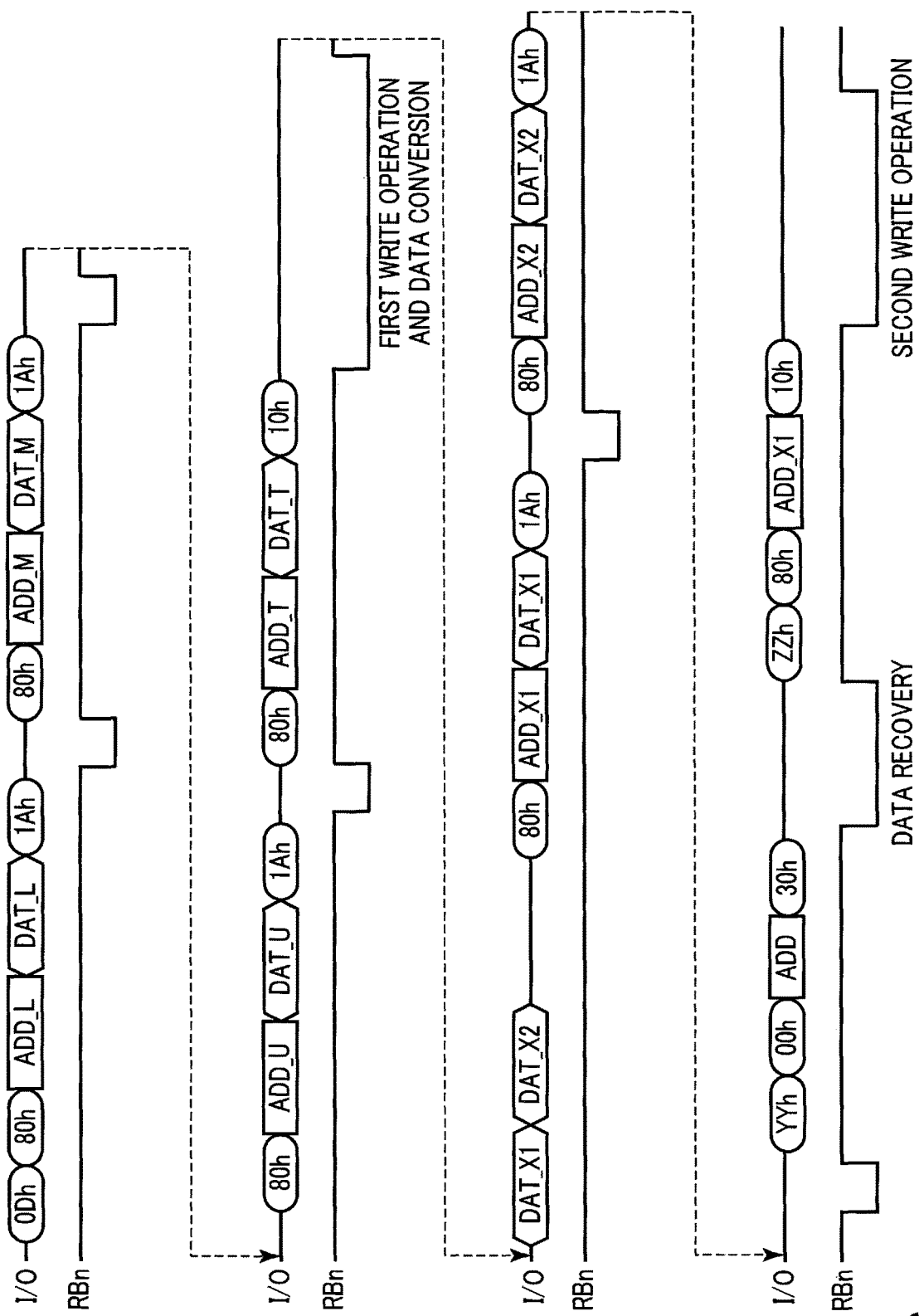
FIG. 36 is a diagram showing a command sequence of the write operation in a second example in the memory system according to the first example of the fourth embodiment.

As shown in FIG. 36, the process until the CPU 23 reads the data "DAT_X1" and "DAT_X2" from the memory 10 is the same as in FIG. 35 of the first example.

After reading the data "DAT_X1" and "DAT_X2", the CPU 23 sequentially transmits the command "80h", the address "ADD_X1" of the X1 page, the data "DAT_X1", and the command "1Ah" to the memory 10. When the command "1Ah" is stored in the command register 12, the sequencer 14 sets the ready/busy signal RBn to the "L" level and transfers the data "DAT_X1" held in the data register 17 to the sense amplifier 18. When the data transfer is completed, the sequencer 14 sets the ready/busy signal RBn to "H" level.

Next, upon receiving the ready/busy signal RBn at the "H" level, the CPU 23 sequentially transmits the command "80h", the address "ADD_X2" of the X2 page, the data "DAT_X2", and the command "1Ah" to the memory 10. When the command "1Ah" is stored in the command register 12, the sequencer 14 sets the ready/busy signal RBn to the "L" level and transfers the data "DAT_X2" held in the data register 17 to the sense amplifier 18. When the data transfer is completed, the sequencer 14 sets the ready/busy signal RBn to "H" level.

Next, upon receiving the ready/busy signal RBn at the "H" level, the CPU 23 sequentially transmits a command "YYh", a command "00h", an address "ADD", and a command "30h" to the memory 10. When the command "30h" is stored in the command register 12, the sequencer 14 sets the ready/busy signal RBn to the "L" level, executes the internal data read operation and the data recovery operation using the data recovery controller 19, and stores recovered 4-bit data in the sense amplifier 18. When the data store is completed, the sequencer 14 sets the ready/busy signal RBn to "H" level.

Next, upon receiving the ready/busy signal RBn at the "H" level, the CPU 23 sequentially transmits a command "ZZh", the command "80h", the address "ADD_X1", and the command "10h" to the memory 10. When the command "10h" is stored in the command register 12, the sequencer 14 executes the second write operation by using the 4-bit data stored in the sense amplifier 18.

The order in which the X1 page data and the X2 page data are transmitted from the controller 20 to the memory 10 can be arbitrarily set.

4.2 Second Example

Next, a write operation in a second example will be described. In the second example, a case where 2-page data converted by the memory 10 is stored in SLC of a management area of the memory cell array 11, for example, will be described.

4.2.1 Configuration of Memory System

First, the overall configuration of the memory system of the second example will be described. The overall configuration of the memory system 1 is the same as that of FIG. 33 of the first example.

4.2.2 Overall Flow of Write Operation

Next, the overall flow of the write operation in the second example will be described using FIG. 37. The example of FIG. 37 shows the write operation performed on the memory cell group MCG, and the write operation performed on the other memory cell groups MCG is omitted.

Figure 37:
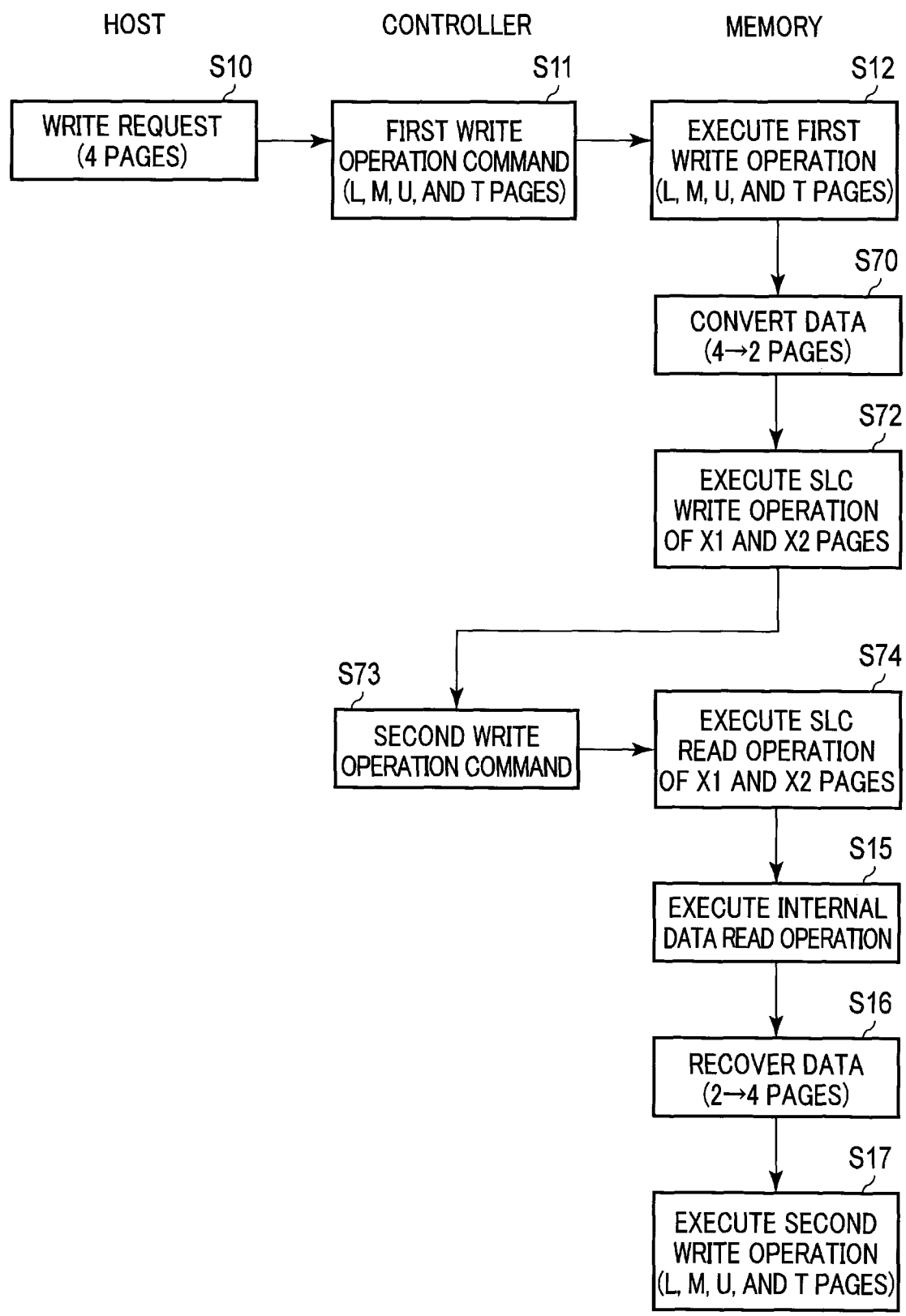
FIG. 37 is a flowchart of a write operation in a memory system according to a second example of the fourth embodiment.

As shown in FIG. 37, similarly to steps S10 to S12 described in FIG. 11 of the first embodiment, the first write operation is executed.

After execution of the first write operation, the data conversion/recovery controller 19B converts 4-page data into 2-page (X1 page/X2 page) data (step S70).

The sequencer 14 executes SLC write operation of the converted X1 page data and the converted X2 page data and stores the respective data in, for example, different memory cell groups MCG within the management area of the memory cell array 11 (step S72).

After completion of the SLC write operation, the CPU 23 transmits a second write operation command to the memory 10 (step S73). At this time, 2-page data is not given to a second command set. After completion of the SLC write operation, step S73 may be executed after the first write operation, data conversion, and the SLC write operation corresponding to the other memory cell groups MCG (not shown) are executed.

The sequencer 14 first executes SLC internal data read operation of the X1 page data and the X2 page data in the management area based on an instruction from the controller 20 (step S74) and then executes the internal data read operation of the memory cell group MCG subjected to the first write operation (step S15).

The data conversion/recovery controller 19B recovers the 4-page (top page/upper page/middle page/lower page) data from the read data (step S16).

The sequencer 14 executes the second write operation using the recovered 4-bit data (step S17).

4.2.3 Command Sequence

Next, a command sequence transmitted from the controller 20 to the semiconductor memory device will be described using FIG. 38.

As shown in FIG. 38, the CPU 23 transmits the same first command set as the first example to the memory 10. Upon receiving the first command set, the sequencer 14 causes the data conversion/recovery controller 19B to execute data conversion after executing the first write operation, and then executes the SLC write operation of the converted data. The sequencer 14 may cause the data conversion/recovery controller 19B to execute data conversion, execute the SLC write operation of the converted data, and then execute the first write operation.

After completion of the SLC write operation, the CPU 23 sequentially transmits a command "AAh", the command "80h", the address "ADD_X1", and the command "10h" to the memory 10. The command "AAh" is a command for recognizing data recovery and the second write operation. When the command "10h" is stored in the command register 12, the sequencer 14 sets the ready/busy signal RBn to the "L" level, executes the internal data read operation and the data recovery operation using the data conversion/recovery controller 19B, and then executes the second write operation based on the recovered 4-bit data.

4.3 Third Example

Next, a write operation of a third example will be described. In the third example, a command sequence in the case of executing the first write operation after executing the SLC write operation of the converted data in the second example will be described. Hereinafter, differences from the second example will be mainly described.

4.3.1 Command Sequence

A command sequence transmitted from the controller 20 to the semiconductor memory device will be described using FIGS. 39 and 40.

Figure 39:
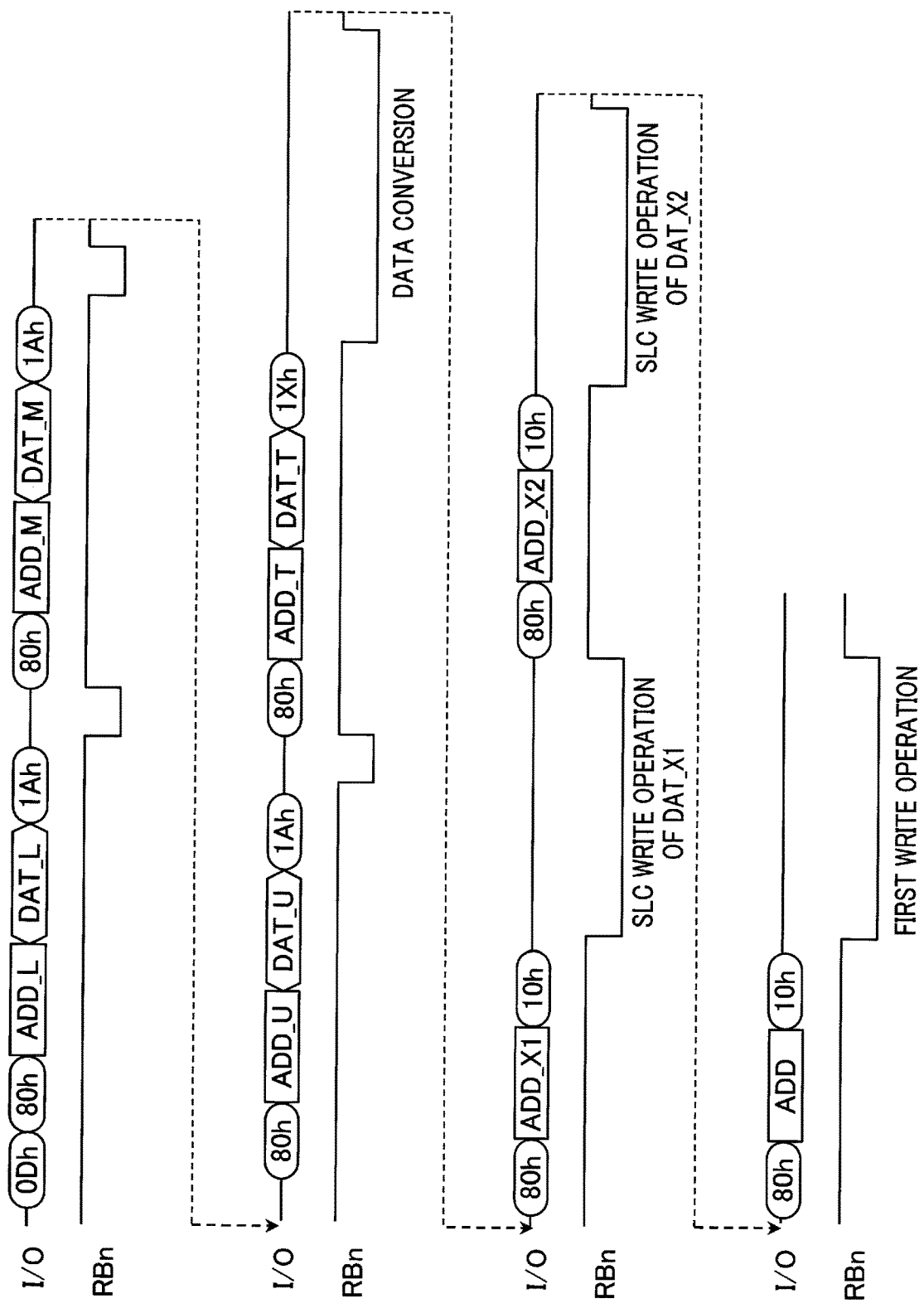
FIG. 39 is a diagram showing a command sequence of the write operation in the memory system according to a third example of the fourth embodiment.

As shown in FIG. 39, first, the CPU 23 sequentially transmits the command "0Dh", the command "80h", the address "ADD_L" of the lower page, the data "DAT_L", and the command "1Ah" to the memory 10. When the command "1Ah" is stored in the command register 12, the sequencer 14 sets the ready/busy signal RBn to "L" level and transfers the data "DAT_L" held in the data register 17 to the sense amplifier 18. When the data transfer is completed, the sequencer 14 sets the ready/busy signal RBn to "H" level.

Upon receiving the ready/busy signal RBn at the "H" level, the CPU 23 sequentially transmits the command "80h", an address "ADD_M" of the middle page, data "DAT_M", and the command "1Ah" to the memory 10. When the command "1Ah" is stored in the command register 12, the sequencer 14 sets the ready/busy signal RBn to the "L" level and transfers the data "DAT_M" held in the data register 17 to the sense amplifier 18. When the data transfer is completed, the sequencer 14 sets the ready/busy signal RBn to "H" level.

Upon receiving the ready/busy signal RBn at the "H" level, the CPU 23 sequentially transmits the command "80h", an address "ADD_U" of the upper page, data "DAT_U", and the command "1Ah" to the memory 10. When the command "1Ah" is stored in the command register 12, the sequencer 14 sets the ready/busy signal RBn to the "L" level and transfers the data "DAT_U" held in the data register 17 to the sense amplifier 18. When the data transfer is completed, the sequencer 14 sets the ready/busy signal RBn to "H" level.

Upon receiving the ready/busy signal RBn at the "H" level, the CPU 23 sequentially transmits the command "80h", the address "ADD_T" of the top page, the data "DAT_T", and the command "1Xh" to the memory 10. The command "1Xh" is a command giving an instruction to convert 4-page data into 2-page data. When the command "1Xh" is stored in the command register 12, the sequencer 14 sets the ready/busy signal RBn to the "L" level and transfers the data "DAT_T" held in the data register 17 to the sense amplifier 18. Then, the data conversion/recovery controller 19B converts 4-page data into 2-page data. The converted 2-page data and 4-page data input from outside are held in the data register 17 and the sense amplifier 18. And then, the sequencer 14 sets the ready/busy signal RBn to "H" level.

Upon receiving the ready/busy signal RBn at the "H" level, the CPU 23 sequentially transmits the command "80h", the address "ADD_X1", and the command "10h" to the memory 10. When the command "10h" is stored in the command register 12, the sequencer 14 sets the ready/busy signal RBn to the "L" level and, for example, executes the SLC write operation of the data "DAT_X1" held in the data register 17. When the SLC write operation is completed, the sequencer 14 sets the ready/busy signal RBn to "H" level.

Upon receiving the ready/busy signal RBn at the "H" level, the CPU 23 sequentially transmits the command "80h", the address "ADD_X2", and the command "10h" to the memory 10. When the command "10h" is stored in the command register 12, the sequencer 14 sets the ready/busy signal RBn to the "L" level and, for example, executes the SLC write operation of the data "DAT_X2" held in the data register 17. When the SLC write operation is completed, the sequencer 14 sets the ready/busy signal RBn to "H" level.

Upon receiving the ready/busy signal RBn at the "H" level, the CPU 23 sequentially transmits the command "80h", the address "ADD", and the command "10h" to the memory 10. When the command "10h" is stored in the command register 12, the sequencer 14 sets the ready/busy signal RBn to the "L" level and, for example, executes the first write operation of QLC based on the data "DAT_L", "DAT_M", "DAT_U", and "DAT_T" held in the data register 17.

Next, for example, after the write operation of adjacent cells and other strings and the like are performed, the second write operation is performed on the memory cell transistor MT subjected to the first write operation.

The second write operation will be specifically described.

As shown in FIG. 40, first, the CPU 23 sequentially transmits a command "AX1h", the command "00h", the address "ADD_X1", and the command "30h" to the memory 10. When the command "30h" is stored in the command register 12, the sequencer 14 sets the ready/busy signal RBn to the "L" level, executes the SLC read operation of the X1 page data, and holds the data "DAT_X1" in the data register 17. And then, the sequencer 14 sets the ready/busy signal RBn to "H" level.

Upon receiving the ready/busy signal RBn at the "H" level, the CPU 23 sequentially transmits a command "AX2h", the command "00h", the address "ADD_X2", and the command "30h" to the memory 10. When the command "30h" is stored in the command register 12, the sequencer 14 sets the ready/busy signal RBn to the "L" level, executes the SLC read operation of the X2 page data, and holds the data "DAT_X2" in the data register 17. And then, the sequencer 14 sets the ready/busy signal RBn to "H" level.

Upon receiving the ready/busy signal RBn at the "H" level, the CPU 23 sequentially transmits a command "YYh", the command "00h", an address "ADD", and the command "30h" to the memory 10. When the command "30h" is stored in the command register 12, the sequencer 14 sets the ready/busy signal RBn to the "L" level, executes the internal data read operation and the data recovery operation using the data conversion/recovery controller 19B, and stores recovered 4-bit data in the sense amplifier 18. And then, the sequencer 14 sets the ready/busy signal RBn to "H" level.

Upon receiving the ready/busy signal RBn at the "H" level, the CPU 23 sequentially transmits the command "80h", the address "ADD", and the command "10h" to the memory 10. When the command "10h" is stored in the command register 12, the sequencer 14 executes the second write operation by using the 4-bit data stored in the sense amplifier 18.

4.4 Effects According to the Present Embodiment

With the configuration according to the present embodiment, effects similar to those of the first embodiment can be obtained.

Further, with the configuration of the second example according to the present embodiment, it is not necessary to store data after execution of the first write operation in the RAM 22, so that the storage capacity of the RAM 22 can be reduced.

5. Fifth Embodiment

Next, the fifth embodiment will be described. In the fifth embodiment, an example of SLC write operation and SLC read operation will be described. Hereinafter, differences from the first to fourth embodiments will be mainly described.

5.1 Configuration of Memory System

First, a configuration of a memory system 1 will be described. In the memory system 1 according to the present embodiment, the conversion circuit 27 and the data recovery controller 19 described in FIG. 1 of the first embodiment may be eliminated. Other configurations are similar to those in FIG. 1 of the first embodiment.

5.2 Configuration of Memory Cell Array

First, a configuration of a memory cell array 11 will be described using FIG. 41.

Figure 41:
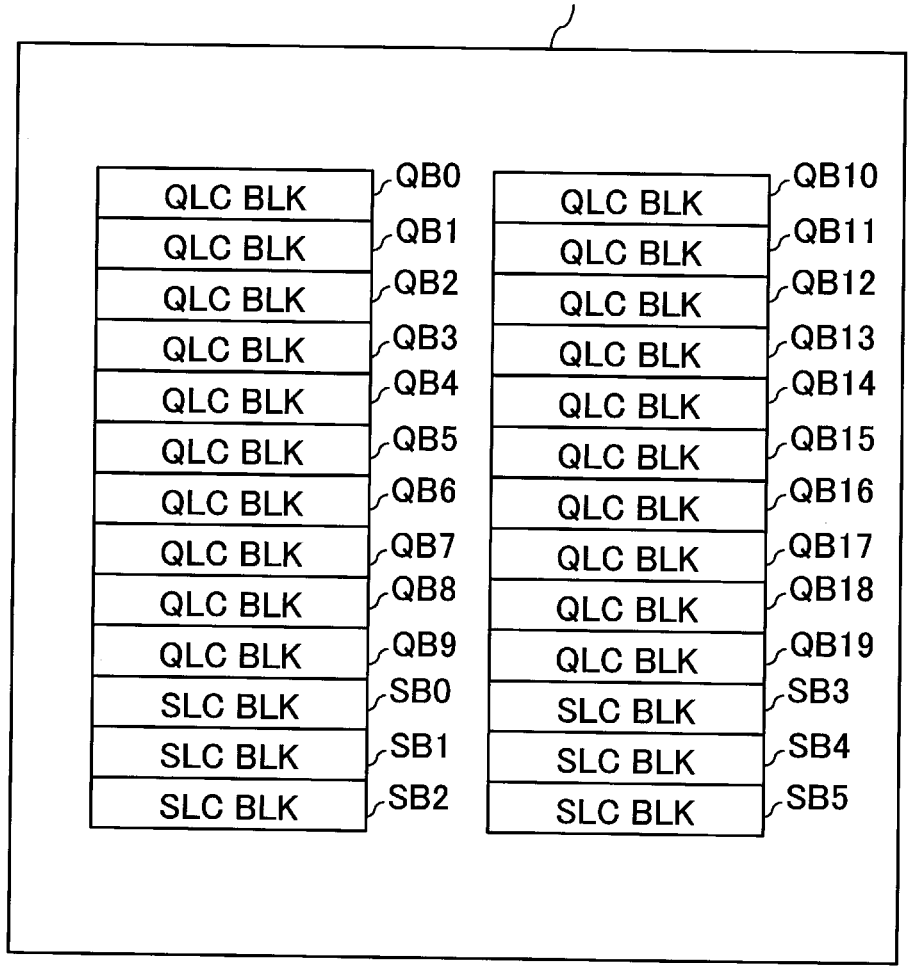
FIG. 41 is a block diagram of a memory cell array in a semiconductor memory device according to a fifth embodiment.

As shown in FIG. 41, the memory cell array 11 includes, for example, 20 QLC blocks BLK (QB0 to QB19) corresponding to QLC and six SLC blocks BLK (SB0 to SB5) corresponding to SLC.

For example, when data is written in the QLC block QB, two corresponding SLC blocks SB are required. However, if the number of the SLC blocks SB increases, an effective storage capacity decreases, so that a region of the SLC block SB may be limited. Thus, the number of write/erase cycles in the SLC block SB tends to be larger than that in the QLC block QB.

5.3 SLC Write Operation Corresponding to Two Times Write Operations

Next, an example of the SLC write operation corresponding to two times write operations will be described using FIG. 42. In this example, data can be written twice in a memory cell group MCG corresponding to the SLC write operation.

In the present embodiment, in a program operation, an operation of increasing the threshold voltage is referred to as "0" writing. On the other hand, an operation of maintaining the threshold voltage is referred to as "1" writing. Hereinafter, data corresponding to the "0" writing is referred to as "0" data, and data corresponding to the "1" writing is referred to as "1" data.

Figure 42:
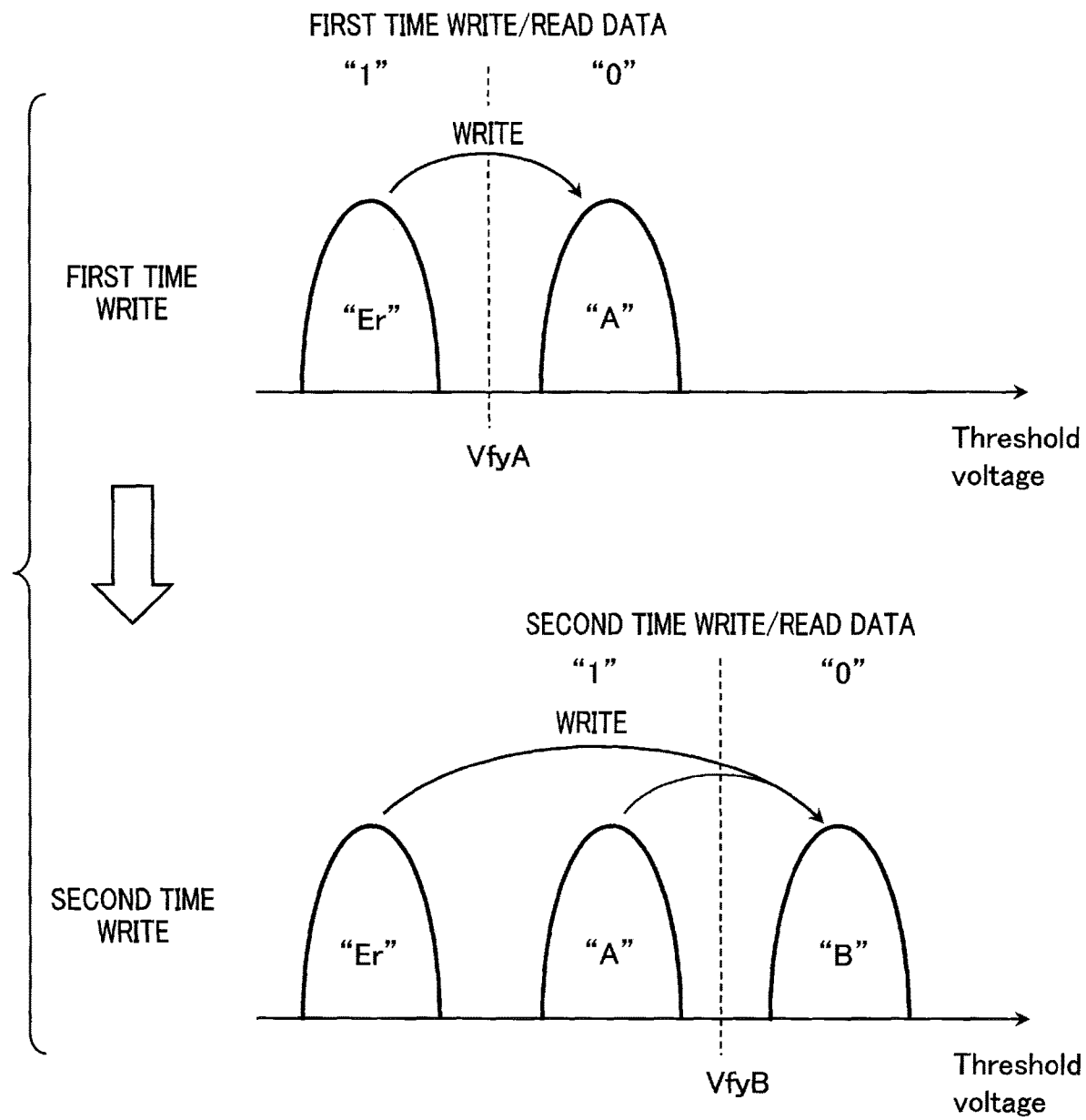
FIG. 42 is a diagram showing a threshold distribution of write data in an SLC write operation corresponding to two times write operations in the semiconductor memory device according to the fifth embodiment.

As shown in FIG. 42, in the first time write operation, data is written such that a threshold voltage of a memory cell transistor MT in which the data is to be written increases from an "Er" level to an "A" level. Assuming that a verify voltage at this time is VfyA, the threshold voltage of the memory cell transistor MT at the "Er" level (corresponding to "1" writing) is lower than the voltage VfyA. The threshold voltage of the memory cell transistor MT at the "A" level (corresponding to "0" writing) is equal to or higher than the voltage VfyA.

In the second time write operation, data is written such that the threshold voltage of the memory cell transistor MT in which the data is to be written increases to a "B" level. Assuming that the verify voltage at this time is VfyB, the threshold voltages of the memory cell transistor MT at the "Er" level and the "A" level (corresponding to "1" writing) are lower than the voltage VfyB. The threshold voltage of the memory cell transistor MT at the "B" level (corresponding to "0" writing) is equal to or higher than the voltage VfyB.

When second data is written, first data cannot be read. However, in the present embodiment, data of SLC becomes unnecessary when the second time write operation of QLC is completed. Thus, the second data is written in the memory cell group MCG in which the first data is no longer needed.

5.4 Data Write Sequence Corresponding to Two Times Write Operations

Next, two examples of the data write sequence corresponding to two times write operations will be described.

5.4.1 First Example

First, the first example will be described with reference to FIG. 43. FIG. 43 shows a selection order of the string units SU in the block BLK. A solid rectangular frame partitioned into two upper and lower sections with a broken line shows the memory cell group MCG. The upper section of the rectangular frame shows the second time write operation, and the lower section of the rectangular frame shows the first time write operation.

As shown in FIG. 43, first, the sequencer 14 executes the first time write operation in which, as the zeroth to third operations, the word line WL0 is selected and the string units SU0 to SU3 are sequentially selected.

Next, the sequencer 14 executes, as the fourth to seventh operations, the second time write operation in which the word line WL0 is selected and the string units SU0 to SU3 are sequentially selected.

Next, the sequencer 14 executes the first time write operation in which, as the eighth to eleventh operations, the word line WL1 is selected and the string units SU0 to SU3 are sequentially selected.

Next, the sequencer 14 executes the second time write operation in which, as the twelfth to fifteenth operations, the word line WL1 is selected and the string units SU0 to SU3 are sequentially selected.

Next, the sequencer 14 executes the first time write operation in which, as the sixteenth to nineteenth operations, the word line WL2 is selected and the string units SU0 to SU3 are sequentially selected.

Next, the sequencer 14 executes the second time write operation in which, as the twentieth to twenty-third operations, the word line WL2 is selected and the string units SU0 to SU3 are sequentially selected.

That is, the sequencer 14 executes the first time write operation in which a word line WLj and the string units SU0 to SU3 are sequentially selected, and then executes the second time write operation in which the word line WLj and the string units SU0 to SU3 are sequentially selected. Next, the sequencer 14 selects a word line WL(j+1) and repeats the same operation.

The sequencer 14 executes the first time write operation in which, as the 752th to 755th operations, the word line WL94 is selected and the string units SU0 to SU3 are sequentially selected.

The sequencer 14 executes the second time write operation in which, as the 756th to 759th operations, the word line WL94 is selected and the string units SU0 to SU3 are sequentially selected.

Next, the sequencer 14 executes the first time write operation in which, as the 760th to 763rd operations, the word line WL95 is selected and the string units SU0 to SU3 are sequentially selected.

Next, the sequencer 14 executes the second time write operation in which, as the 764th to 767th operations, the word line WL95 is selected and the string units SU0 to SU3 are sequentially selected, and completes the write operation in the block BLK.

The sequencer 14 executes the write operation in the above order based on the address ADD and the data DAT transmitted from the controller 20.

After the first time write operation has been executed, an erase operation may be executed for lowering the threshold voltage of the memory cell transistor MT toward the erase state before the second time write operation is executed. Instead of the erase operation, a weak erase operation may be executed for weakly lowering the threshold voltage of the memory cell transistor MT before the second time write operation is executed. The erase operation or the weak erase operation may be executed on a word line WL by word line WL basis.

5.4.2 Second Example

Next, the second example will be described with reference to FIG. 44. FIG. 44 shows a selection order of the string units SU in the block BLK.

As shown in FIG. 44, first, the sequencer 14 executes the first time write operation in which, as the zeroth to third operations, the word line WL0 is selected and the string units SU0 to SU3 are sequentially selected.

Next, the sequencer 14 executes, as the fourth to seventh operations, the first time write operation in which the word line WL1 is selected and the string units SU0 to SU3 are sequentially selected.

Next, the sequencer 14 executes the first time write operation in which, as the eighth to eleventh operations, the word line WL2 is selected and the string units SU0 to SU3 are sequentially selected.

That is, the sequencer 14 executes the first time write operation in which a word line WLj and the string units SU0 to SU3 are sequentially selected, and then selects a word line WL(j+1) and repeats the same operation.

The sequencer 14 executes the first time write operation in which, as the 376th to 379th operations, the word line WL94 is selected and the string units SU0 to SU3 are sequentially selected.

Next, the sequencer 14 executes the first time write operation in which, as the 380th to 383rd operations, the word line WL95 is selected and the string units SU0 to SU3 are sequentially selected.

When the first time write operation in the memory cell group MCG corresponding to each of the word lines WL0 to WL95 is completed, the sequencer 14 executes the second time write operation in the memory cell group MCG corresponding to each of the word lines WL0 to WL95.

More specifically, the sequencer 14 executes the second time write operation in which, as the 384th to 387th operations, the word line WL0 is selected and the string units SU0 to SU3 are sequentially selected.

Next, the sequencer 14 executes the second time write operation in which, as the 388th to 391th operations, the word line WL1 is selected and the string units SU0 to SU3 are sequentially selected.

Next, the sequencer 14 executes the second time write operation in which, as the 392th to 395th operations, the word line WL1 is selected and the string units SU0 to SU3 are sequentially selected.

That is, the sequencer 14 executes the second time write operation in which a word line WLj and the string units SU0 to SU3 are sequentially selected, and then selects a word line WL(j+1) and repeats the same operation.

The sequencer 14 executes the second time write operation in which, as the 760th to 763rd operations, the word line WL94 is selected and the string units SU0 to SU3 are sequentially selected.

Next, the sequencer 14 executes the second time write operation in which, as the 764th to 767th operations, the word line WL95 is selected and the string units SU0 to SU3 are sequentially selected, and completes the write operation in the block BLK.

The sequencer 14 executes the write operation in the above order based on the address ADD and the data DAT transmitted from the controller 20.

In this example, the second time write operation is executed after the first time write operation is executed for each of the memory cell groups MCG corresponding to the word lines WL0 to WL95. Therefore, if data "1" is written in the second time write operation, the boost efficiency of the channel of the memory cell transistor MT may be lowered. In this case, the voltage value of VPASS in the second time write operation may be set higher than the voltage value in the first time write operation.

In addition, the voltages value of the selected word line WL and the select gate line SGD in the first time operation may be different from those in the second time operation.

After the first time write operation has been executed, the erase operation or the weak erase operation may be executed for lowering the threshold voltage of the memory cell transistor MT toward the erase state or weakly lowering it before the second time write operation is executed. The erase operation or the weak erase operation may be executed on a block BLK by block BLK basis.

In addition, the sequencer 14 executes the write operation in which the word line WL is selected and the string units SU0 to SU3 are sequentially selected in the first and second example. However, the sequencer 14 may execute the write operation in which the string unit SU is selected and the word lines WL0 to WL95 are sequentially selected, and then selects other string unit SU and repeats the same operation.

In addition, in the first example and the second example, the sequencer 14 executes the write operation based on the address ADD and the data DAT transmitted from the controller 20. However, after the first time write operation has been executed, the controller 20 may transmit a specific command for indicating the second time write operation when the second time write operation is to be executed. The controller 20 may be provided with a table for storing information about written status of the memory cell array 11, and may decide whether or not to transmit the specific command based on the information stored in the table. In this case, after the first time write operation has been executed, the controller 20 may executes a pseudo erase operation by updating the information stored in the table before the second time write operation is executed. The pseudo erase operation may be unnecessary to be indicated from the controller 20 to the memory 10, and may be processed internally within the controller 20.

5.5 SLC Read Operation Corresponding to Two Times Write Operations

Next, an example of the SLC read operation corresponding to the two times write operations will be described using FIG. 45. In the example of FIG. 45, a description will be given of a case where written data includes a flag cell used for distinguishing the first data from the second data. In order to secure reliability, a plurality of the flag cells may be included. In this case, as a result of the majority voting, or when the number of "0" is written to at least a specified value, the flag cell may be written. Without providing the flag cell, the controller 20 may distinguish the first data from the second data and issue different read commands. In this case, for example, the read operation at the "A" level is performed before the second time write operation, and the read operation at the "B" level is performed after the second time write operation.

As shown in FIG. 45, upon receiving an SLC read command (step S300), a sequencer 14 executes the read operation at the "A" level (step S301). That is, the sequencer 14 executes the SLC read operation corresponding to the voltage VfyA.

In data according to the read operation at the "A" level (this data is hereinafter referred to as "A" level data), when no flag cell is written (step S302_No), the sequencer 14 outputs the "A" level data (step S303).

On the other hand, when the flag cell is written in the "A" level data (step S302_Yes), the sequencer 14 executes the read operation at the "B" level (step S304). That is, the sequencer 14 executes the SLC read operation corresponding to the voltage VfyB.

Upon completion of the read operation at the "B" level, the sequencer 14 outputs "B" level data (step S305).

5.6 Example of Four Times Write Operations

Next, in this example, three examples of the SLC write operation and the SLC read operation in the case of writing data four times in the memory cell group MCG corresponding to the SLC write operation will be described.

5.6.1 First Example

5.6.1.1 SLC Write Operation Corresponding to Four Times Write Operations

Figure 47:
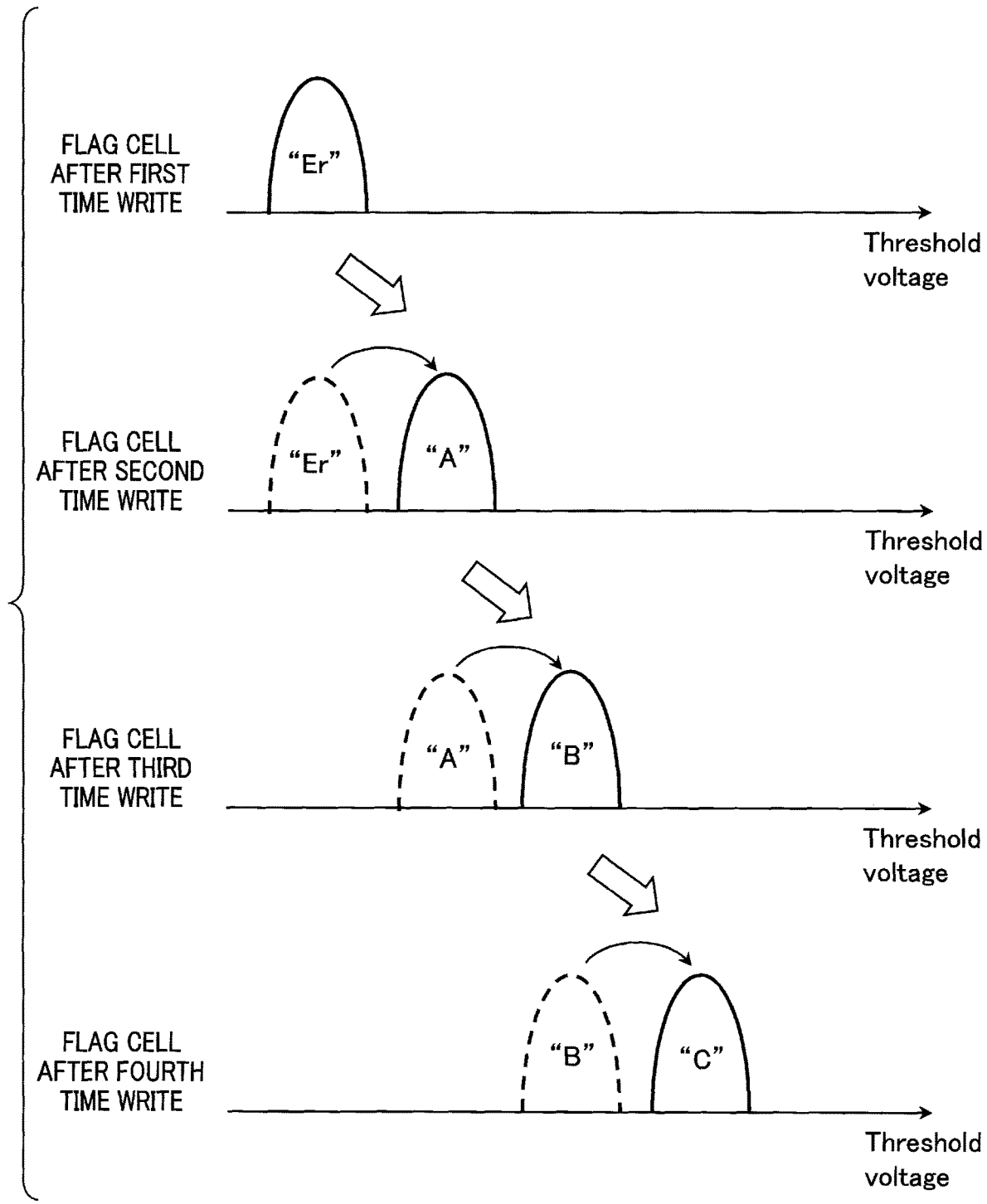
FIG. 47 is a diagram showing a threshold distribution of a flag cell in the first to fourth times write operations in the SLC write operation corresponding to the four times write operations in the semiconductor memory device according to the first example of the fifth embodiment.

First, an example of the SLC write operation corresponding to four times write operations will be described using FIGS. 46 and 47. FIG. 46 is a diagram showing a threshold distribution of write data in first to fourth times write operations. FIG. 47 is a diagram showing a threshold distribution of the flag cell in the first to fourth times write operations. In this example, for example, data of different threshold distributions corresponding to the first to fourth times write operations are written in the flag cell.

As shown in FIG. 46, the processes up to the second time write operation are the same as in FIG. 42.

In the third time write operation, data is written such that the threshold voltage of the memory cell transistor MT in which the data is to be written increases to a "C" level. Assuming that the verify voltage at this time is VfyC, the threshold voltages of the memory cell transistor MT at the "Er" level to the "B" level (corresponding to "1" writing) are lower than the voltage VfyC. The threshold voltage of the memory cell transistor MT at the "C" level (corresponding to "0" writing) is equal to or higher than the voltage VfyC.

In the fourth time write operation, data is written such that the threshold voltage of the memory cell transistor MT in which the data is to be written increases to a "D" level. Assuming that the verify voltage at this time is VfyD, the threshold voltages of the memory cell transistor MT at the "Er" level to the "C" level (corresponding to "1" writing) are lower than the voltage VfyD. The threshold voltage of the memory cell transistor MT at the "D" level (corresponding to "0" writing) is equal to or higher than the voltage VfyD.

After the first time write operation has been executed, the erase operation or the weak erase operation may be executed for lowering the threshold voltage of the memory cell transistor MT toward the erase state or weakly lowering it before the second time write operation is executed. Similarly, after the second time write operation has been executed, the erase operation or the weak erase operation may be executed before the third time write operation is executed. In addition, after the third time write operation has been executed, the erase operation or the weak erase operation may be executed before the fourth time write operation is executed.

Next, the threshold distribution of the flag cell corresponding to the first to fourth times write operations will be described.

As shown in FIG. 47, after the first time write operation, the threshold distribution of the flag cell is set to the "Er" level. After the second time write operation, the threshold distribution of the flag cell is set to the "A" level. After the third time write operation, the threshold distribution of the flag cell is set to the "B" level. After the fourth time write operation, the threshold distribution of the flag cell is set to the "C" level.

5.6.1.2 SLC Read Operation Corresponding to Four Times Write Operations

Figure 48:
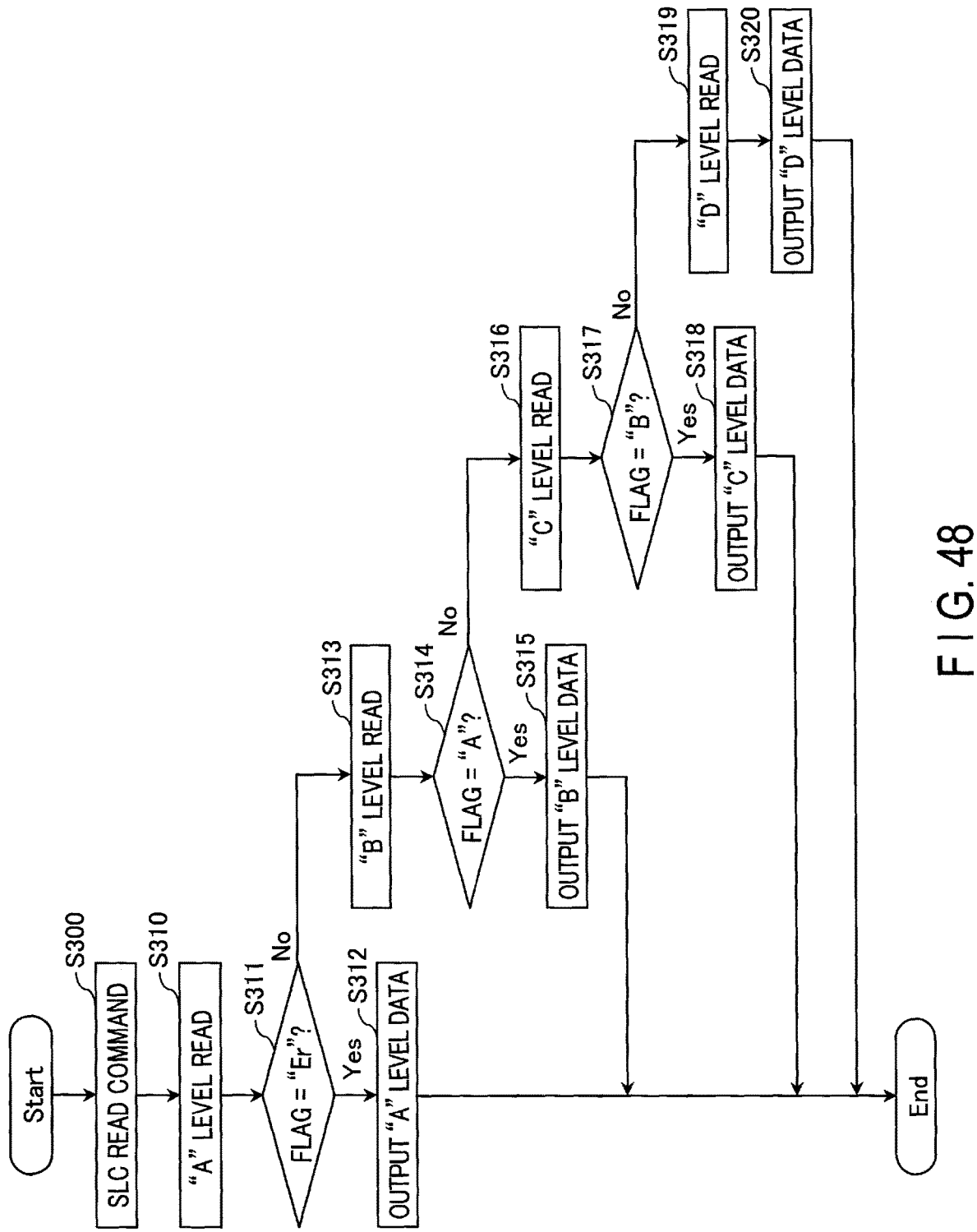
FIG. 48 is a flowchart of the SLC read operation corresponding to the four times write operations in the semiconductor memory device according to the first example of the fifth embodiment.

Next, the SLC read operation corresponding to four times write operations will be described using FIG. 48. FIG. 48 shows a flowchart of the read operation.

As shown in FIG. 48, upon receiving the SLC read command (step S300), the sequencer 14 executes the read operation at the "A" level (step S310). That is, the sequencer 14 executes the SLC read operation corresponding to the voltage VfyA.

In the read operation at the "A" level, when the flag cell is the "Er" level (step S311_Yes), the sequencer 14 outputs the "A" level data (step S312).

In the read operation at the "A" level, when the flag cell is not the "Er" level (step S311_No), the sequencer 14 executes the read operation at the "B" level (step S313). That is, the sequencer 14 executes the SLC read operation corresponding to the voltage VfyB.

When the flag cell is the "A" level in the read operation at the "B" level (step S314_Yes), that is, when the threshold voltage of the flag cell is lower than the voltage VfyB in the read operation at the "B" level, the sequencer 14 outputs the "B" level data (step S315).

When the flag cell is not the "A" level in the read operation at the "B" level (step S311_No), that is, when the threshold voltage of the flag cell is equal to or higher than the voltage VfyB in the read operation at the "B" level, the sequencer 14 executes the read operation at the "C" level (step S316). That is, the sequencer 14 executes the SLC read operation corresponding to the voltage VfyC.

When the flag cell is the "B" level in the read operation at the "C" level (step S317_Yes), that is, when the threshold voltage of the flag cell is lower than the voltage VfyC in the read operation at the "C" level, the sequencer 14 outputs the "C" level data (step S318).

When the flag cell is not the "B" level in the read operation at the "C" level (step S317_No), that is, when the threshold voltage of the flag cell is equal to or higher than the voltage VfyC in the read operation at the "C" level, the sequencer 14 executes the read operation at the "D" level (step S319). That is, the sequencer 14 executes the SLC read operation corresponding to the voltage VfyD.

Upon completion of the read operation at the "D" level, the sequencer 14 outputs "D" level data (step S320).

5.6.2 Second Example

5.6.2.1 SLC Write Operation Corresponding to Four Times Write Operations

Next, the SLC write operation of a second example will be described using FIG. 49. FIG. 49 is a diagram showing the threshold distribution of the flag cell in the first to fourth times write operations. Hereinafter, differences from the first example will be mainly described.

The threshold distribution of write data in this example is the same as that of FIG. 46 of the first example.

Next, the threshold distribution of the flag cell corresponding to the first to fourth times write operations will be described.

As shown in FIG. 49, after the first time write operation, the threshold distribution of the flag cell is set to the "Er" level. After the second time write operation, the threshold distribution of the flag cell is set to the "B" level. After the third time write operation, the threshold distribution of the flag cell is set to the "C" level. After the fourth time write operation, the threshold distribution of the flag cell is set to the "D" level.

5.6.2.2 SLC Read Operation Corresponding to Four Times Write Operations

Next, the SLC read operation corresponding to four times write operations will be described using FIG. 50. FIG. 50 shows a flowchart of the read operation.

As shown in FIG. 50, upon receiving the SLC read command (step S300), the sequencer 14 first executes the read operation at the "B" level (step S330).

When the flag cell is the "Er" level in the read operation at the "B" level (step S311_Yes), the sequencer 14 executes the read operation at the "A" level (step S332).

Upon completion of the read operation at the "A" level, the sequencer 14 outputs the "A" level data (step S333).

In the read operation at the "B" level, when the flag cell is not the "Er" level (step S331_No), the sequencer 14 executes the read operation at the "C" level (step S334).

When the flag cell is the "B" level in the read operation at the "C" level (step S335_Yes), that is, when the threshold voltage of the flag cell is lower than the voltage VfyC in the read operation at the "C" level, the sequencer 14 outputs the "B" level data (step S336).

When the flag cell is not the "B" level in the read operation at the "C" level (step S335_No), that is, when the threshold voltage of the flag cell is equal to or higher than the voltage VfyC in the read operation at the "C" level, the sequencer 14 executes the read operation at the "D" level (step S337).

When the flag cell is the "C" level in the read operation at the "D" level (step S338_Yes), that is, when the threshold voltage of the flag cell is lower than the voltage VfyD in the read operation at the "D" level, the sequencer 14 outputs the "C" level data (step S339).

When the flag cell is not the "C" level in the read operation at the "D" level (step S338_No), that is, when the threshold voltage of the flag cell is equal to or higher than the voltage VfyD in the read operation at the "D" level, the sequencer 14 outputs the "D" level data (step S340).

5.6.3 Third Example

5.6.3.1 SLC Write Operation Corresponding to Four Times Write Operations

Figure 51:
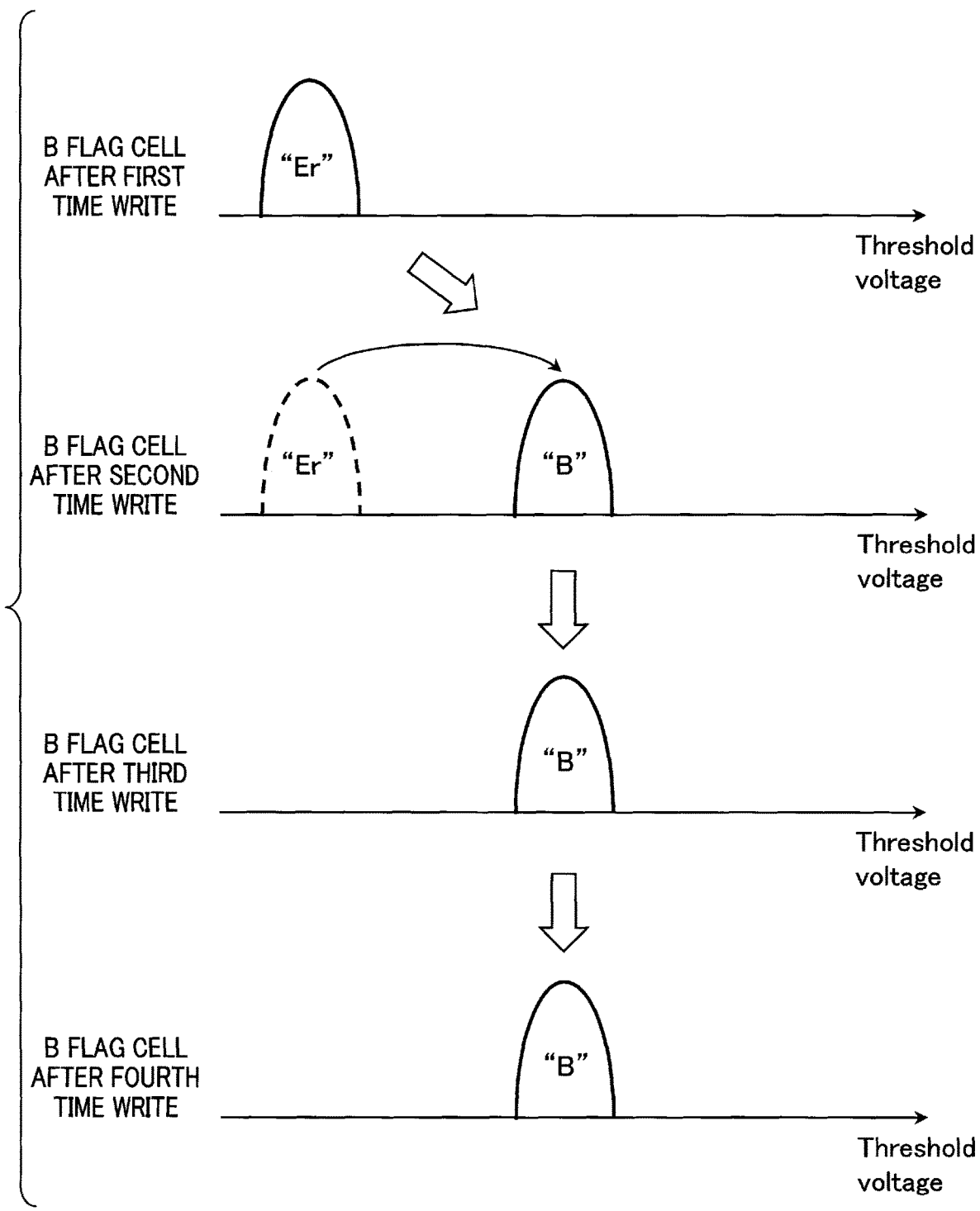
FIG. 51 is a diagram showing a threshold distribution of a B flag cell in first to fourth times write operations in the SLC write operation corresponding to four times write operations in the semiconductor memory device according to a third example of the fifth embodiment.
Figure 53:
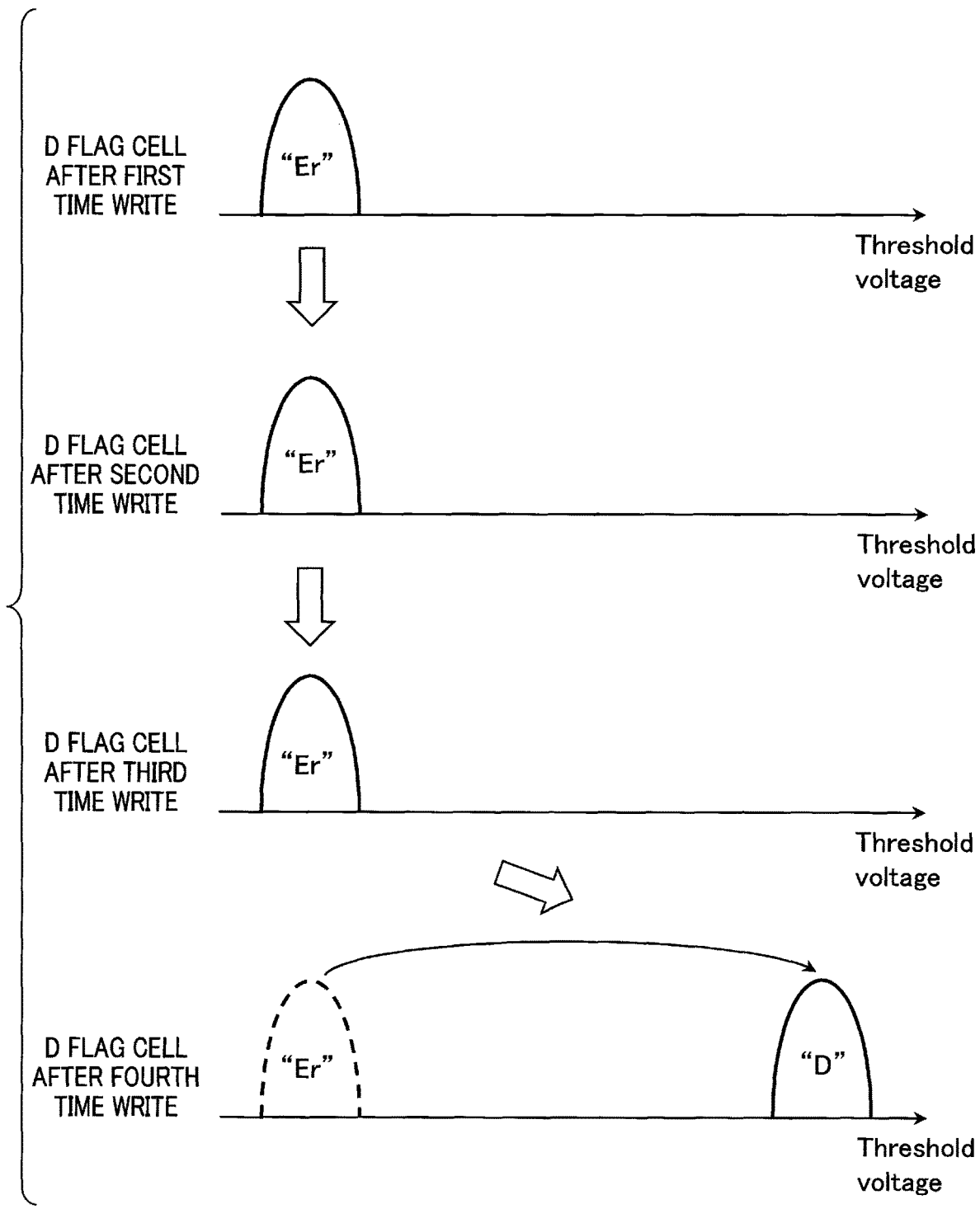
FIG. 53 is a diagram showing a threshold distribution of a D flag cell in the first to fourth times write operations in the SLC write operation corresponding to the four times write operations in the semiconductor memory device according to the third example of the fifth embodiment.

Next, the SLC write operation of a third example will be described. In this example, a case where write data includes a B flag cell corresponding to the second time write operation, a C flag cell corresponding to the third time write operation, and a D flag cell corresponding to the fourth time write operation will be described using FIGS. 51 to 53. FIG. 51 is a diagram showing a threshold distribution of the B flag cell in the first to fourth times write operations. FIG. 52 is a diagram showing a threshold distribution of the C flag cell in the first to fourth times write operations. FIG. 53 is a diagram showing a threshold distribution of the D flag cell in the first to fourth times write operations. Hereinafter, differences from the first and second examples will be mainly described.

The threshold distribution of the write data in this example is the same as that of FIG. 46 of the first example.

Next, the threshold distributions of the B to D flag cells corresponding to the first to fourth times write operations will be described.

As shown in FIG. 51, the threshold distribution of the B flag cell is set from the "Er" level to the "B" level in the second time write operation. In the third and fourth time write operations, the threshold distribution of the B flag cell is maintained at the "B" level. That is, the B flag cell is set to the "Er" level in the first time write operation and set to the "B" level in the second to fourth times write operations.

As shown in FIG. 52, the threshold distribution of the C flag cell is set from the "Er" level to the "C" level in the third time write operation. In the fourth time write operation, the threshold distribution of the C flag cell is maintained at the "C" level. That is, the C flag cell is set to the "Er" level in the first and second times write operations and set to the "C" level in the third and fourth time write operations.

As shown in FIG. 53, the threshold distribution of the D flag cell is set from the "Er" level to the "D" level in the fourth time write operation. That is, the D flag cell is set to the "Er" level in the first to third times write operations and set to the "D" level in the fourth time write operation.

5.6.3.2 SLC Read Operation Corresponding to Four Times Write Operations

Figure 54:
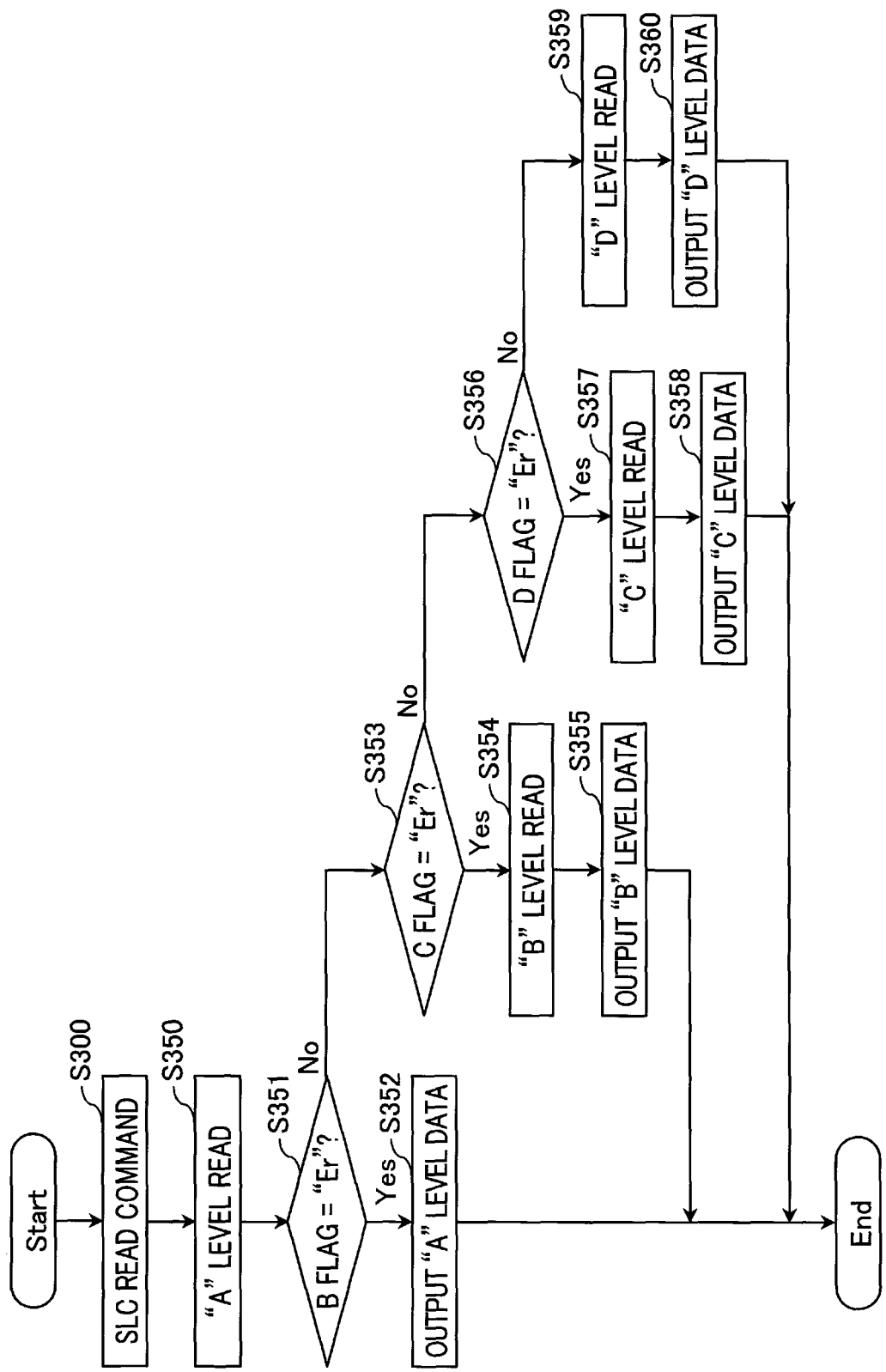
FIG. 54 is a flowchart of the SLC read operation corresponding to the four times write operations in the semiconductor memory device according to the third example of the fifth embodiment.

Next, the SLC read operation corresponding to four times write operations will be described using FIG. 54. FIG. 54 shows a flowchart of the read operation.

As shown in FIG. 54, upon receiving the SLC read command (step S300), the sequencer 14 executes the read operation at the "A" level (step S350).

In the read operation at the "A" level, when the B flag cell is the "Er" level (step S351_Yes), the sequencer 14 outputs the "A" level data (step S352).

In the read operation at the "A" level, when the B flag cell is not the "Er" level (step S311_No), that is, when the B flag cell is the "B" level, the sequencer 14 checks the C flag cell (step S353).

In the read operation at the "A" level, when the C flag cell is the "Er" level (step S353_Yes), the sequencer 14 executes the read operation at the "B" level (step S354).

Upon completion of the read operation at the "B" level, the sequencer 14 outputs the "B" level data (step S355).

In the read operation at the "A" level, when the C flag cell is not the "Er" level (step S353_No), that is, when the C flag cell is the "C" level, the sequencer 14 checks the D flag cell (step S356).

In the read operation at the "A" level, when the D flag cell is the "Er" level (step S356_Yes), the sequencer 14 executes the read operation at the "C" level (step S357).

Upon completion of the read operation at the "C" level, the sequencer 14 outputs the "C" level data (step S358).

In the read operation at the "A" level, when the D flag cell is not the "Er" level (step S356_No), that is, when the D flag cell is the "D" level, the sequencer 14 executes the read operation at the "D" level (step S359).

Upon completion of the read operation at the "D" level, the sequencer 14 outputs the "D" level data (step S360).

5.7 Effects According to the Present Embodiment

The configuration according to the present embodiment can be applied to the first to fourth embodiments.

In addition, with the configuration according to the present embodiment, since data can be written twice or more in the memory cell transistor MT corresponding to the SLC write operation, the number of times of erasing data in the SLC block can be reduced. For example, the number of write/erase cycles in the SLC block can be reduced when 4-bit data is written in the QLC block. Consequently, the number of times that writing can be performed in the SLC block can be increased.

Although the flag cell is used in the examples of the four times write operation, the flag cell can be omitted if the distinction is performed by a command.

Furthermore, for example, in the four times write operations, the sequencer 14 may execute the first time write operation for the memory cell groups MCG corresponding to the word lines WL0 to WL95, and thereafter the second time write operation, the third time write operation, and the fourth time write operation in the same manner as in the first time write operation.

As an example of other case, when "1" data is written in the second time or subsequent write operation, the boost efficiency of the channel of the memory cell transistor MT may be lowered. In this case, the voltage value of VPASS in the second time write operation may be set higher than the voltage value in the first time write operation, the voltage value of VPASS in the third time write operation may be set higher than the voltage value in the second time write operation, and the voltage value of VPASS in the fourth time write operation may be set higher than the voltage value in the third time write operation.

In the case of writing data to a relatively high threshold level, the memory cell transistor MT at, for example, the "Er" level, may be erroneously written at the "A" level or the like. In contrast, according to this embodiment, for example, in the fourth time write operation, "0" data is set to the "D" level, and "1" data is set to the "C" level or lower. Therefore, the erroneous writing can be suppressed.

The verify level in the second time write operation is higher than the verify level in the first time write operation. Therefore, the write voltage VPGM in the second time write operation may be set to a voltage level higher than that in the first time write operation. Similarly, the verify level in the third time write operation is higher than the verify level in the second time write operation. Therefore, the write voltage VPGM in the third time write operation may be set to a voltage level higher than that in the second time write operation. Also, the verify level in the fourth time write operation is higher than the verify level in the third time write operation. Therefore, the write voltage VPGM in the fourth time write operation may be set to a voltage level higher than that in the third time write operation.

Furthermore, the step-up voltages DVPGM of the write voltage may be different in the first to fourth times write operations.

The voltage values of the selected word line WL and the select gate line SGD may be different in the first to fourth times write operations.

In the four times write operations, as well as in the first example and the second example of the data write sequence corresponding to the two times write operations, the sequencer 14 may sequentially select the string units SU0 to SU3 corresponding to one word line WL and execute the write operation. Alternatively, the sequencer 14 may execute a write operation in which one string unit SU is selected and the word lines WL0 to 95 are sequentially selected, then selects another string unit SU and repeats the same operation.

In the present embodiment, the case where data is written twice or four times in the memory cell transistor MT corresponding to the SLC write operation has been described. However, three or five or more times write operations may be executed.

The present invention is not limited to the SLC write operation, and data may be written twice or more in the memory cell transistor MT corresponding to write operation of 2-bit data (hereinafter referred to as an MLC write operation) or write operation of 3-bit data (hereinafter referred to as a TLC write operation).

In addition, in a plurality of data write operations, the SLC write operation, the MLC write operation, and the TLC write operation may be combined. For example, the MLC write operation may be executed first, and the SLC write operation may be executed for the second time and thereafter. Alternatively, for example, the SLC write operation may be executed first, and the MLC write operation or the TLC write operation may be executed for the second time and thereafter.

6. Sixth Embodiment

Next, the sixth embodiment will be described. In the sixth embodiment, a case where a negative voltage is used in a write operation, a read operation, and an erase operation will be described. Hereinafter, differences from the first embodiment will be mainly described.

6.1 Configuration

First, a configuration of a memory system 1 will be described. In the memory system 1 according to the present embodiment, the data conversion circuit 27 and the data recovery controller 19 described in FIG. 1 of the first embodiment are eliminated. Other configurations are similar to those in FIG. 1 of the first embodiment.

6.1.1 Configuration of Memory Cell Array

Next, a configuration of a memory cell array 11 will be described using FIG. 55. Although the example in FIG. 55 shows a block BLK0, the other blocks BLK have the same configurations as the block BLK0.

As shown in FIG. 55, each NAND string NS includes, for example, 64 memory cell transistors MT0 to MT63, dummy memory cell transistors MTDS and MTDD, and select transistors ST1 and ST2. The dummy memory cell transistors MTDS and MTDD have the same configuration as the memory cell transistors MT0 to MT63 but are not used for writing data. Hereinafter, in the case where the memory cell transistors MT0 to MT63 and the dummy memory cell transistors MTDS and MTDD are not limited, they are referred to as a memory cell transistor MT.

The memory cell transistors MT are coupled in series between a source of the select transistor ST1 and a drain of the select transistor ST2. More specifically, current paths of the dummy memory cell transistor MTDS, the memory cell transistors MT0 to MT63, and the dummy memory cell transistor MTDD are coupled in series. A drain of the dummy memory cell transistor MTDD is coupled to the source of the select transistor ST1, and a source of the dummy memory cell transistor MTDS is coupled to the drain of the select transistor ST2.

The memory cell transistors MT0 to MT63 in the block BLK and control gates of the dummy memory cell transistors MTDS and MTDD are commonly coupled to word lines WL0 to WL63, WLDS, and WLDD, respectively. Hereinafter, in the case where the word lines WL0 to WL63, WLDS, and WLDD are not limited, they are referred to as a word line WL.

In the present embodiment, a case where the memory cell transistor MT is an MLC (multi level cell) capable of holding 2-bit data will be described. The 2-bit data held by the MLC is referred to as a "lower bit" and an "upper bit" in order from lower bits. In addition, a collection of the lower bits held by a memory cell group MCG is referred to as a "lower page", and a collection of the upper bits is referred to as an "upper page".

The number of bits of data that the memory cell transistor MT can hold is not limited to 2 bits. The present embodiment can be applied as long as the memory cell transistor MT can hold data of 1 bit or more.

6.1.2 Configuration of Row Decoder

Next, a configuration of a row decoder 16 will be described using FIG. 56. In the following description, unless the source and drain of the transistor are limited, either one of the source and drain of the transistor is referred to as "one end of the transistor", and the other of the source and the drain of the transistor is referred to as "the other end of the transistor".

As shown in FIG. 56, the row decoder 16 includes row decoder units 16-0 to 16-$n$ respectively associated with blocks BLK0 to BLKn. In the example of FIG. 56, details of the row decoder unit 16-0 are shown, but the other row decoder units 16-1 to 16-$n$ have the same configuration.

The row decoder unit 16-0 includes a block decoder 40 and high-withstand-voltage, n-channel enhancement type (E type: the threshold value is positive) MOS transistors 41 (41-0 to 41-63, 41-DS, and 41-DD), 42 (42-0 to 42-3), 43 (43-0 to 43-3), 44 (44-0 to 44-3), and 45 (45-0 to 45-3). All the transistors 41 to 45 are high-breakdown-voltage transistors, and, for example, equal in channel region impurity concentration and threshold voltage.

The block decoder 40 decodes a block address BA. According to the result, voltage is applied to a signal line TG and a signal line RDECn to control on/off states of the transistors 41 to 45.

For example, at the time of writing, reading, or erasing data, when the block address BA matches the corresponding block BLK0, the block decoder 40 applies a voltage (voltage VRDEC) at "H" level to the signal line TG and applies a voltage (for example, ground voltage VSS) at "L" level to the signal line RDECn. On the other hand, when the block address BA does not match the corresponding block BLK0, the block decoder 40 applies a voltage (for example, ground voltage VSS) at the "L" level to the signal line TG and applies a voltage (a voltage at which the transistors 43 and 45 are turned on) at the "H" level to the signal line RDECn. The voltage VRDEC is a voltage for turning on the transistors 41, 42, and 44, and different voltage values are set according to a write operation, a read operation, and an erase operation. The voltage VRDEC is higher than the voltage applied to the transistors 41, 42, and 44 from the driver circuit 15 by at least the threshold voltages of the transistors 41, 42, and 44. For example, the voltage VRDEC is given from the driver circuit 15 to the block decoder 40.

The transistors 41-0 to 41-63, 41-DS, and 41-DD function as switching elements for coupling the driver circuit 15 with the word lines WL0 to WL63, WLDS, and WLDD of the corresponding block BLK, respectively. One ends of the transistors 41-0 to 41-63, 41-DS, and 41-DD are coupled to the respective corresponding word lines WL. The other ends of the transistors 41-0 to 41-63, 41-DS, and 41-DD are coupled to the driver circuit 15. Gates of the transistors 41-0 to 41-63, 41-DS, and 41-DD are commonly coupled to the signal line TG.

The transistors 42-0 to 42-3 function as switching elements for coupling the driver circuit 15 with select gate lines SGD0 to SGD3 of the corresponding block BLK, respectively. One ends of the transistors 42-0 to 42-3 are coupled to the respective corresponding select gate lines SGD0 to SGD3. The other ends of the transistors 42-0 to 42-3 are coupled to the driver circuit 15. Gates of the transistors 42-0 to 42-3 are commonly coupled to the signal line TG.

The transistors 43-0 to 43-3 function as switching elements for coupling, for example, ground voltage (VSS) interconnect or power supply voltage (VDD) interconnect with the select gate lines SGD0 to SGD3 of the corresponding block BLK, respectively. One ends of the transistors 43-0 to 43-3 are coupled to the respective corresponding select gate lines SGD0 to SGD3. The other ends of the transistors 43-0 to 43-3 are coupled to the VSS interconnect or the VDD interconnect. Gates of the transistors 43-0 to 43-3 are commonly coupled to the signal line RDECn.

The transistors 44-0 to 44-3 function as switching elements for coupling the driver circuit 15 with select gate lines SGS0 to SGS3 of the corresponding block BLK, respectively. One ends of the transistors 44-0 to 44-3 are coupled to the respective corresponding select gate lines SGS0 to SGS3. The other ends of the transistors 44-0 to 44-3 are coupled to the driver circuit 15. Gates of the transistors 44-0 to 44-3 are commonly coupled to the signal line TG.

The transistors 45-0 to 45-3 function as switching elements for coupling, for example, the VSS interconnect or the VDD interconnect with the select gate lines SGS0 to SGS3 of the corresponding block BLK, respectively. One ends of the transistors 45-0 to 45-3 are coupled to the respective corresponding select gate lines SGS0 to SGS3. The other ends of the transistors 45-0 to 45-3 are coupled to the VSS interconnect or the VDD interconnect. Gates of the transistors 45-0 to 45-3 are commonly coupled to the signal line RDECn.

In the example of FIG. 56, although the transistors 44-0 to 44-3 and 45-0 to 45-3 are provided corresponding to the select gate lines SGS0 to SGS3 provided for each string unit SU, the present invention is not limited to this case. For example, similarly to the word line WL, in the block BLK, a gate of the select transistor ST2 in each of the string units SU may be commonly coupled to the select gate line SGS. In this case, the transistor 44 and the transistor 45 are provided in the row decoder unit 16-0, corresponding to the select gate line SGS.

6.1.3 Configuration of Block Decoder

Next, a configuration of the block decoder 40 will be described using FIG. 57

As shown in FIG. 57, the block decoder 40 includes a NAND circuit 51, an inverter 52, a high-breakdown-voltage, N-channel E type MOS transistor 53, a high-breakdown-voltage, P-channel E type MOS transistor 54, and a high-withstand-voltage, and N-channel depletion type (D type: the threshold voltage is negative) MOS transistor 55.

The NAND circuit 51 performs a NAND operation of each bit of the block address BA. An output signal of the NAND circuit 51 is transmitted to the signal line RDECn.

The inverter 52 inverts the output of the NAND circuit 51.

One end of the transistor 53 is coupled to an output node of the inverter 52, the other end of the transistor 53 is coupled to the signal line TG, and a signal BSTON is inputted to a gate of the transistor 53. The signal BSTON is a signal to be asserted (to "H" level) when receiving address information of the block decoder 40, and supplied by, for example, the sequencer 14.

One end of the transistor 54 is coupled to the signal line TG, and the other end is coupled to a back gate. The signal line RDECn is coupled to a gate of the transistor 54.

The voltage VRDEC is applied to one end of the transistor 55. The other end of the transistor 55 is coupled to the other end of the transistor 54, and a gate of the transistor 55 is coupled to the signal line TG.

In the write operation, the read operation, and the erase operation, when the block address BA matches the corresponding block BLK, the NAND circuit 51 outputs a signal at the "L" level. That is, the voltage at the "L" level of the signal line RDECn is applied. The inverter 52 inverts the output signal of the NAND circuit 51 and outputs a signal at the "H" level. The transistor 53 is turned on by receiving the signal BSTON at the "H" level. The transistors 54 and 55 are turned on to apply the voltage VRDEC at the "H" level to the signal line TG.

On the other hand, when the block address BA does not match the corresponding block BLK, the NAND circuit 51 outputs a signal at the "H" level. That is, the voltage at the "H" level is applied to the signal line RDECn. The transistors 54 and 55 are turned off, and the voltage at the "L" level is applied to the signal line TG.

6.1.4 Configuration of Data Register and Sense Amplifier

Next, a configuration of a data register 17 and a sense amplifier 18 will be described using FIGS. 58 and 59.

As shown in FIG. 58, the sense amplifier 18 includes a plurality of sense amplifier units SAU provided for each bit line BL. Then, the data register 17 includes a plurality of latch circuits XDL provided for each of the sense amplifier units SAU.

The sense amplifier unit SAU includes, for example, a sense amplifier circuit SA and latch circuits SDL, ADL, and BDL. The latch circuit XDL, the sense amplifier circuit SA, and the latch circuits SDL, ADL, and BDL are coupled so as to be capable of transmitting and receiving data to and from each other.

The sense amplifier circuit SA senses read data on the corresponding bit line BL during the read operation and judges whether the read data is "0" or "1". Further, the sense amplifier circuit SA applies a voltage to the bit line BL during the write operation, based on write data.

The latch circuits SDL, ADL, and BDL temporarily hold read data and write data. The read data determined by the sense amplifier circuit SA during the read operation and the write data transferred to the latch circuit XDL during the write operation are transferred to any of the latch circuits SDL, ADL, and BDL, for example.

The latch circuit XDL is used in input and output of data between the sense amplifier unit SAU and a controller 20. That is, the data received from the controller 20 is transferred to the latch circuit SDL, ADL, or BDL or the sense amplifier circuit SA through the latch circuit XDL. The data of the latch circuit SDL, ADL, BDL, or BDL or the sense amplifier circuit SA is transferred to the controller 20 through the latch circuit XDL.

The configuration of the sense amplifier unit SAU is not limited thereto and may be variously changed. For example, the number of latch circuits included in the sense amplifier unit SAU is designed based on the number of bits of data held by the memory cell transistor MT.

Next, a configuration of the sense amplifier circuit SA will be described.

As shown in FIG. 59, the sense amplifier circuit SA includes high-breakdown-voltage, N-channel MOS transistors 60 to 62, a low-breakdown-voltage, P-channel MOS transistor 63, and a level shifter 64.

A signal BLS is input to a gate of the transistor 60. One end of the transistor 60 is coupled to the corresponding bit line BL, and the other end of the transistor 60 is coupled to a node SCOM. The transistor 60 functions as a clamp transistor that clamps voltage related to the bit line BL according to a signal BLC.

A gate of a transistor 61 is coupled to an output terminal of the level shifter 64. One end of the transistor 61 is coupled to the node SCOM, and the other end of the transistor 61 is coupled to a node SRCGND. In the present embodiment, for example, the ground voltage VSS or a negative voltage VBB (<0 V) is applied to the node SRCGND.

A control signal BLX is input to a gate of the transistor 62. One end of the transistor 62 is coupled to the node SCOM, and the other end of the transistor 62 is coupled to a node SSRC.

A gate of the transistor 63 is coupled to a node INV. A voltage VBIT is applied to one end of the transistor 63, and the other end of the transistor 63 is coupled to the node SSRC. The voltage VBIT is a power supply voltage supplied to the sense amplifier circuit SA, and, for example, a power supply voltage VDD is applied. The node INV is coupled to the latch circuit SDL. The latch circuit SDL holds inverted data of held data with the node INV.

An input terminal of the level shifter 64 is coupled to the node INV. The level shifter 64 converts and outputs the voltage of the node INV, under the control of the sequencer 14. For example, when the negative voltage VBB is applied to the node SRCGND and the voltage at the "L" level (for example, the voltage VSS) is applied to the node INV, the level shifter 64 outputs the negative voltage VBB to turn off the transistor 61.

6.1.5 Cross-Sectional Configuration of Memory Cell Array and Semiconductor Substrate Next, a cross-sectional configuration of the memory cell array 11 and a semiconductor substrate will be described using FIG. 60. In the example of FIG. 60, an interlayer insulating film is omitted.

As shown in FIG. 60, N-well regions 71a, 71b, 71c, and 71d and a P-well region 72c are formed near the surface of a P-type semiconductor substrate 70.

The memory cell array 11 is provided on the N-well region 71a. A P-well region 72a is formed near the surface of the N-well region 71a, and an $N^+$ diffusion layer 73 is formed in a part of the vicinity of the surface of the P-well region 72a. Above the semiconductor substrate 70, a plurality of interconnect layers functioning as the select gate line SGS, the word lines WLDS, WL0 to WL63, and WLDD and the select gate line SGD from lower layers are stacked with an interlayer insulating film (not shown) interposed therebetween, and a memory pillar MP penetrating through these interconnect layers and having a bottom surface reaching the $N^+$ diffusion layer 73 is formed. The memory pillar MP corresponds to the NAND string NS. An insulating layer 90 is formed on a side surface of the memory pillar MP and includes a semiconductor layer 91 having a bottom surface in contact with the $N^+$ diffusion layer 73. More specifically, as the insulating layer 90, an insulating layer functioning as a block insulating film, an insulating layer functioning as a charge storage layer, and an insulating layer functioning as a tunnel insulating film are stacked in that order from the side surface of the memory pillar MP.

In the N-well region 71b, for example, a high-breakdown-voltage, N-channel MOS transistor 76 (reference symbol "HV NMOS") used for, for example, the row decoder 16, the sense amplifier 18, and the like is formed. More specifically, a P-well region 72b and the $N^+$ diffusion layer 73 are formed near the surface of the N-well region 71b. The transistor 76 is formed on the P-well region 72b. A $P^+$ diffusion layer 74 is formed near the surface of the P-well region 72b, and, for example, the $P^+$ diffusion layer 74 is used for applying voltage to a back gate of the transistor 76. The transistor 76 includes the $N^+$ diffusion layer 73 and a gate electrode 75 which function as a source or a drain.

In the P-well region 72c, a low-breakdown-voltage, N-channel MOS transistor 77 (reference symbol "LV NMOS") used for peripheral circuits (for example, a command register 12, an address register 13, the sequencer 14, the driver circuit 15, the row decoder 16, the data register 17, the sense amplifier 18, and the like) is formed. More specifically, the transistor 77 is formed on the P-well region 72c. The $P^+$ diffusion layer 74 is formed near the surface of the P-well region 72c, and, for example, the $P^+$ diffusion layer 74 is used for applying voltage to a back gate of the transistor 77. The transistor 77 includes the $N^+$ diffusion layer 73 and the gate electrode 75 which function as a source or a drain.

In the N-well region 71c, a low-breakdown-voltage, P-channel MOS transistor 78 (reference symbol "LV PMOS") used for a peripheral circuit is formed. More specifically, the transistor 78 is formed on the N-well region 71c. The $N^+$ diffusion layer 73 is formed near the surface of the N-well region 71c, and, for example, the $N^+$ diffusion layer 73 is used for applying voltage to a back gate of the transistor 78. The transistor 78 includes the $P^+$ diffusion layer 74 and the gate electrode 75 which function as a source or a drain.

In the N-well region 71d, for example, a high-breakdown-voltage, P-channel MOS transistor 79 (reference symbol "HV PMOS") used for, for example, the row decoder 16, the sense amplifier 18, and the like is formed. More specifically, the transistor 79 is formed on the N-well region 71d. The $N^+$ diffusion layer 73 is formed near the surface of the N-well region 71d, and, for example, the $N^+$ diffusion layer 73 is used for applying voltage to a back gate of the transistor 79. The transistor 79 includes the $P^+$ diffusion layer 74 and the gate electrode 75 which function as a source or a drain.

The thicknesses of gate oxide films (not shown) of the transistors 76 to 79 may be different from each other.

6.2 Voltage of Well Region in Erase Operation, Write Operation, and Read Operation Next, the voltages of the N-well regions 71a to 71d and the P-well regions 72a to 72c in the erase operation, the write operation, and the read operation will be described using FIG. 61

First, the voltage of the well region in the erase operation will be described as shown in FIG. 61.

A voltage VERA is applied to the P-well region 72a and the N-well region 71a where the memory cell array 11 is formed. The voltage VERA is a high voltage applied to a source line SL of the memory cell transistor MT when an erase pulse is applied.

The negative voltage VBB is applied to the P-well region 72b where the high-breakdown-voltage, N-channel MOS transistor 76 (for example, the transistors 41 to 45) used for the row decoder 16 and the like is formed, and the voltage VSS is applied to the N-well region 71b.

The voltage VSS is applied to the P-well region 72c where the low-breakdown-voltage, N-channel MOS transistor 77 used for a peripheral circuit is formed.

The voltage VDD is applied to the N-well region 71c where the low-breakdown-voltage, P-channel MOS transistor 78 used for a peripheral circuit is formed.

A voltage VERAH or |−VthD| is applied to the N-well region 71d where the high-breakdown-voltage, P-channel MOS transistor 79 (for example, the transistor 54) used for the block decoder 40 and the like is formed. For example, in FIG. 56, the voltage VERAH turns on the high-breakdown-voltage, N-channel MOS transistor to transfer a predetermined voltage (such as voltage VERASGD) to the word lines WLDD and WLDS, the select gate lines SGD and SGS, and the like.

In the block decoder 40 corresponding to the selected block BLK, the voltage VERAH is applied to the N-well region 71d of the high-breakdown-voltage, P-channel MOS transistor 79 (for example, the transistor 54). On the other hand, in the block decoder 40 corresponding to the unselected block BLK, the voltage |−VthD| corresponding to the threshold voltage of the high-breakdown-voltage, N-channel D type MOS transistor 55 is applied to the N-well region 71d of the high-breakdown-voltage, P-channel MOS transistor 79 (for example, the transistor 54).

The voltage VSS is applied to the P-well region 72b where the high-breakdown-voltage, N-channel MOS transistor 76 (for example, the transistors 60, 61, and 62) used for the sense amplifier unit SAU and the like is formed, and the N-well region 71b.

Next, the voltage of the well region in the write operation will be described. The write operation in the present embodiment has two operation modes according to a normal operation mode and a negative voltage operation mode, and the voltage of the well region is different according to the operation mode. The operation mode will be described in detail.

In the normal operation mode, the voltage VSS is applied to the P-well region 72a where the memory cell array 11 is formed, and in the negative voltage operation mode, the negative voltage VBB is applied to the P-well region 72a. Alternatively, the voltage VSS is applied to the N-well region 71a.

In the normal operation mode, the voltage VSS is applied to the P-well region 72b where the high-breakdown-voltage, N-channel MOS transistor 76 used for the row decoder 16 and the like is formed, and in the negative voltage operation mode, the negative voltage VBB is applied to the P-well region 72b. The voltage VSS is applied to the N-well region 71b.

The voltage VSS is applied to the P-well region 72c where the low-breakdown-voltage, N-channel MOS transistor 77 used for a peripheral circuit is formed.

The voltage VDD is applied to the N-well region 71c where the low-breakdown-voltage, P-channel MOS transistor 78 used for a peripheral circuit is formed.

A voltage VPGMH or |−VthD| is applied to the N-well region 71d where the high-breakdown-voltage, P-channel MOS transistor 79 (for example, the transistor 54) used for the block decoder 40 and the like is formed. For example, the voltage VPGMH is larger than the voltage VPGM and, in FIG. 56, turns on the high-breakdown-voltage, N-channel MOS transistor to transfer a predetermined voltage (such as voltage VPGM) to the word lines WLDD and WLDS, the select gate lines SGD and SGS, and the like.

In the block decoder 40 corresponding to the selected block BLK, the voltage VPGMH is applied to the N-well region 71d of the high-breakdown-voltage, P-channel MOS transistor 79 (for example, the transistor 54). On the other hand, in the block decoder 40 corresponding to the unselected block BLK, the voltage |−VthD| corresponding to the threshold voltage of the high-breakdown-voltage, N-channel D type MOS transistor 55 is applied to the N-well region 71d of the high-breakdown-voltage, P-channel MOS transistor 79 (for example, the transistor 54).

In the normal operation mode, the voltage VSS is applied to the P-well region 72b where the high-breakdown-voltage, N-channel MOS transistor 76 used for the sense amplifier unit SAU and the like is formed, and in the negative voltage operation mode, the negative voltage VBB is applied to the P-well region 72b. The voltage VSS is applied to the N-well region 71b.

Next, the voltage of the well region in the read operation will be described.

The voltage VSS is applied to the P-well region 72a and the N-well region 71a where the memory cell array 11 is formed.

The negative voltage VBB is applied to the P-well region 72b where the high-breakdown-voltage, N-channel MOS transistor 76 used for the row decoder 16 and the like is formed, and the voltage VSS is applied to the N-well region 71b.

The voltage VSS is applied to the P-well region 72c where the low-breakdown-voltage, N-channel MOS transistor 77 used for a peripheral circuit is formed.

The voltage VDD is applied to the N-well region 71c where the low-breakdown-voltage, P-channel MOS transistor 78 used for a peripheral circuit is formed.

A voltage VREADH or the voltage |−VthD| is applied to the N-well region 71d where the high-breakdown-voltage, P-channel MOS transistor 79 (for example, the transistor 54) used for the block decoder 40 and the like is formed. For example, the voltage VREADH is larger than the voltage VREAD and, in FIG. 56, turns on the high-breakdown-voltage, N-channel MOS transistor to transfer a predetermined voltage (such as voltage VREAD) to the word lines WLDD and WLDS, the select gate lines SGD and SGS, and the like.

In the block decoder 40 corresponding to the selected block BLK, the voltage VREADH is applied to the N-well region 71d of the high-breakdown-voltage, P-channel MOS transistor 79 (for example, the transistor 54). On the other hand, in the block decoder 40 corresponding to the unselected block BLK, the voltage |−VthD| corresponding to the threshold voltage of the high-breakdown-voltage, N-channel D type MOS transistor 55 is applied to the N-well region 71d of the high-breakdown-voltage, P-channel MOS transistor 79 (for example, the transistor 54).

The voltage VSS is applied to the P-well region 72b where the high-breakdown-voltage, N-channel MOS transistor 76 used for the sense amplifier unit SAU and the like is formed, and the N-well region 71b.

6.3 Threshold Distribution of Memory Cell Transistor MT

Next, a threshold distribution of the memory cell transistor MT will be described using FIG. 62.

As shown in FIG. 62, when the memory cell transistor MT holds 2-bit data, a distribution of a threshold voltage thereof is divided into four segments. The four threshold distributions are referred to as "Er" level, "A" level, "B" level, and "C" level in ascending order of the threshold voltage. In the present embodiment, the threshold distributions at the "Er" level and the "A" level are provided on the negative voltage side, and the threshold distributions at the "B" level and the "C" level are provided on the positive voltage side. Voltages of read levels corresponding respectively to the "A" level, the "B" level, and the "C" level are voltages VRA, VRB, and VRC. On the other hand, voltages of verify levels corresponding respectively to the "A" level, the "B" level, and the "C" level are voltages VA, VB, and VC. The voltages VRA and VA are negative voltages and, for example, high voltages equal to or higher than the negative voltage VBB. The voltages VRB and VB are voltages around 0 V. The voltages VRC and VC are positive voltages. The relationship between the voltages VRA to VRC, VA to VC, and VREAD satisfies VRA<VA<VRB<VB<VRC<VC<VREAD.

6.4 Read Operation

The read operation will be described. In the present embodiment, for example, a case where 2-page data, that is, reading of the "Er" level to the "A" level is collectively performed will be described.

Next, the voltage of the word line WL during the read operation will be described using FIG. 63.

As shown in FIG. 63, when the read operation at the "A" level is performed in a period from a time t0 to a time t1, the voltage VREAD is applied to the unselected word line WL, and the voltage VRA as the negative voltage is applied to the selected word line WL. At this time, the memory cell transistor MT holding the data at the "Er" level is turned on, and the memory cell transistor MT holding the data at the "A" level to the "C" level is turned off.

When the read operation at the "B" level is performed in a period from the time t1 to a time t2, the voltage VREAD is applied to the unselected word line WL, and the voltage VRB is applied to the selected word line WL. At this time, the memory cell transistor MT holding the data at the "Er" level and the "A" level is turned on, and the memory cell transistor MT holding the data at the "B" level and the "C" level is turned off.

When the read operation at the "C" level is performed in a period from the time t2 to a time t3, the voltage VREAD is applied to the unselected word line WL, and the voltage VRC is applied to the selected word line WL. At this time, the memory cell transistor MT holding the data at the "Er" level to the "B" level is turned on, and the memory cell transistor MT holding the data at the "C" level is turned off.

6.5 Erase Operation

An erase operation will be described. The erase operation roughly includes an erase pulse applying operation and an erase verify operation. The erase pulse applying operation is an operation of applying an erase pulse to lower the threshold voltage of the memory cell transistor MT. The erase verify operation is an operation of determining whether or not the threshold voltage of the memory cell transistor MT has become lower than a target value as a result of applying the erase pulse. By repeating a combination of the erase pulse applying operation and the erase verify operation, the threshold voltage of the memory cell transistor MT is lowered to the "Er" level, that is, lower than the voltage VRA.

Next, the voltage of each interconnect during the erase pulse applying operation will be described using FIG. 64. In the following example, the case of performing the erase operation on the block BLK0 will be described, but the same applies to the other blocks BLK.

As shown in FIG. 64, at the time t0, the block decoder 40 of the row decoder unit 16-0 corresponding to the selected block BLK (block BLK0) applies the voltage VERAH as the voltage VRDEC at the "H" level to the signal line TG and applies, for example, the voltage VSS as the voltage at the "L" level to the signal line RDECn. As a result, the transistors 41, 42, and 44 in the row decoder unit 16-0 are turned on, and the transistors 43 and 45 are turned off. As a result, the row decoder unit 16-0 applies the voltage VERASGD to the select gate lines SGD (SGD0 to SGD3) and SGS (SGS0 to SGS3) and applies the negative voltage VBB to the word lines WL (WL0 to WL63, WLDS, and WLDD). The voltage VERASGD is a high voltage for generating a GIDL (gate induced drain leakage) current by turning on the select transistors ST1 and ST2, and has a relationship of VERA>VERASGD. The voltage VERAH and the voltage VERASGD are in a relationship of VERAH>VERASGD. At this time, the negative voltage VBB is applied to the P-well region 72b where the transistors 41 to 45 of the row decoder unit 16-0 are formed.

The row decoder unit 16-0 applies the voltage VERASGD to one of the select gate lines SGD (SGD0 to SGD3) and SGS (SGS0 to SGS3), and the corresponding select transistor ST1 or ST2 may be turned on.

In addition, the voltage applied to the word line WL is not limited to the negative voltage VBB. Since the negative voltage VBB is applied to the P-well region 72b where the transistor 41 in the row decoder 16 is formed, the voltage applied to the word line WL may be a negative voltage equal to or higher than the negative voltage VBB. That is, a relationship of VBB S the voltage of the word line WL<0 V may be satisfied.

The block decoder 40 of the row decoder units 16-1 to 16-n corresponding to the unselected block BLK (blocks BLK1 to BLKn) applies, for example, the voltage VSS as the voltage at the "L" level to the signal line TG and applies, for example, the voltage VDD as the voltage at the "H" level to the signal line RDECn. As a result, the transistors 41, 42, and 44 in the row decoder unit 16-0 are turned off, and the transistors 43 and 45 are turned on. At this time, the voltage VDD is applied to each end of the transistors 43 and 45. As a result, the row decoder units 16-1 to 16-n put the word line WL in a floating state and apply a voltage (VDD−Vth) (Vth is the threshold voltage of the transistors 43 and 45) to the select gate lines SGD and SGS. The P-well regions 72b where the transistors 41 to 45 of the row decoder units 16-0 to 16-n are formed are separated from each other, and, for example, the voltage VSS may be applied to the P-well regions 72b where the transistors 41 to 45 of the row decoder units 16-1 to 16-n are formed.

At the time t1, the voltage VERA is applied to the source line SL. Then, the voltages of the select gate lines SGD and SGS of the unselected block BLK and the word line WL increase to a voltage VCPLG due to coupling with the source line SL. The voltage VCPLG is higher than the voltage (VDD−Vth). The coupling voltages VCPLG in the select gate lines SGD and SGS and the word line WL may be the same or different from each other.

When the voltage of the source line SL reaches the voltage VERA at the time t2, in the selected block BLK, according to a potential difference between the voltage VERA and the negative voltage VBB applied to the word line WL, electrons are extracted from the charge storage layer of the memory cell transistor MT coupled to the word line WL (or holes are supplied to the charge storage layer), and data is erased.

At the time t3, the voltage VSS is applied to the source line SL. As a result, the voltages of the select gate lines SGD and SGS of the unselected block BLK fall to the voltage (VDD−Vth), and the voltage of the word line WL decreases to the voltage VSS.

At time t4, the row decoder unit 16-0 of the selected block BLK applies the voltage VSS to the word line WL.

At time t5, a recovery process is performed, and the erase pulse application operation is completed.

6.6 Write Operation

Next, the write operation will be described. In the present embodiment, in a program operation, an operation of increasing the threshold voltage is referred to as "0" writing or simply referred to as writing. On the other hand, an operation of maintaining the threshold voltage is referred to as "1" writing or non-writing. Hereinafter, the bit line corresponding to the "0" writing is referred to as BL ("0"), and the bit line corresponding to the "1" writing is referred to as BL ("1").

The write operation in the present embodiment includes two operation modes, a normal operation mode and a negative voltage operation mode. The normal operation mode is an operation mode in which the voltage applied to each interconnect is equal to or higher than the voltage VSS, and the negative voltage operation mode is an operation mode in which the voltage applied to each interconnect is equal to or higher than the negative voltage VBB.

6.6.1 Voltage of Each Interconnect During Program Operation

Next, the voltage of each interconnect during the program operation will be described.

6.6.1.1 Voltage of Each Interconnect in Normal Operation Mode

First, the voltage of each interconnect in the normal operation mode will be described using FIG. 65. In the following example, the case where the string unit SU0 of the block BLK0 is selected will be described, but the same applies to the other blocks BLK and the other string units SU.

Figure 65:
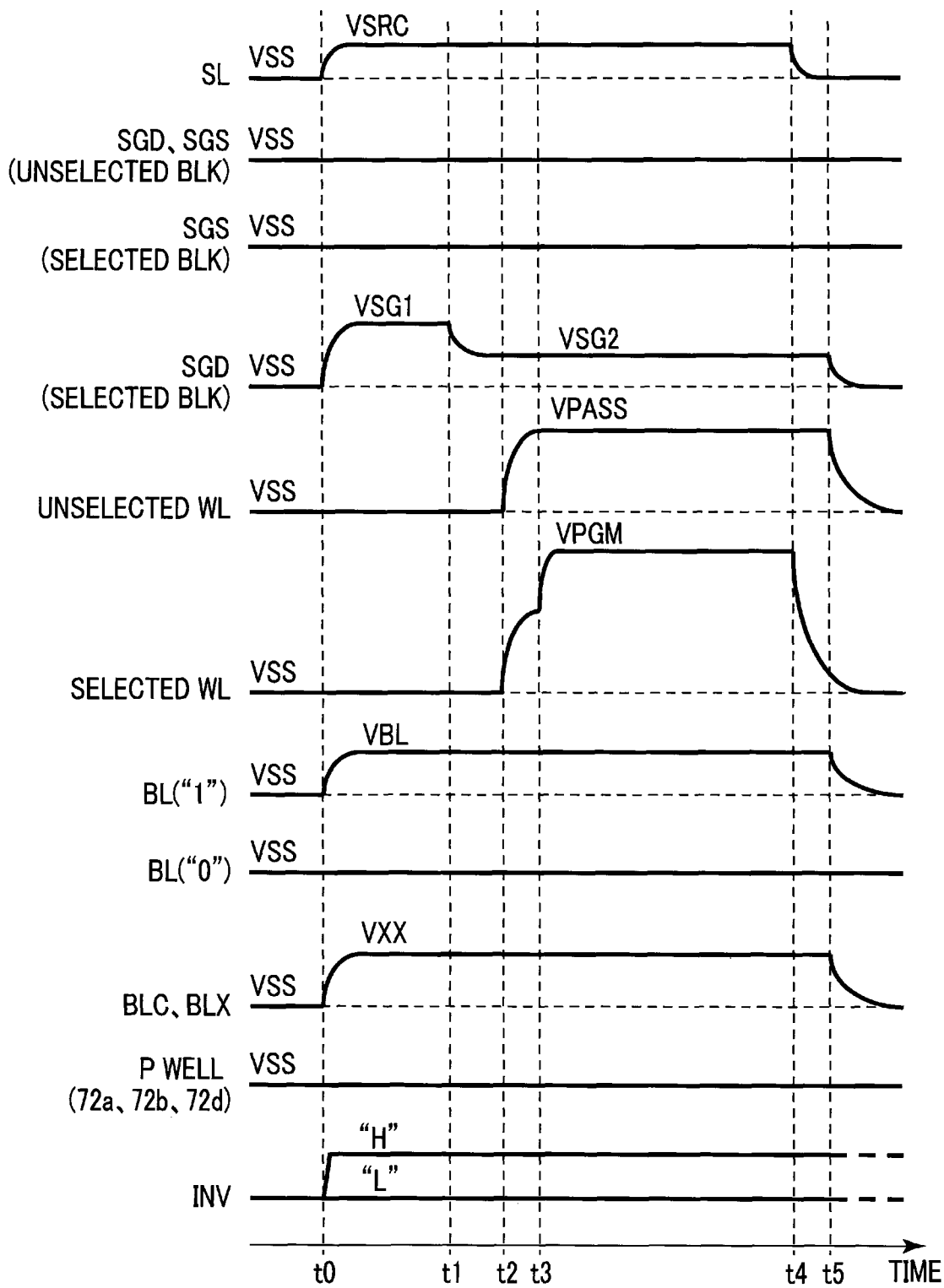
FIG. 65 is a timing chart showing the voltage of each interconnect in a normal operation mode in the semiconductor memory device according to the sixth embodiment.

As shown in FIG. 65, when data at the "H" level is held in the node INV in the sense amplifier unit SAU, the "0" writing is to be applied, and when data at the "L" level is held, the "1" writing is to be applied.

At the time t0, a voltage VSRC is applied to the source line SL. The voltage VSRC is higher than the voltage VSS.

The row decoder units 16-1 to 16-n corresponding to the unselected blocks BLK1 to BLKn apply the voltage VSS to the select gate lines SGD and SGS, and turn off the corresponding select transistors ST1 and ST2.

The row decoder unit 16-0 corresponding to the selected block BLK0 applies the voltage VSS to the select gate lines SGS0 to SGS3. As a result, the select transistors ST2 of string units SU0 to SU3 are turned off. Further, the row decoder unit 16-0 applies a voltage VSG1 to the select gate line SGD0 corresponding to the selected string unit SU0 and applies the voltage VSS to the select gate lines SGD1 to SGD3 corresponding to the unselected string units SU1 to SU3. The voltage VSG1 is a voltage that turns on the select transistor ST1 regardless of the voltage of the corresponding bit line BL. As a result, the select transistor ST1 of the selected string unit SU0 is turned on, and the select transistor ST1 of the unselected string units SU1 to SU3 is turned off.

The sense amplifier 18 applies the voltage VBL to the bit line BL ("1") and applies the voltage VSS to the bit line BL ("0"). The voltage VBL is higher than the voltage VSS. More specifically, in the sense amplifier circuit SA, a voltage VXX is applied as the voltage at the "H" level as the signals BLC and BLX. The voltage VXX is higher than the voltage VSS. At this time, when the node INV holds the voltage at the "L" level, the transistor 61 is turned off, and the transistor 63 is turned on. Thus, in the transistors 62 and 60, the voltage VBL obtained by clamping the voltage VBIT with the voltage VXX is applied to the bit line BL ("1"). That is, a relationship between the voltage VBL and the voltage VXX satisfies VBL=VXX−Vthn (Vthn is the threshold voltage of the transistors 60 and 62). However, the voltage VBIT may be transferred to the bit line BL such that the voltage VXX is a voltage equal to or higher than a voltage (VBIT+Vth). When the node INV holds the voltage at the "H" level, the transistor 61 is turned on, and the transistor 63 is turned off. Thus, the voltage VSS of the node SRCGND is applied to the bit line BL ("0").

Thus, in the selected string unit SU0, the voltage VBL is applied to a channel of the NAND string NS corresponding to the bit line BL ("1"), and the voltage VSS is applied to the channel of the NAND string NS corresponding to the bit line BL ("0").

Since voltages equal to or higher than the voltage VSS are applied to the source line SL, the select gate lines SGD and SGS, the word line WL, and the bit lines BL ("0") and BL ("1"), the voltage VSS is applied to the P-well regions 72a, 72b, and 72d.

At the time t1, the row decoder unit 16-0 applies a voltage VSG2 to the select gate line SGD0 of the selected string unit SU0. The voltage VSG2 is a voltage that brings the select transistor ST1 corresponding to the bit line BL ("1") into a cutoff state and turns on the select transistor ST1 corresponding to the bit line BL ("0"). Thus, for example, a relationship between the voltages VSG1 and VSG2 and the voltage VBL satisfies (VSG1−Vths)>VBL>(VSG2−Vths) (the voltage Vths is the threshold voltage of the select transistor ST1). As a result, the channel of the NAND string NS of the selected string unit SU0 to which the bit line BL ("1") is coupled is brought into the floating state.

At the time t2, the row decoder unit 16-0 applies a voltage VPASS to the word line WL. The voltage VPASS is a voltage that turns on the corresponding memory cell transistor MT regardless of the threshold voltage of the memory cell transistor MT.

At the time t3, the row decoder unit 16-0 applies the voltage VPGM to the selected word line WL.

In the NAND string NS corresponding to the bit line BL ("0"), the select transistor ST1 is turned on. Thus, the potential of the channel of the memory cell transistor MT is maintained at VSS. Thus, the potential difference (VPGM−VSS) between the control gate and the channel becomes large, so that electrons are injected into the charge storage layer, and the threshold voltage of the memory cell transistor MT increases.

In the NAND string NS corresponding to the bit line BL ("1"), the select transistor ST1 is in the cutoff state. Thus, a channel potential increases due to capacitive coupling with the selected word line WL. Thus, the potential difference between the control gate and the channel becomes small. As a result, little electrons are injected into the charge storage layer, and the threshold voltage of the memory cell transistor MT is maintained.

At the time t4, the row decoder unit 16-0 applies the voltage VSS to the selected word line WL. The voltage VSS is applied to the source line SL.

At the time t5, the recovery process is performed, and the program operation in the normal operation mode is completed.

6.6.1.2 Voltage of Each Interconnect in Negative Voltage Operation Mode

Figure 66:
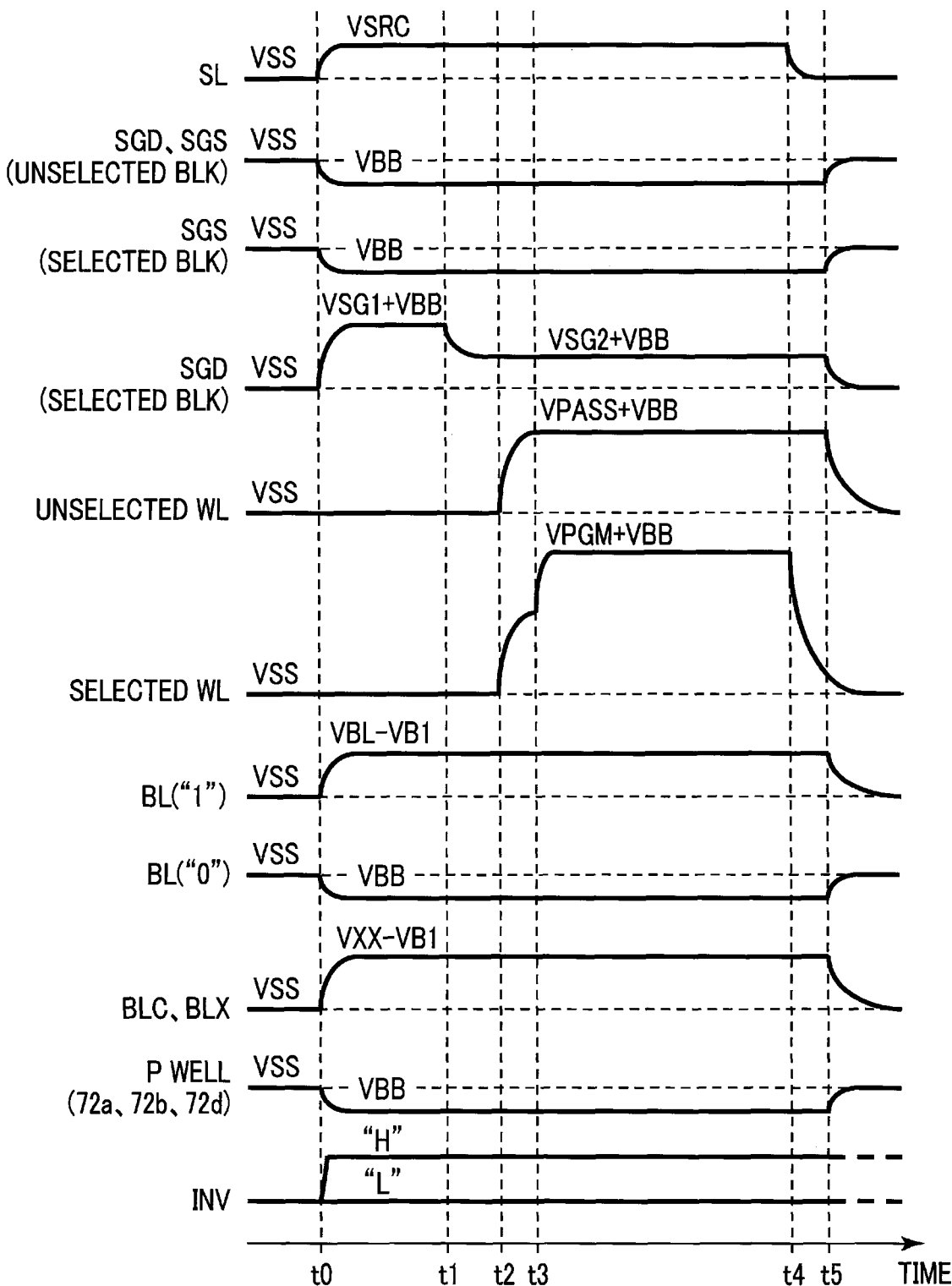
FIG. 66 is a timing chart showing the voltage of each interconnect in a negative voltage operation mode in the semiconductor memory device according to the sixth embodiment.

Next, the voltage of each interconnect in the negative voltage operation mode will be described using FIG. 66. In the example of FIG. 66, the voltages of the select gate lines SGD and SGS, the word line, and the bit lines BL ("0") and BL ("1") are all low with respect to FIG. 65 (the voltages are shifted to the negative voltage side). Hereinafter, differences from FIG. 65 will be mainly described.

As shown in FIG. 66, at the time t0, the voltage VSRC is applied to the source line SL. As the voltage VSRC, a voltage lower than that in the normal operation mode may be set.

The row decoder units 16-1 to 16-$n$ corresponding to the unselected blocks BLK1 to BLKn apply the negative voltage VBB to the select gate lines SGD and SGS, and turn off the corresponding select transistors ST1 and ST2.

The row decoder unit 16-0 corresponding to the selected block BLK0 applies the negative voltage VBB to the select gate lines SGS0 to SGS3. As a result, the select transistors ST2 of string units SU0 to SU3 are turned off. Further, the row decoder unit 16-0 applies a voltage (VSG1+VBB) lower than the voltage VSG1 to the select gate line SGD0 corresponding to the selected string unit SU0 and applies the negative voltage VBB to the select gate lines SGD1 to SGD3 corresponding to the unselected string units SU1 to SU3, whereby the select transistor ST1 of the selected string unit SU0 is turned on, and the select transistor ST1 of the unselected string units SU1 to SU3 is turned off.

The sense amplifier 18 applies a voltage (VBL−VB1) lower than the voltage VBL to the bit line BL ("1") and applies the negative voltage VBB to the bit line BL ("0"). The relationship between the voltage VB1 and the negative voltage VBB satisfies VBB≤(−VB1)≤0. At this time, in the sense amplifier circuit SA, a voltage (VXX−VB1) is applied as the voltage at the "H" level to the signals BLC and BLX. However, the voltage VBIT may be transferred to the bit line BL such that the voltage (VXX−VB1) is a voltage equal to or higher than the voltage (VBIT+Vth).

The voltage applied to the bit line BL ("0") is not limited to the negative voltage VBB. Since the negative voltage VBB is applied to the P-well region 72$b$ where the transistors 60 to 62 in the sense amplifier circuit SA are formed, the voltage applied to the bit line BL ("0") may be a negative voltage equal to or higher than the negative voltage VBB.

Thus, in the selected string unit SU0, the voltage (VBL−VB1) is applied to the channel of the NAND string NS corresponding to the bit line BL ("1"), and the negative voltage VBB is applied to the channel of the NAND string NS corresponding to the bit line BL ("0").

Since voltages equal to or higher than the negative voltage VBB are applied to the source line SL, the select gate lines SGD and SGS, the word line WL, and the bit line BL, the negative voltage VBB is applied to the P-well regions 72$a$, 72$b$, and 72$d$.

At the time t1, the row decoder unit 16-0 applies a voltage (VSG2+VBB) lower than the voltage VSG2 to the select gate line SGD0 of the selected string unit SU0. As a result, the channel of the NAND string NS of the selected string unit SU0 to which the bit line BL ("1") is coupled is brought into the floating state.

At the time t2, the row decoder unit 16-0 applies a voltage (VPASS+VBB) lower than the voltage VPASS to the word line WL.

At the time t3, the row decoder unit 16-0 applies a voltage (VPGM+VBB) lower than the voltage VPGM to the selected word line WL.

As a result, the threshold voltage of the memory cell transistor MT increases in the NAND string NS corresponding to the bit line BL ("0"), and the threshold voltage of the memory cell transistor MT is maintained in the NAND string NS corresponding to the bit line BL ("1").

At the time t4, the row decoder unit 16-0 applies the voltage VSS to the selected word line WL. The voltage VSS is applied to the source line SL.

At the time t5, the recovery process is performed, and the program operation in the negative voltage operation mode is completed.

6.6.2 Overall Flow of Write Operation

Next, two examples of the overall flow of the write operation are shown.

6.6.2.1 First Example

Figure 67:
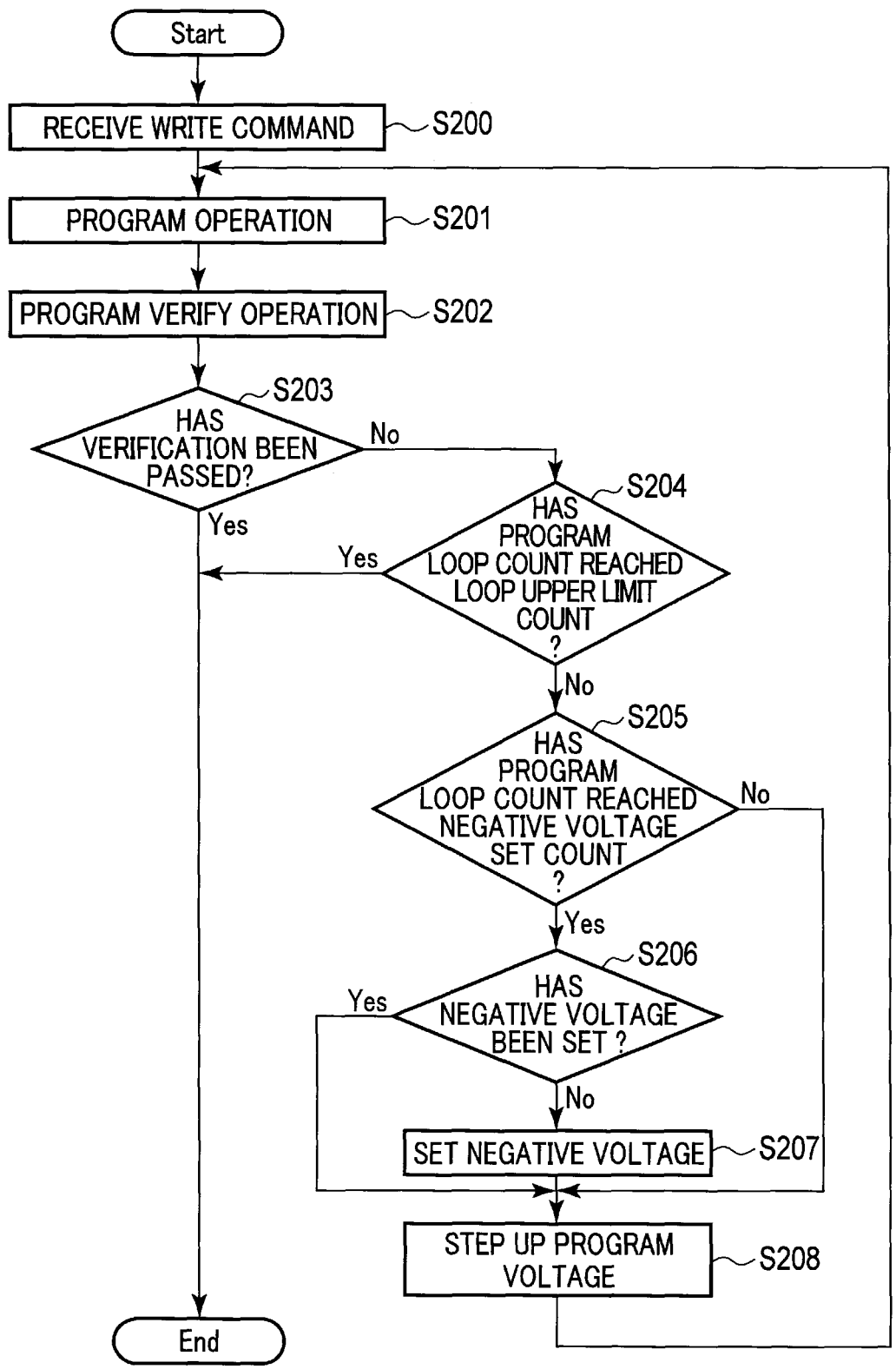
FIG. 67 is a flowchart showing a flow of the write operation in a first example in the semiconductor memory device according to the sixth embodiment.
Figure 68:
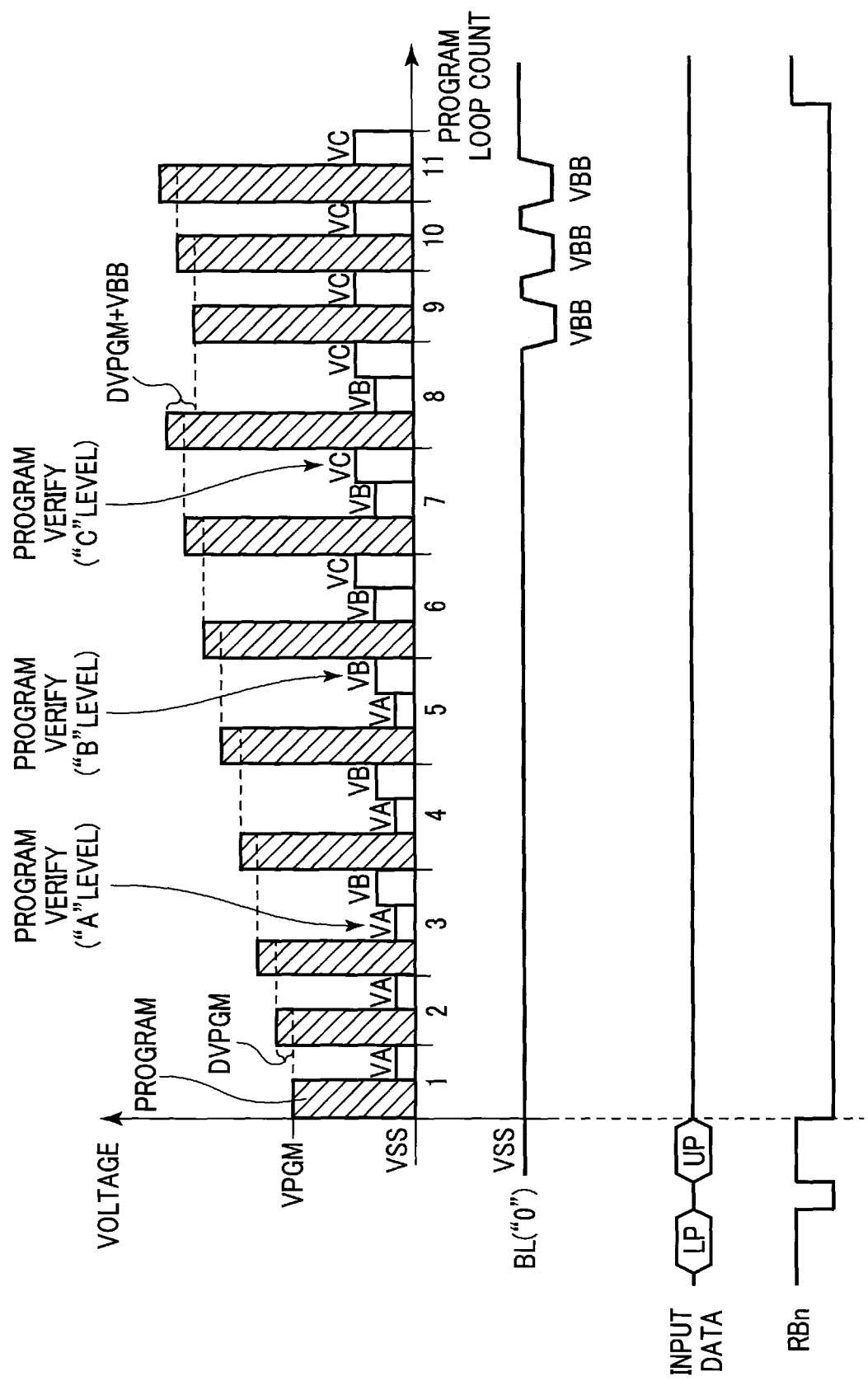
FIG. 68 is a timing chart showing a voltage of a selected word line, a bit line voltage, input data, and a ready/busy signal in the write operation in the first example in the semiconductor memory device according to the sixth embodiment.

First, the overall flow of a write operation in a first example will be described using FIGS. 67 and 68. FIG. 67 shows a flowchart of the write operation in the first example. FIG. 68 is a timing chart showing a voltage of the selected word line WL, a voltage of the bit line BL ("0"), input data, and a ready/busy signal RBn in the write operation in the first example.

In the example of FIG. 68, in order to simplify description, the voltage of the bit line BL ("0") indicates the voltage during the program operation, and the voltage of the bit line BL during the program verify operation is omitted. In the example of FIG. 68, command and address inputs are omitted.

As shown in FIG. 67, the memory 10 first receives a write operation command from the controller 20 (step S200).

Upon receiving the write command, the sequencer 14 selects the normal operation mode and executes the program operation (step S201).

After completion of the program operation, the sequencer 14 executes the program verify operation (step S202).

When the verification has passed (step S203_Yes), the sequencer 14 completes the write operation.

When the verification has not passed (step S203_No), the sequencer 14 checks whether a program loop count has been set in advance and has reached an upper limit count (step S204).

When the program loop count has reached the upper limit count (step S204_Yes), the sequencer 14 completes the write operation and reports to the controller 20 that the write operation was not completed normally.

When the program loop count has not reached the upper limit count (step S204_No), the sequencer 14 checks whether the program loop count has reached a negative voltage set count (step S205).

When the program loop count has reached the negative voltage set count (step S205_Yes), the sequencer 14 selects the negative voltage operation mode. Then, the sequencer 14 confirms whether a voltage parameter corresponding to the negative voltage operation mode has been set (step S206). That is, the sequencer 14 checks whether the negative voltage operation mode has been selected in a previous program loop.

When the voltage parameter corresponding to the negative voltage operation mode has not been set (step S206_No), that is, when the negative voltage operation mode has not been selected in a previous program loop, the sequencer 14 sets the voltage parameter corresponding to the negative voltage operation mode (step S207). That is, the sequencer 14 changes the voltage parameter of each interconnect so as to correspond to the negative voltage operation mode. More specifically, the sequencer 14 adds the negative voltage VBB to set voltage values of the select gate lines SGD and SGS, the word line, the P-well regions 72$a$, 72$b$, and 72$d$, and the bit line BL ("0") in the program operation to lower the set voltage values. The sequencer 14 adds the voltage (−VB1) to the set voltage values of the bit line BL ("1") and the signals BLC and BLX to lower the set voltage values.

When the program loop count has not reached the negative voltage set count (step S205_No), when the voltage parameter corresponding to the negative voltage operation mode has been set (step S206_Yes), or after setting of the voltage parameter corresponding to the negative voltage operation mode is completed in step S207, the sequencer 14 steps up a program voltage (step S208). More specifically, the sequencer 14 adds a step-up voltage DVPGM to a set voltage value of the program voltage to step up the set voltage value. The voltage DVPGM is higher than the voltage VSS.

The sequencer 14 steps up the program voltage, then returns to step S201, and executes the program operation.

Next, the voltage of the selected word line WL, the voltage of the bit line BL ("0"), input data, and the ready/busy signal RBn during the write operation will be described.

As shown in FIG. 68, upon receiving a command "80h", an address of the lower page, data of the lower page (reference symbol "LP"), and a command "1Ah" from the controller 20, the sequencer 14 sets the ready/busy signal to the "L" level and transfers the input data "LP" to the sense amplifier 18. When the transfer of the data "LP" to the sense amplifier 18 is completed, the sequencer 14 sets the ready/busy signal RBn to the "H" level.

Next, upon receiving the command "80h", an address of the upper page, data of the upper page (reference symbol "UP"), and a command "10h" from the controller 20, the sequencer 14 sets the ready/busy signal RBn to the "L" level, transfers the input data "UP" to the sense amplifier 18, and then executes the write operation.

In a first program loop, in the program operation, the row decoder 16 applies the voltage VPGM as the program voltage to the selected word line WL, and the sense amplifier 18 applies the voltage VSS to the bit line BL ("0"). For example, in the program verify operation, the row decoder 16 applies the voltage VA corresponding to the "A" level to the selected word line WL. For example, in the first program loop, the sequencer 14 fails verification of the "A" level.

In a second program loop, in the program operation, the row decoder 16 applies a voltage (VPGM+DVPGM) obtained by stepping up the voltage VPGM by the amount of the voltage DVPGM to the selected word line WL, and the sense amplifier 18 applies the voltage VSS to the bit line BL ("0"). For example, in the program verify operation, the row decoder 16 applies the voltage VA corresponding to the "A" level to the selected word line WL. For example, in the second program loop, the sequencer 14 fails verification of the "A" level.

In a third program loop, in the program operation, the row decoder 16 applies a voltage (VPGM+2DVPGM) to the selected word line WL, and the sense amplifier 18 applies the voltage VSS to the bit line BL ("0"). For example, in the program verify operation, the row decoder 16 applies the voltage VA and the voltage VB corresponding to the "B" level to the selected word line WL. For example, in the third program loop, the sequencer 14 fails verification of the "A" level and the "B" level.

In a fourth program loop, in the program operation, the row decoder 16 applies a voltage (VPGM+3DVPGM) to the selected word line WL, and the sense amplifier 18 applies the voltage VSS to the bit line BL ("0"). For example, in the program verify operation, the row decoder 16 applies the voltages VA and VB to the selected word line WL. For example, in the fourth program loop, the sequencer 14 fails verification of the "A" level and the "B" level.

In a fifth program loop, in the program operation, the row decoder 16 applies a voltage (VPGM+4DVPGM) to the selected word line WL, and the sense amplifier 18 applies the voltage VSS to the bit line BL ("0"). For example, in the program verify operation, the row decoder 16 applies the voltages VA and VB to the selected word line WL. For example, in the fifth program loop, the sequencer 14 passes verification of the "A" level and fails verification of the "B" level.

In a sixth program loop, in the program operation, the row decoder 16 applies a voltage (VPGM+5DVPGM) to the selected word line WL, and the sense amplifier 18 applies the voltage VSS to the bit line BL ("0"). For example, in the program verify operation, the row decoder 16 applies the voltage VB and the voltage VC corresponding to the "C" level to the selected word line WL. For example, in the sixth program loop, the sequencer 14 fails verification of the "B" level and the "C" level.

In a seventh program loop, in the program operation, the row decoder 16 applies a voltage (VPGM+6DVPGM) to the selected word line WL, and the sense amplifier 18 applies the voltage VSS to the bit line BL ("0"). For example, in the program verify operation, the row decoder 16 applies the voltages VB and VC to the selected word line WL. For example, in the seventh program loop, the sequencer 14 fails verification of the "B" level and the "C" level.

In an eighth program loop, in the program operation, the row decoder 16 applies a voltage (VPGM+7DVPGM) to the selected word line WL, and the sense amplifier 18 applies the voltage VSS to the bit line BL ("0"). For example, in the program verify operation, the row decoder 16 applies the voltages VB and VC to the selected word line WL. For example, in the eighth program loop, the sequencer 14 passes verification of the "B" level and fails verification of the "C" level.

In a ninth program loop, since the program loop count has reached the negative voltage set count, the sequencer 14 selects the negative voltage operation mode and sets the voltage parameter corresponding to the negative voltage operation mode. Thus, in the program operation, the row decoder 16 applies a voltage (VPGM+8DVPGM+VBB) to the selected word line WL, and the sense amplifier 18 applies the negative voltage VBB to the bit line BL ("0"). In the example of FIG. 68, when comparing the voltage (VPGM+7DVPGM) in the eighth program loop and the voltage (VPGM+8DVPGM+VBB) in the ninth program loop, a relationship of (VPGM+7DVPGM)>(VPGM+8DVPGM+VBB) is satisfied. For example, in the program verify operation, the row decoder 16 applies the voltage VC to the selected word line WL. For example, in the ninth program loop, the sequencer 14 fails verification of the "C" level.

In a tenth program loop, in the program operation, the row decoder 16 applies a voltage (VPGM+9DVPGM+VBB) obtained by being stepped up by the amount of the voltage DVPGM to the selected word line WL, and the sense amplifier 18 applies the negative voltage VBB to the bit line BL ("0"). For example, in the program verify operation, the row decoder 16 applies the voltage VC to the selected word line WL. For example, in the tenth program loop, the sequencer 14 fails verification of the "C" level.

In an eleventh program loop, in the program operation, the row decoder 16 applies a voltage (VPGM+10DVPGM+VBB) obtained by being stepped up by the amount of the voltage DVPGM to the selected word line WL, and the sense amplifier 18 applies the negative voltage VBB to the bit line BL ("0"). For example, in the program verify operation, the row decoder 16 applies the voltage VC to the selected word line WL. For example, in the eleventh program loop, the sequencer 14 passes verification of the "C" level. Upon completion of the write operation, the sequencer 14 sets the ready/busy signal RBn to the "H" level.

6.6.2.2 Second Example

Next, the overall flow of a write operation in a second example will be described using FIGS. 69 and 70. FIG. 69 shows a flowchart of the write operation in the second example. FIG. 70 is a timing chart showing a voltage of the selected word line WL, the voltage of the bit line BL ("0"), input data, and the ready/busy signal RBn in the write operation in the second example. Hereinafter, differences from the first example will be mainly described.

In the example of FIG. 70, as in the example of FIG. 68, in order to simplify description, the voltage of the bit line BL ("0") indicates the voltage during the program operation, and the voltage of the bit line BL during the program verify operation is omitted. In the example of FIG. 70, command and address inputs are omitted.

As shown in FIG. 69, steps S200 to S204 are the same as those of FIG. 67 of the first example.

When the program loop count has not reached the negative voltage set count (step S205_No), that is, in the normal operation mode, the sequencer 14 steps up the program voltage (step S208). The sequencer 14 steps up the program voltage and then returns to step S201.

When the program loop count has reached the negative voltage set count (step S205_Yes), the sequencer 14 selects the negative voltage operation mode. Then, the sequencer 14 steps down the voltage parameter of the bit line BL ("0") to the negative voltage side instead of adding the voltage DVPGM to step up the program voltage (step S210). More specifically, a voltage (−DVPGM) is added to set voltage values of the select gate lines SGD and SGS, the unselected word line WL, the P-well regions 72a, 72b, and 72d, the bit lines BL ("0") and BL ("1"), and the signals BLC and BLX in the program operation to lower the set voltage values. The sequencer 14 steps down the voltage parameter to the negative voltage side and then returns to step S201.

Next, the voltage of the selected word line WL, the voltage of the bit line BL ("0"), input data, and the ready/busy signal RBn during the write operation will be described.

As shown in FIG. 70, the operation up to the eighth program loop is the same as that in FIG. 68 of the first example.

In the ninth program loop, since the program loop count has reached the negative voltage set count, the sequencer 14 selects the negative voltage operation mode and shifts the voltage parameter of the bit line BL ("0") to the negative voltage side by the amount of the voltage DVPGM. Thus, in the program operation, the row decoder 16 applies the voltage (VPGM+7DVPGM) that is the same voltage as in the eighth program loop to the selected word line WL, and the sense amplifier 18 applies a voltage (VSS−DVPGM) to the bit line BL ("0"). For example, in the program verify operation, the row decoder 16 applies the voltage VC to the selected word line WL. For example, in the ninth program loop, the sequencer 14 fails verification of the "C" level.

In the tenth program loop, in the program operation, the row decoder 16 applies the voltage (VPGM+7DVPGM) to the selected word line WL, and the sense amplifier 18 applies, to the bit line BL ("0"), a voltage (VSS−2DVPGM) obtained by shifting the set voltage value from the ninth program loop to the negative voltage side by the amount of the voltage DVPGM. For example, in the program verify operation, the row decoder 16 applies the voltage VC to the selected word line WL. For example, in the tenth program loop, the sequencer 14 fails verification of the "C" level.

In the eleventh program loop, in the program operation, the row decoder 16 applies the voltage (VPGM+7DVPGM) to the selected word line WL, and the sense amplifier 18 applies, to the bit line BL ("0"), a voltage (VSS−3DVPGM) obtained by shifting the set voltage value from the tenth program loop to the negative voltage side by the amount of the voltage DVPGM. For example, in the program verify operation, the row decoder 16 applies the voltage VC to the selected word line WL. For example, in the eleventh program loop, the sequencer 14 passes verification of the "C" level. Upon completion of the write operation, the sequencer 14 sets the ready/busy signal RBn to the "H" level.

6.7 Effects According to the Present Embodiment

With the configuration according to the present embodiment, it is possible to reduce the voltage applied to each interconnect in the write operation, the read operation, and the erase operation. Thus, power consumption in the semiconductor memory device can be reduced.

For example, as a comparison example, an erase operation may be performed with a condition that a voltage of the channel of the memory cell transistor MT is increased to around 18 V to 24 V while a voltage of around 0 V to 0.5 V is applied to the word line WL. On the other hand, with the configuration according to the present embodiment, for example, a negative voltage of around −1 V to −0.5 V is applied to the word line WL. Therefore, it is sufficient for executing the erase operation to increase a voltage of the channel of the memory cell transistor MT up to around 17 V to 23 V. Specifically, the above-mentioned voltage VERA to be applied to the source line SL during the erase operation can be decreased. For example, a power consumption in the driver circuit 15 to apply the VERA of 17 V to 23 V may be lower than a power consumption in the driver circuit 15 to apply the VERA of 18 V to 24 V. Even if a power consumption in the driver circuit 15 is increased to apply the voltage of −1 V to −0.5 V to the word line WL instead of the voltage of 0 V to 0.5 V, it is expected that the power consumption reduction amount by lowering the voltage VERA is higher than the power consumption increase amount by lowering the word line WL voltage. That is, it is expected that the total power consumption in the driver circuit 15 can be reduced.

Further, with the configuration according to the present embodiment, by providing a part of the threshold distribution of the memory cell transistor MT on the negative voltage side, the width of each threshold level can be made larger than that in a case where the threshold distribution is provided only on the positive voltage side. As a result, it is possible to suppress erroneous reading due to influences such as shifting of the threshold voltage or widening of the threshold distribution. Thus, the reliability of the semiconductor memory device can be improved.

Furthermore, with the configuration according to the present embodiment, since the width of each threshold level can be made large, the width of the step-up voltage in the program operation can be made relatively large. Thus, the program loop count can be reduced. Thus, an increase in a write operation time can be suppressed. Therefore, the processing capability of the semiconductor memory device can be improved.

In addition, with the configuration according to the present embodiment, in the first half of the write operation, that is, when the program loop count is small, the normal operation mode is selected. In the latter half of the write operation, that is, when the program loop count is equal to or higher than a preset value, the negative voltage operation mode can be selected. More specifically, in the first half of the write operation, the ratio of the bit line BL ("0") in the entire bit line BL is larger than the ratio of the bit line ("1"). In this case, the normal operation mode is selected, and the voltage VSS is applied to the bit line BL ("0"). On the other hand, in the latter half of the write operation, most of cell writing is completed, and the ratio of the bit line BL ("0") decreases. In this case, the negative voltage operation mode is selected, and the negative voltage VBB is applied to the bit line BL ("0"). That is, the negative voltage mode is selected in a state in which the number of the bit lines BL to which the negative voltage VBB is to be applied is relatively small, so that an increase in power consumption can be suppressed.

7. Variations, Etc

The memory system according to the above embodiments includes a semiconductor memory device (10) having a memory cell array (11) including a memory cell (MT) capable of holding at least 4-bit data (Top data/Upper data/Middle data/Lower data) and a controller (20) configured to control a first write operation and a second write operation based on the 4-bit data in the semiconductor memory device. The controller includes a conversion circuit (27) configured to convert the 4-bit data into 2-bit data (X1 data/X2 data). The semiconductor memory device includes a recovery controller (19) configured to recover the 4-bit data based on the converted 2-bit data and data written in the memory cell by the first write operation. The first write operation is executed based on the 4-bit data received from the controller, and the second write operation is executed based on the 4-bit data recovered by the recovery controller.

By applying the above embodiments, it is possible to provide a semiconductor memory device capable of suppressing an increase in the chip area.

Note that the embodiments are not limited to the forms explained above, and various modifications can be made.

For example, in the present embodiments, a memory cell capable of holding data by a 16-value threshold distribution has been described. However, the present invention is not limited to 16 values but can be applied to any number of threshold distributions. In the present embodiments, the 2-bit data (X1 page data and X2 page data) generated from the 4-bit data is stored in binary in the SLC inside the memory 10. However, the 2-bit data can also be stored with any number of threshold distributions such as four values.

In addition, in the fourth embodiment, the case where the data conversion/recovery controller 19B is provided in the memory 10 has been described. However, the data conversion/recovery controller 19B may be provided in the controller 20. That is, the conversion and recovery of data may be executed in the controller 20.

In addition, in the fifth embodiment, the configuration using the negative voltage has been described. However, the negative voltage operation mode may be performed in any one of the write operation, the read operation, and the erase operation, or a combination of any two operations.

Further, the above embodiments can be combined as much as possible.

Furthermore, in the above embodiments, the semiconductor memory device is not limited to the three-dimensional stacked NAND-type flash memory. The semiconductor memory device may be a planar NAND-type flash memory, and the present invention can be applied to a nonvolatile memory having a memory cell capable of holding data of 3 bits or more.

Moreover, the "coupling" in the above embodiments includes the state of indirect coupling between objects with any other object, for example, a transistor or a resistor, interposed therebetween.

In addition, in the above embodiments, the 4-bit data before being converted by the conversion circuit 27 and the 4-bit data recovered by the recovery controller 19 may include errors within a range that can be corrected by the ECC circuit 25, for example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory system comprising:
a semiconductor memory device having a first memory region including a first memory cell capable of holding at least 4-bit data and a second memory region including a plurality of second memory cells capable of holding at least 1-bit data;
a controller configured to control a first write operation and a second write operation based on the 4-bit data in the semiconductor memory device; and
at least one wiring connecting the semiconductor memory device and the controller,
wherein:
the controller includes a conversion circuit which converts the 4-bit data into n-bit data, with n being an integer,
the semiconductor memory device includes a recovery controller configured to recover the 4-bit data based on the converted n-bit data and data written in the first memory cell by the first write operation,
when the controller detects power shutdown, the conversion circuit converts the 4-bit data used for the first write operation into the n-bit data, and
the controller instructs the semiconductor memory device to write each of the n-bit data in different second memory cells of the plurality of second memory cells.

2. A semiconductor memory device comprising:
a memory cell array including a first memory cell capable of holding at least n-bit data, with n being an integer that is at least 4;
a conversion circuit configured to recover the n-bit data based on m-bit data generated by converting the n-bit data and data written in the first memory cell, with m being an integer that is smaller than n; and
at least one pad connectable with an outside of the semiconductor memory device,
wherein:

an operation of writing the n-bit data in the first memory cell includes a first write operation and a second write operation, the first write operation is executed based on the n-bit data that is received from the outside, and the second write operation is executed based on the n-bit data that is recovered by the conversion circuit.

3. The memory system according to claim 1, wherein when the controller detects power shutdown before the 4-bit data is written into the first memory cell, the controller instructs the semiconductor memory device to perform write of 1-bit data in each of four second memory cells of the plurality of second memory cells using the 4-bit data.

4. The memory system according to claim 1, wherein when the controller detects power shutdown after 2-bit data of the 4-bit data is written into the first memory cell, the controller instructs the semiconductor memory device to perform write of 1-bit data in each of two second memory cells of the plurality of second memory cells using remaining 2-bit data of the 4-bit data.

5. The memory system according to claim 1, wherein:

the semiconductor memory device further includes a memory cell array including a plurality of memory cells including the first memory cell and the second memory cells, and the semiconductor memory device further includes at least one of (i) a plurality of word lines respectively connected to gates of the memory cells, or (ii) a plurality of select gate lines respectively connected to one of ends of the memory cells.

6. The memory system according to claim 5, wherein each of the plurality of memory cells includes:

a semiconductor layer;

a first insulating layer contacting the semiconductor layer;

a charge trap layer contacting the first insulating layer; and a second insulating layer contacting the charge trap layer.

7. The memory system according to claim 6, wherein after power recovery, the controller instructs the semiconductor memory device to perform a read operation of the n-bit data written in the second memory region, a recovery operation of the 4-bit data, and the second write operation.

8. The memory system according to claim 6, wherein:

a threshold voltage of the first memory cell is included in one of a plurality of threshold distributions corresponding to the 4-bit data, and assignment of the n-bit data to the plurality of threshold distributions differs by 1 bit between the threshold distributions that are adjacent to each other.

9. The memory system according to claim 1, wherein when the controller does not detect power shutdown after the first write operation, the controller instructs the semiconductor memory device to perform the second write operation to write the 4-bit data in the first memory cell.

10. The semiconductor memory device according to claim 2, wherein:

the semiconductor memory device further includes a memory cell array including a plurality of memory cells including the first memory cell and the second memory cells, and the semiconductor memory device further includes at least one of (i) a plurality of word lines respectively connected to gates of the memory cells, or (ii) a plurality of select gate lines respectively connected to one of ends of the memory cells.

11. The semiconductor memory device according to claim 10, wherein each of the plurality of memory cells includes:

a semiconductor layer;

a first insulating layer contacting the semiconductor layer;

a charge trap layer contacting the first insulating layer; and a second insulating layer contacting the charge trap layer.

12. The semiconductor memory device according to claim 11, wherein:

after the first write operation, the conversion circuit converts the 4-bit data into the n-bit data, and the converted n-bit data is outputted to the outside, and before the second write operation, the conversion circuit recovers the 4-bit data based on the n-bit data that is received from the outside and the data read from the first memory cell.

13. The semiconductor memory device according to claim 2, wherein:

the memory cell array further includes a plurality of second memory cells capable of holding at least 1-bit data, each item of the n-bit data is written in a different second memory cell of the plurality of second memory cells, and before the second write operation, the conversion circuit recovers the n-bit data based on the n-bit data read from the second memory cells and the data read from the first memory cell.

14. The semiconductor memory device according to claim 2, wherein the conversion circuit recovers the n-bit data based on the generated m-bit data and (n-m)-bit data received from the outside.

15. The semiconductor memory device according to claim 14, wherein n is 4, and m is 2.

16. A method for controlling a semiconductor memory device, the semiconductor memory device including (i) a memory cell array including a first memory cell capable of holding at least n-bit data, with n being an integer that is at least 4, (ii) a conversion circuit configured to recover the n-bit data based on m-bit data generated by converting the n-bit data and data written in the first memory cell, with m being an integer that is smaller than n, and (iii) at least one pad connectable with an outside of the semiconductor memory device, and the method comprising:

receiving the n-bit data from the outside;

performing a first write operation to the first memory cell based on the n-bit data that is received from the outside;

recovering the n-bit data using the conversion circuit; and performing a second write operation to the first memory cell based on the n-bit data that is recovered by the conversion circuit, thereby writing the n-bit data in the first memory cell.

* * * * *